(12) United States Patent
Tomita

(10) Patent No.: US 6,369,627 B1
(45) Date of Patent: Apr. 9, 2002

(54) DELAY CIRCUIT AND SEMICONDUCTOR INTEGRATED CIRCUIT HAVING SAME

(75) Inventor: Hiroyoshi Tomita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/604,247

(22) Filed: Jun. 27, 2000

(30) Foreign Application Priority Data

Oct. 12, 1999 (JP) .......................................... 11-290190

(51) Int. Cl.[7] ................................................. H03L 7/06
(52) U.S. Cl. ........................................ 327/158; 327/276
(58) Field of Search .................................. 327/149, 150, 327/158, 161, 163, 276, 270, 277, 279, 280, 284, 286, 392, 393, 292

(56) References Cited

U.S. PATENT DOCUMENTS

| 5,418,498 A | 5/1995 | DeVito et al. ................. 331/57 |
| 5,430,394 A | * 7/1995 | McMinn et al. ............. 327/292 |
| 5,463,337 A | * 10/1995 | Leonowich .................. 327/158 |
| 5,748,125 A | 5/1998 | Cederbaum et al. ......... 341/136 |
| 5,841,325 A | 11/1998 | Knotts et al. ................. 331/57 |

FOREIGN PATENT DOCUMENTS

JP 10-112182 4/1998

OTHER PUBLICATIONS

Kursheed, Enam, S. et al: "NMOS IC's for Clock and Data Regeneration in Gigabit–Per–Second Optical–Fiber Receivers" IEEE Journal of Solid–State Circuits, US, IEE Inc. New York, vol. 27, No. 12, Dec. 1, 1992 (1992–12–01), pp. 1763–1774, XP000329026, ISSN: 0018–9200 *p. 1765—p. 1767*.

* cited by examiner

Primary Examiner—Kenneth B. Wells
Assistant Examiner—Paul Dinh
(74) Attorney, Agent, or Firm—Arent Fox Kintner Plotkin & Kahn PLLC

(57) ABSTRACT

A delay circuit including a plurality of interpolators connected in cascade. Each of the interpolators receives a reference clock signal and a clock signal output from the preceding interpolator. One of the interpolators generates a clock signal whose transition edge is between the transition edge of the reference clock signal and the transition edge of the clock signal. The subsequent interpolators operate as delay stages, thereby generating a delayed clock signal delaying from the reference clock signal by a predetermined time. It is possible to make smaller the minimum unit of a delay adjustment to the delayed clock signal by using the interpolators. A semiconductor integrated circuit including the delay circuit supplies ratio information to the phase adjustment circuits based on the result of comparing the phase of the reference clock signal with the phase of the delayed clock signal from a phase comparator and makes the phase of the delayed clock signal coincide with the phase of the reference clock signal. As a result, the phase adjustment can be made with reliability even when a reference clock signal of higher frequency is supplied.

37 Claims, 74 Drawing Sheets

| RSO | H | | | | L | | |
|---|---|---|---|---|---|---|---|
| MAX —— MIN | L L | H L | L H | L L | H L | L H | |
| COMP=L (advance DICLK) ← | (A) activate FEN | (B) activate FEN | (D) activate REN | (F) activate FEN | (G) activate REN | (I) activate FEN | |
| COMP=H (delay DICLK) → | activate FEN | (C) activate REN | (E) activate FEN | activate FEN | (H) activate FEN | (J) activate REN | |

(1) when RLON=L : REN is always activated.
(2) when RLON=H :

Fig. 19

(1) when RLON=L : activate FW at COMP=L
                  activate BW at COMP=H
(2) when RLON=H :

| RSO | H | | | | L | | | |
|---|---|---|---|---|---|---|---|---|
| MAX<br>MIN | L<br>L | H<br>L | L<br>H | L<br>L | H<br>L | L<br>H | | |
| COMP=L<br>(advance DICLK) ← | (A)<br>inactivate<br>FW、BW | (B)<br>inactivate<br>FW、BW | (D)<br>activate<br>FW | (F)<br>inactivate<br>FW、BW | (G)<br>activate<br>FW | (I)<br>inactivate<br>FW、BW | | |
| COMP=H<br>(delay DICLK) → | | (C)<br>activate<br>BW | (E)<br>inactivate<br>FW、BW | | (H)<br>inactivate<br>FW、BW | (J)<br>activate<br>BW | | |

Fig. 22

| RSO | H | L |
|---|---|---|
| COMP=L (advance DICLK) | (A) activate DOWN | (C) activate UP |
| COMP=H (delay DICLK) | (B) activate UP | (D) activate DOWN |

(1) FEN=L : UP & DOWN is always inactivated.
(2) FEN=H :

Fig. 28

(1) RLON=L : FW activated at CP6=H, CP8=H
            BW activated at CP5=H, CP7=H
(2) RLON=H :

| RSO | | H | | | L | | |
|---|---|---|---|---|---|---|---|
| MAX<br>MIN | L<br>L | H<br>L | L<br>H | L<br>L | H<br>L | L<br>H | |
| FCOMP=L<br>(advance DICLK) ↙ | (A)<br>inactivate<br>FW、BW | (B)<br>inactivate<br>FW、BW | (D)<br>activate<br>FW | (F)<br>inactivate<br>FW、BW | (G)<br>activate<br>FW | (I)<br>inactivate<br>FW、BW | |
| FCOMP=H<br>(delay DICLK) ↗ | | (C)<br>activate<br>BW | (E)<br>inactivate<br>FW、BW | | (H)<br>inactivate<br>FW、BW | (J)<br>activate<br>BW | |

Fig. 49

| | 196-6 | 196-5 | | 196-4 | | 196-3 | | 196-2 | | 196-1 | |
|---|---|---|---|---|---|---|---|---|---|---|---|
| | β6 | α5 | β5 | α4 | β4 | α3 | β3 | α2 | β2 | α1 | β1 |
| RQ2=L,RQ1=L SELA=H (45-90°) | — | — | — | — | — | — | — | VMIN | VMAX | V1 | V2 |
| RQ2=L,RQ1=H SELA=L (90-180°) | — | — | — | — | — | VMIN | VMAX | V2 | V1 | VMAX | VMIN |
| RQ2=H,RQ1=L SELA=L (180-270°) | — | — | — | VMIN | VMAX | V2 | V1 | VMAX | VMIN | VMAX | VMIN |
| RQ2=H,RQ1=H SELA=L (270-0°) | — | VMIN | VMAX | V2 | V1 | VMAX | VMIN | VMAX | VMIN | VMAX | VMIN |
| RQ2=L,RQ1=L SELA=L (0-45°) | VMAX | V1 | V2 | VMAX | VMIN | VMAX | VMIN | VMAX | VMIN | VMAX | VMIN |

— : Don't care

Fig. 67

DELAY CIRCUIT AND SEMICONDUCTOR INTEGRATED CIRCUIT HAVING SAME

BACKGROUND OF THE INVENTION

1. Field of the Invention

The present invention relates to a delay circuit and a semiconductor integrated circuit operating in synchronization with a clock. More particularly, it relates to a semiconductor integrated circuit implementing a delay locked loop (DLL) circuit for synchronizing an internal clock signal for use in the interior circuit with an external clock signal supplied from the exterior.

2. Description of the Related Art

Synchronous DRAMs (SDRAMs), double data rate synchronous DRAMs (DDR-SDRAMs), and the like are known as the semiconductor integrated circuits operating in synchronization with a clock. In the semiconductor integrated circuits of this type, the interior circuit is operated in synchronization with the clock signal supplied from the exterior, for data input/output. In general, the semiconductor integrated circuit has a plurality of data output terminals. The output data output from these output terminals has skews in accordance with the wiring length of the signal lines depending on the circuit layout on the chip. The skews relatively increase with higher frequency the clock having. Recently, the skew mentioned above has become a big problem which can not be ignored since SDRAMs and DDR-SDRAMs having an operating frequency over 100 MHz have been developed.

In order to reduce such skews, there has been developed a semiconductor integrated circuit implementing a DLL circuit. The DLL circuit adjusts the phase of an internal clock signal to be used in the interior circuit to a predetermined phase of the reference clock signal supplied from the exterior. Its basic configuration has been disclosed, for example, in Japanese Patent Laid-Open Publication No. Hei 10-112182.

Moreover, there has been proposed a DLL circuit comprising a rough delay circuit having rougher units for delay time adjustment and a fine delay circuit having finer units for delay time adjustment. The DLL circuit of this type can improve the precision of the phase adjustment and reduce jitter in the internal clock signal as well.

FIG. 1 shows an example of the semiconductor integrated circuit implementing the DLL circuit proposed by the present applicant. Incidentally, the circuit shown in FIG. 1 has not publicly known.

This semiconductor integrated circuit comprises: an input buffer 1 for outputting a clock signal CLK accepted from the exterior as an internal clock signal ICLK; a delayed clock generator 2 for generating an internal clock signal ICLK2 delayed by a predetermined time from the internal clock signal ICLK; an output buffer 3 for outputting a data signal DATA read out from a memory cell or the like as an output signal DOUT in synchronization with the internal clock signal ICLK2; a phase control unit 4 for adjusting the phase of the internal clock signal ICLK2 to the phase of the clock signal CLK; and a start signal generator 5 for generating a start signal START for synchronizing the operations of the delayed clock generator 2 and the phase control unit 4.

The delayed clock generator 2 comprises a rough variable delay circuit 6 and a fine variable delay circuit 7.

The rough variable delay circuit 6, constituted by cascading a plurality of delay stages (not shown) having longer delay time, is a circuit for making a rough adjustment to delay time in accordance with the number of delay stages connected. Under the control of a rough delay control circuit 13, the rough variable delay circuit 5 upshifts or downshifts to increase or decrease the number of delay stages connected.

The fine variable delay circuit 7, constituted by cascading a plurality of delay stages (not shown) having shorter delay time, is a circuit for making a fine adjustment to delay time in accordance with the number of these delay stages connected. Under the control of a fine delay control circuit 15, the fine variable delay circuit 7 increases (upshifts) or decreases (downshifts) the number of delay stages connected. The maximum delay time of the fine variable delay circuit 7 is somewhat longer than the delay time of one delay stage in the rough variable delay circuit 6.

The phase control unit 4 comprises frequency dividers 8 and 9, a dummy output buffer 10 equivalent to the output buffer 3, a dummy input buffer 11 equivalent to the input buffer 1, a rough phase comparator 12, the rough delay control circuit 13, a fine phase comparator 14, the fine delay control circuit 15, a stage number setting circuit 16, a stage number detector 17, and a DLL control circuit 18.

The frequency divider 8 divides the frequency of the internal clock signal ICLK to generate an internal clock signal /CLK1, and outputs the same to the rough phase comparator 12 and the fine phase comparator 14. Here, "/" employed in the clock signal /CLK1 or the like indicates a logic inversion with respect to the clock signal CLK.

The frequency divider 9 divides the frequency of the internal clock signal ICLK2 to generate an internal clock signal ICLK3, and outputs the same to the dummy output buffer 10. The frequency dividers 8 and 9 have a dividing rate of 1/4, for example. The frequency division of the clock signals ICLK and ICLK2 facilitates the phase comparison at higher frequency as well as reduces the power consumption.

The signal output from the dummy output buffer 10 is supplied to the dummy input buffer 11, and output to the rough phase comparator 12 and the fine phase comparator 14 as an internal clock signal DICLK.

The stage number setting circuit 16 has a delay circuit equivalent to one delay stage in the rough variable delay circuit 6 and a delay circuit equivalent to one delay stage in the fine variable delay circuit 7. The stage number setting circuit 16 always monitors how many stages of the fine variable delay circuit 7 corresponds to the delay time of one delay stage in the rough delay control circuit 6, and outputs the number of stages to the fine delay control circuit 15 and the stage number detector 17 as a maximum stage number signal J2. The maximum stage number signal J2 varies with the operating voltage and the ambient temperature of the semiconductor integrated circuit.

The stage number detector 17 has the function of receiving a stage number signal J1, which is the number of delay stages used in the fine variable delay circuit 7, and the maximum stage number signal J2. It respectively outputs an overflow signal OF and an underflow signal UF when the stage number signal J1 becomes the maximum stage number signal J2 and the stage number signal J1 reaches the minimum value.

The DLL control circuit 18 receives a phase coincidence signal JSTR from the rough phase comparator 12, receives the overflow signal OF and the underflow signal UF from the stage number detector 17, and outputs select signals S1 and S2, a shift-up signal UP, and a shift-down signal DOWN. The DLL control circuit 18 activates the select signal S1 and inactivates the select signal S2 when the phase coincidence signal JSTR is inactive, and inactivates the select signal S1 and activates the select signal S2 when the phase coincidence signal JSTR is active. The DLL control circuit 18 also outputs the shift-up signal UP to the rough phase comparator 12 on receiving the overflow signal OF, and outputs the shift-down signal DOWN to the rough phase comparator 12 on receiving the underflow signal UF.

The rough phase comparator 12 receives the activated select signal S1, compares the phases of the internal clock signal /CLK1 and the internal clock signal DICLK, and outputs the comparison result to the rough delay control circuit 13. The rough phase comparator 12 activates the phase coincidence signal JSTR when the internal clock signal DICLK and the internal clock signal /CLK1 coincide with each other in phase, upshifts the rough variable delay circuit 6 on receiving the shift-up signal UP, downshifts the rough variable delay circuit 6 on receiving the shift-down signal DOWN, and outputs a reset signal MIN and a set signal MAX respectively when upshifting and downshifting the rough variable delay circuit 6.

The rough delay control circuit 13 upshifts/downshifts the rough variable delay circuit 6 based on the comparison result from the rough phase comparator 12, for delay time adjustment. That is, the rough delay control circuit 13 increments by one the number of delay stages connected when the internal clock signal DICLK leads the internal clock signal /CLK1 in phase, and decrements by one the number of delay states connected when the internal clock signal DICLK delays from the internal clock signal /CLK1 in phase.

The fine phase comparator 14 is a circuit for receiving the activated select signal S2, comparing the phases of the internal clock signal DICLK and the internal clock signal /CLK1, and outputting the comparison result to the fine delay control circuit 15.

The fine delay control circuit 15 upshifts/downshifts the fine variable delay circuit 7 based on the comparison result from the fine phase comparator 14, for delay time adjustment. That is, the fine delay control circuit 15 increments by one the number of delay stages connected when the internal clock signal DICLK leads the internal clock signal /CLK1 in phase, and decrements by one the number of delay stages connected when the internal clock signal DICLK delays from the internal clock signal /CLK1 in phase. The fine delay control circuit 15 also minimizes the number of delay staged connected in the fine variable delay circuit 7 on receiving the reset signal MIN, makes the number of delay stages connected in the fine variable delay circuit 7 equal to the maximum stage number signal J2 on receiving the set signal MAX, outputs the current number of delay stages connected in the fine variable delay circuit 7 as the stage number signal J1.

The start signal generator 5 receives the internal clock signal ICLK, and outputs a start signal STT. This circuit activates the start signal STT in synchronization with the fall of the internal clock signal ICLK upon the release of a reset signal /RESET. The delay clock generator 2 and the frequency dividers 8, 9 start to operate on receiving the activation of the start signal STT.

FIG. 2 is a flowchart showing the control procedure of the phase adjustment to be performed by the above-described respective circuits. The phase adjustment control is started by the release of the reset signal /RESET.

For a start, at step S1 is executed an initial setup. The stage number setting circuit 16 shown in FIG. 1 judges how many stages of the fine variable delay circuit 7 a delay stage of the rough variable delay circuit 6 corresponds to in delay time, and outputs the result as the maximum stage number signal J2. Besides, the phase control unit 4 is initialized so that the numbers of delay stages connected in the rough variable delay circuit 6 and the fine variable delay circuit 7 are set to initial values. The DLL control circuit 18 activates the select signal S1, and inactivates the select signal S2.

Next, the initial adjustment of the rough variable delay circuit 6 is performed at steps S2–S5.

At step S2, the phase control unit 4 sets the frequency dividers 8 and 9 at 1/4 in dividing rate. The frequency divider 8 receives the internal clock signal ICLK, and outputs the divided internal clock signal /CLK1. The frequency divider 9 receives the internal clock signal ICLK2, and outputs the divided internal clock signal ICLK3.

At step S3, the rough phase comparator 12 compares the phases of the internal clock signal /CLK1 and the internal clock signal DICLK, and outputs the comparison result to the rough delay control circuit 13. Here, the fine phase comparator 14, receiving the inactivated select signal S2, stops operating.

At step S4, the rough phase comparator 12 activates the phase coincidence signal JSTR when the signals compared in the rough phase comparator 12 coincide with each other in phase. The DLL control circuit 18, receiving the phase coincidence signal JSTR, inactivates the select signal S1 and activates the select signal S2. Then, the procedure shifts to step S6. If the signals compared in the rough phase comparator 12 do not coincide with each other in phase, then the procedures shifts to step S5.

At step S5, the rough delay control circuit 13 upshifts/downshifts the rough variable delay circuit 6 in accordance with the comparison result from the rough phase comparator 12, for delay time adjustment. Then, the procedure returns to step S3.

Next, at steps S6–S15 is performed the phase adjustment using the rough variable delay circuit 6 and the fine variable delay circuit 7.

Initially, at step S6, the fine phase comparator 14 compares the phases of the internal clock signal /CLK1 and the internal clock signal DICLK, and outputs the comparison result to the fine delay control circuit 15. Here, the rough variable delay circuit 6, receiving the inactivation of the select signal S1, stops operating.

At step S7, if the signals compared in the fine phase comparator 14 coincide with each other in phase, the procedure returns to step S6. If the internal clock signal DICLK leads the internal clock signal /CLK1 in phase, the procedure shifts to step S8. If the internal clock signal DICLK delays from the internal clock signal /CLK1 in phase, the procedure shifts to step S12.

At step S8, the stage number detector 17 compares the stage number signal J1 with the maximum stage number signal J2. If the stage number signal J1 is equal to the maximum stage number signal J2, then carry-over processing is judged as necessary, and the procedure shifts to step S10. If the stage number signal J1 is smaller than the maximum stage number signal J2, then the carry-over processing is judged as unnecessary, and the procedure shifts to step S9.

At step S9, the fine delay control circuit 15 upshifts the fine variable delay circuit 7 by one stage to delay the internal clock signal ICLK2 in phase.

At step S10, the stage number detector 17 outputs the overflow signal OF. The DLL control circuit 18 receives the overflow signal OF, and outputs the shift-up signal UP. The rough phase comparator 12 receives the shift-up signal UP, upshifts the rough variable delay circuit 6 by one stage, and outputs the reset signal MIN.

At step S11, the fine delay control circuit 15 receives the reset signal MIN, and set the number of delay stages connected in the fine variable delay circuit 7 to the minimum.

After the execution of step S9 or S11, the procedure returns to step S6.

On the other hand, at step S12, the stage number detector 17 examines the stage number signal J1 for the minimum value. If the stage number signal J1 has the minimum value, then carry-down processing is judged as necessary, and the procedure shifts to step S14. If the stage number signal J1 does not have the minimum value, then the carry-down processing is determined unnecessary, and the procedure shifts to step S13.

At step S13, the fine delay control circuit 15 downshifts the fine variable delay circuit 7 by one stage to advance the internal clock signal ICLK2 in phase.

At step S14, the stage number detector 17 outputs the underflow signal UF. The DLL control circuit 18 receives the underflow signal UF, and outputs the shift-down signal DOWN. The rough phase comparator 12 receives the shift-down signal DOWN, downshifts the rough variable delay circuit 6 by one stage, and outputs the set signal MAX.

At step S15, the fine delay control circuit 15 receives the set signal MAX, and set the number of delay stages connected in the fine variable delay circuit 7 to the maximum.

After the execution of step S13 or S15, the procedure returns to step S6.

Then, the phase adjustment is repeatedly performed with intervals of the delay time of a delay stage in the fine variable delay circuit 7. That is, the phase control unit 4 makes rough phase adjustments by using the rough delay control circuit 13, and then makes fine phase adjustments by using the fine delay control circuit 15. The phase of the internal clock signal DICLK is thus adjusted to the phase of the internal clock signal /CLK1.

FIG. 3 shows the timing for the essential signals in phase adjustments. FIG. 3 shows a state in which a phase adjustment is performed so that the internal clock signal /CLK1 and the internal clock signal DICLK coincide with each other in phase.

The start signal STT is activated in synchronization with the fall of the internal clock signal ICLK after the reset signal /RESET is released off to low level (FIG. 3(a)). The output of the internal clock signal ICLK delays from the rise of the clock signal CLK by the delay time T1 of the input buffer 1 shown in FIG. 1 (FIG. 3(b)). The internal clock signal ICLK is frequency-divided to a quarter by the frequency divider 8, and output as the internal clock signal /CLK1 delayed by the delay time T2 of the frequency divider 8 (FIG. 3(c)). The output of the internal clock signal ICLK2 delays from the rise of the internal clock signal ICLK by the delay time T3 of the delayed clock generator 2 (FIG. 3(d)). The frequency of the internal clock signal ICLK2 is divided to a quarter by the frequency divider 9, and output as the internal clock signal ICLK3 delaying from the delay time T2 of the frequency divider 9 (FIG. 3(e)) The frequency dividers 8 and 9 have the same delay time T2. Therefore, the delay of the internal clock signal ICLK3 to the internal clock signal /CLK1 is identical with the delay time T3 of the delayed clock generator 2 (FIG. 3(f)). The internal clock signal ICLK3 is output as the internal clock signal DICLK delaying by the delay time T4 of the dummy output buffer 10 and the dummy input buffer 11 (FIG. 3(g)). The delay time T4 equals to the sum of the delay times of the input buffer 1 and the output buffer 3.

Accordingly, in a state where the internal clock signal /CLK1 and the internal clock signal DICLK coincide with each other in phase, a half cycle of the internal clock signal /CLK1 (=two cycles of the clock signal CLK) becomes equal to the sum of the delay time T3 from the delayed clock generator 2 and the delay time T4 from the input buffer 1 and the output buffer 3 (FIG. 3(h)). This total time T3+T4 is identical with the time elapsing from the supply of the clock signal CLK to the output of the output data signal DOUT. Consequently, the phase of the output data signal DOUT output from the output buffer 3 coincides with the phase of the clock signal CLK (FIG. 3(i)).

In the cases where the DLL control circuit 18 judges "carry over" and "carry down" at steps S8 and S12 shown in FIG. 2, the phase control unit 4 executes the steps S10, S11 and the steps S14, S15, respectively. Here, if the internal clock signal ICLK varies during the procedures of the steps S10 and S11 for example, then there might occur a large shift in the timing of the internal clock signal ICLK2. On this account, the procedures of the steps S10 and S11, as well as those of the steps S14 and S15, need to be executed continuously during a high-level period or a low-level period of the internal clock signal ICLK. In other words, on the occasions of carry-over and carry-down, the shift operation to the rough variable delay circuit 6 and the set/reset operation to the fine variable delay circuit 7 need to be performed continuously during a high-level period or a low-level period of the internal clock signal ICLK.

The timing margins necessary for such control, however, decrease with increasing frequency of the clock signal CLK. In particular, those semiconductor integrated circuits at the frequency of the clock signal CLK exceeding 100 MHz have increasing difficulties with such control.

Besides, in the semiconductor integrated circuit described above, the stage number setting circuit 16 judges the number of stages of the fine variable delay circuit 7 one stage in the rough variable delay circuit 6 corresponds to in delay time. Comprising the circuit equivalent to the delay stage in the rough variable delay circuit 6, the stage number setting circuit 16 has an error with respect to the actual delay time of one delay stage in the rough variable delay circuit 6. This error can cause jitter in the internal clock signal ICLK2.

Moreover, in the semiconductor integrated circuit described above, the clock signals divided by the frequency dividers 8 and 9 are compared by the rough phase comparator 12 and the fine phase comparator 14. However, when the semiconductor integrated circuit is supplied with a clock signal of lower frequency, the rough variable delay circuit 6 requires a greater number of delay stages, thereby producing a problem of increased circuit scale. If the dividing rates of the frequency dividers 8 and 9 are lowered to reduce the number of delay stages, the rough phase comparator 12 and the fine phase comparator 14 become unstable in operation when a clock signal CLK of higher frequency is supplied thereto. In addition, the frequency of phase comparisons becomes greater, thereby increasing the power consumption.

Meanwhile, a phase adjustment circuit has been proposed which comprises: a delay circuit constituted by cascading four (or eight) delay stages variable in delay time; interpolators for receiving adjacent two clock signals among the clock signals output from the individual delay stages, and generating an internal clock signal; a phase comparator for comparing the phases of the internal clock signal and an external clock signal; a control circuit for controlling the delay circuits and the interpolators based on the comparison results from the phase comparator.

In this phase adjustment circuit, the delay circuit adjusts the respective delay stages in delay time according to the frequency of the external clock signal, and outputs clock signals whose phases are shifted by 90° (or 45°) from one another. The interpolators receive adjacent two clock signals, and generate clock signals having a phase between those of the clock signals. Then, the phase comparator and the control circuit control the delay circuits and the interpolators so that the internal clock signal and the external clock signal coincide with each other in phase.

The phase adjustment circuit of this type, however, has a problem in that it can only make a phase adjustment within a single cycle of the external clock signal. This means a narrower range of phase adjustment particularly in the case where an external clock signal of higher frequency is supplied to the semiconductor integrated circuit. Moreover, because of containing unnecessary elements such as CR time constant circuits so as to allow the delay time adjustments, the delay stages are greater in layout size.

SUMMARY OF THE INVENTION

An object of the present invention is to provide a delay circuit capable of precisely adjusting the delay time of a clock signal to be delayed.

Another object of the present invention is to provide a semiconductor integrated circuit capable of always performing proper phase comparisons independent of the frequency of a clock signal.

Another object of the present invention is to prevent the occurrence of jitters of an internal clock signal during phase adjustment.

Another object of the present invention is to decrease the number of times phase comparisons are performed to reduce the time required for making the phases coincide.

Another object of the present invention is to reduce the power consumption of circuits necessary for phase comparisons.

According to one of the aspects of the delay circuit in the present invention, the delay circuit comprises a plurality of interpolators connected in cascade. Each of the interpolators receives a reference clock signal and a clock signal output from the preceding interpolator. One of the interpolators operates as a phase adjustment circuit for generating an adjustment clock signal whose transition edge is between the transition edge of the reference clock signal and the transition edge of the clock signal. A predetermined number of interpolators subsequent to the phase adjustment circuit respectively operate as delay stages for generating clock signals delayed by a predetermined time from the clock signals output from the preceding interpolator. Thus, a delayed clock signal delayed from the reference clock signal by a predetermined time is generated.

In this delay circuit, the delayed clock signal is adjusted in delay time by using the interpolators; this enables the minimum unit of the adjustment to be made smaller. In other words, the delayed clock signal can be precisely adjusted.

According to another aspect of the delay circuit in the present invention, operating only those interpolators necessary for generating the delayed clock signal results in reducing the power consumption.

According to another aspect of the delay circuit in the present invention, the delay time of the delayed clock signal is adjusted in two steps; switch controlling the interpolators and phase controlling the phase adjustment circuit. Therefore, the adjustment for shifting the delay time of the delayed clock signal is quickly performed.

According to one of the aspects of the semiconductor integrated circuit in the present invention, clock signals such as an internal clock signal are adjusted in delay time with ease and precision.

According to another aspect of the semiconductor integrated circuit in the present invention, a phase comparator compares the phase of the reference clock signal with the phase of the delayed clock signal. A control circuit supplies the ratio information to the phase adjustment circuit based on the comparison result from the phase comparator and makes the phase of the reference clock signal coincide with the phase of the delayed clock signal. Since the phase of the delayed clock signal is adjusted by controlling the delay circuit including the plurality of interpolators, the minimum unit of the fine adjustment can be made small. That is, the phase adjustment is performed with reliability even in the semiconductor integrated circuits supplied with the reference clock signal of higher frequency.

According to another aspect of the semiconductor integrated circuit in the present invention, the ratio information is easily set by a shift register or a counter.

According to another aspect of the semiconductor integrated circuit in the present invention, the control circuit, at the beginning of a phase comparison, roughly adjusts the phase of the delay clock signal in accordance with the comparison result from the phase comparator. After the time corresponding to the phase difference between the delayed clock signal and the reference clock signal becomes equal to or shorter than the delay time of the interpolators operating as the delay stages, the control circuit supplies the ratio information to the phase adjustment circuit to finely adjust the delayed clock signal in phase. Adjusting the phase of the delayed clock signal in the separate steps of the rough adjustment and the fine adjustment makes it possible that the phase of the delayed clock signal coincide with the phase of the reference clock signal at a smaller number of times of phase comparisons.

According to another aspect of the semiconductor integrated circuit in the present invention, the control circuit judges the phase difference between the delayed clock signal and the reference clock signal to be equal to or shorter than the delay time of the delay stage, based on the reversal of the phases of the delayed clock signal and the reference clock signal. Then, the fine adjustment starts by the phase adjustment circuit. It is possible to judge the reversal of phases with ease by a simple circuit such as a latch, so that the circuit can be reduced in size.

According to another aspect of the semiconductor integrated circuit in the present invention, the interpolators are connected with independent power supply lines. Therefore, it is possible to prevent the clock signals output from the interpolators from varying in phase affected by the other circuits. In addition, supplying lower voltages to the interpolators compared with the other circuits, leads to reducing the power consumption.

According to another aspect of the semiconductor integrated circuit in the present invention, the semiconductor integrated circuit further comprises a start signal generator for activating a start signal in synchronization with the reference clock signal at the beginning of the phase comparison. Therefore, the control circuits can be synchronized with one another at the beginning of the phase comparison so that the phase comparison can always be started at a predetermined timing.

According to another aspect of the semiconductor integrated circuit in the present invention, the start signal generator activates the start signal in synchronization with the falling edge of the reference clock signal. Therefore, the high-level period of the reference clock signal is masked by the start signal so that the occurrence of hazard of the reference clock signal can be prevented and the delay circuit can be stably operated.

According to another aspect of the semiconductor integrated circuit in the present invention, the semiconductor integrated circuit comprises frequency dividers for respectively dividing the frequencies of the reference clock signal and the delayed clock signal. The phase comparator is supplied with the reference clock signal and the internal clock signal having their frequencies divided by the frequency dividers. Therefore, the phase comparator can be operated with reliability even when the reference clock signal is supplied at higher frequency. Decreasing the frequency the phase comparison is performed results in reducing the power consumption.

According to another aspect of the semiconductor integrated circuit in the present invention, the semiconductor integrated circuit further comprises a start signal generator for activating a start signal in synchronization with the reference clock signal at the beginning of the phase comparison. The frequency dividers start operating in response to the activation of the start signal and then respectively start outputting the divided reference clock signal and the divided delayed clock signal after a predetermined number of clocks. Therefore, it is possible to reduce the maximum value of the phase difference between the reference clock signal and the delayed clock signal supplied to the phase comparator when the reference clock signal has certain frequency. As a result, the number of times phase comparisons are performed during the rough adjustment can be decreased as well as the number of the interpolators.

According to another aspect of the semiconductor integrated circuit in the present invention, the number of clocks, from the reception of the activation of the start signal to the beginning of the output of the divided reference clock signal and the delayed clock signal, is set in accordance with the frequency of the reference clock signal. This makes it possible to reduce the number of times of phase comparisons required for the phase adjustment.

According to another aspect of the semiconductor integrated circuit in the present invention, the semiconductor integrated circuit further comprises a mode register for setting a number of wait clocks. Therefore, the number of wait clocks can be easily set in accordance with the frequency of the reference clock signal by modifying the mode register at such occasions as the power is switched on.

According to another aspect of the semiconductor integrated circuit in the present invention, the semiconductor integrated circuit further comprises a fuse for setting the predetermined number of clocks. This enables easy and reliable setting of the predetermined number of clocks by blowing the fuse in accordance with device specifications (frequency) in the fabrication process.

According to another aspect of the semiconductor integrated circuit in the present invention, the semiconductor integrated circuit comprises control terminals for setting the predetermined number of clocks. Therefore, the control terminals can be used as test terminals for the evaluation of products. The control terminals are connected with power supply lines or ground lines to set the predetermined number of clock signals. By using the control terminals as external terminals, the predetermined number of clocks is set on board in accordance with the clock frequency of the system mounting the semiconductor integrated circuit.

According to another aspect of the semiconductor integrated circuit in the present invention, the semiconductor integrated circuit comprises a main delay circuit, a sub delay circuit, a selecting circuit, a phase comparator, and a control circuit.

The main delay circuit comprises a plurality of interpolators connected in cascade. Each of the interpolators receives a reference clock signal and a clock signal output from the preceding interpolator. One of the interpolators operates as a phase comparator for generating an adjustment clock signal whose transition edge is between the transition edge of the reference clock signal and the transition edge of the clock signal. A predetermined number of interpolators subsequent to the phase adjustment circuit respectively operate as delay stages for generating a clock signal delayed by a predetermined time from the clock signal output from the preceding interpolator. The main delay circuit thus generates a delayed clock signal delayed from the reference clock signal by a predetermined time.

The sub delay circuit comprises a second interpolator for generating in accordance with the ratio information a second delayed clock signal whose transition edge is between the transition edge of the reference clock signal and the transition edge of the clock signal.

The selecting circuit outputs the delayed clock signal output from the main delay circuit or the second delayed clock signal from the sub delay circuit as an internal clock signal. In addition, the selecting circuit selects the second delayed clock signal output from the sub delay circuit when a predetermined interpolator at the front or the back side of the main delay circuit operates as the phase adjustment circuit.

The phase comparator compares the phase of the reference clock signal with the phase of the internal clock signal. The control circuit supplies the ratio information to the phase adjustment circuit in the main delay circuit and the interpolators in the sub delay circuit based on the comparison result from the phase comparator and makes the phase of the reference clock signal coincide with the phase of the delayed clock signal.

Here, comprising the sub delay circuit makes it possible to temporarily operate the second interpolator of the sub delay circuit as the phase adjustment circuit when operating the interpolator at one side of the main delay circuit and then the interpolator at the other side thereof as the phase adjustment circuit. Therefore, it is possible to switch the interpolators of the main delay circuit while the second interpolator of the sub delay circuit adjusting the phase. At this time, the selecting circuit selects the second delayed clock signal output from the sub delay circuit. Accordingly, the internal clock signal is not affected by switching the interpolators. This consequently prevents the occurrence of jitters of the internal clock signal.

According to another aspect of the semiconductor integrated circuit in the present invention, the sub delay circuit can make phase adjustment in the wider phase range than the interpolators in the main delay circuit. This allows sufficient time margin for the selecting circuit to select each of the delayed clock signals, thereby realizing stable phase adjustment.

According to another aspect of the semiconductor integrated circuit in the present invention, the interpolators at both sides of the main delay circuit are used in the same phase region (for example, 0–90°). As a result, when making the phase adjustment, for example, from 350° to 370(=10)°, the interpolator at one side makes the adjustment while the interpolator on the other side prepares for an adjustment, whereby the interpolators are smoothly switched.

According to another aspect of the semiconductor integrated circuit in the present invention, the interpolators are connected with independent power supply lines. This prevents the phase fluctuation of the clock signals output from the interpolators due to the influences of the other circuits. Moreover, supplying lower voltages to the interpolators can reduce the power consumption.

According to another aspect of the semiconductor integrated circuit in the present invention, an adjustment delay circuit comprises a plurality of third interpolators connected in cascade. The adjustment circuit adjusts the maximum delay time of the interpolators in the main delay circuit and the second interpolator in the sub delay circuit to a value which is one fraction of an integer of the cycle of the reference clock signal, by adjusting the third interpolators in the adjustment delay circuit. Accordingly, when the maximum delay time of one interpolator is adjusted to a value, for example, a fourth (90°) of the cycle of the reference clock signal, the phase value equivalent to one cycle of the reference clock can be adjusted by four interpolators. In this example, at least four interpolators are used for adjusting the phase of the reference clock signal because a shift of 10° and a shift of 370° in phase are relatively the same. Accordingly, it is possible to precisely adjust the phases by fewer interpolators.

According to another aspect of the semiconductor integrated circuit in the present invention, the second phase comparator in the adjustment circuit compares the phase of the reference clock signal with the phase of an output clock signal output from the adjustment delay circuit. The adjustment circuit adjusts the maximum delay time of the third interpolators in the adjustment delay circuit to a value which is one fraction of an integer or a multiple of the cycle of the reference clock signal, based on the comparison result from the phase comparator. Then, the maximum delay time of the interpolators in the main delay circuit and the second interpolator in the sub delay circuit are indirectly adjusted to a value which is one fraction of an integer or a multiple of the cycle of the reference clock signal, by adjusting the adjustment delay circuit. Accordingly, the adjustment by the adjustment circuit does not affect the interpolators in the main delay circuit and the second interpolator in the sub delay circuit, so that these interpolators can perform stable operations.

According to another aspect of the semiconductor integrated circuit in the present invention, the adjustment circuit adjusts the third interpolators in the adjustment delay circuit, which are identical to the interpolators in the main delay circuit and the second interpolator in the sub delay circuit. This facilitates the adjustment to the phase of the reference clock signal.

According to another aspect of the semiconductor integrated circuit in the present invention, the number of interpolators in the main delay circuit is more than the number of third interpolators in the adjustment delay circuit. For example, the adjustment delay circuit is comprised of four third interpolators and the maximum delay time of the third interpolators is set at a value, a fourth (90°) of the cycle of the reference clock signal. In this case, the main delay circuit is comprised of five interpolators, having the range of phase adjustment at 450°. On this account, the two interpolators at both sides of the main delay circuit can be used in the same phase region (for example, 0–90°). As a result, when making the phase adjustment from 350° to 370(=10)°, for example, the interpolator at one side can make the adjustment while the interpolator at the other side prepares for an adjustment, thereby allowing the smooth switching of the interpolators.

According to another aspect of the semiconductor integrated circuit in the present invention, when the adjustment delay circuit sets the delay time equal to one cycle of the reference clock signal, the interpolators at both sides of the main delay circuit can be used in the same phase region (for example, 0–90°). Consequently, the interpolators are smoothly switched as mentioned above.

According to another aspect of the semiconductor integrated circuit in the present invention, the phase adjustment by the control circuit is performed after the adjustment circuit adjusting the maximum delay time, that is, after setting the maximum delay time of the main delay circuit and the sub delay circuit. This prevents the occurrence of jitters of the delayed clock signal affected by the adjustment circuit.

According to another aspect of the semiconductor integrated circuit in the present invention, the control circuit roughly adjusts the phase of the internal clock signal in accordance with the comparison result from the phase comparator at the beginning of a phase comparison. After the time corresponding to the phase difference between the delayed clock signal and the reference clock signal becomes equal to or shorter than the maximum delay time of the interpolators, the control circuit supplies the ratio information to the phase adjustment circuit in accordance with the comparison result from the phase comparator so as to finely adjust the phase of the internal clock signal. Separately performing the rough and the fine phase adjustments to the internal clock signal makes it possible that the phase of the delayed clock signal coincide with the phase of the reference clock signal at a smaller number of times of phase comparisons.

According to another aspect of the semiconductor integrated circuit in the present invention, the control circuit judges the phase difference between the reference clock signal and the internal clock signal to be equal to or shorter than the maximum delay time of the interpolators based on the reversal of the phases of the reference clock signal and the internal clock signal. Then, the phase adjustment circuit starts the fine adjustment. It is possible to easily judge the reversal of the phases by a simple circuit such as a latch, whereby the circuit can be reduced in size.

According to another aspect of the semiconductor integrated circuit in the present invention, when the ratio information is set at the central value, all the interpolators that can be switched to the phase adjustment circuit, delay the reference clock signal by the same amount of time. This equalizes the phase variation of the internal clock signal when the interpolators switched to the phase adjustment circuit.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 19 is a controlling state diagram showing the operations of the combinational circuit in FIG. 18;

FIG. 22 is a controlling state diagram showing the operations of the combinational circuit in FIG. 21;

FIG. 28 is a controlling state diagram showing the operations of the fine controller in FIG. 27;

FIG. 49 is a controlling state diagram showing the operations of the combinational circuit in FIG. 48;

FIG. 67 is an explanatory diagram showing an overview of the operations of the switching circuit and the first selector in FIG. 53;

DESCRIPTION OF THE PREFERRED EMBODIMENTS

Figure 1:
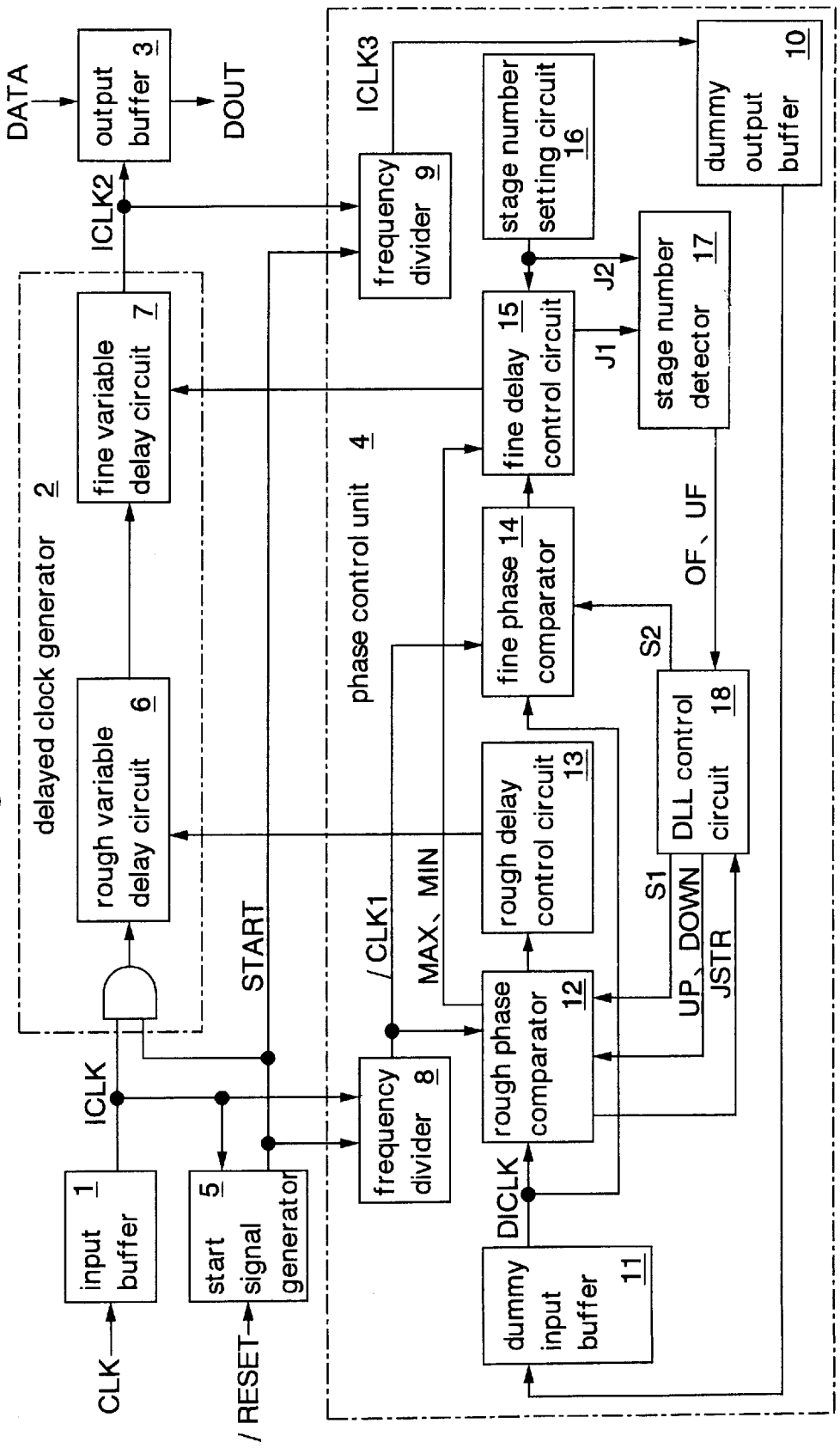
FIG. 1 is a block diagram showing the conventional semiconductor integrated circuit.
Figure 2:
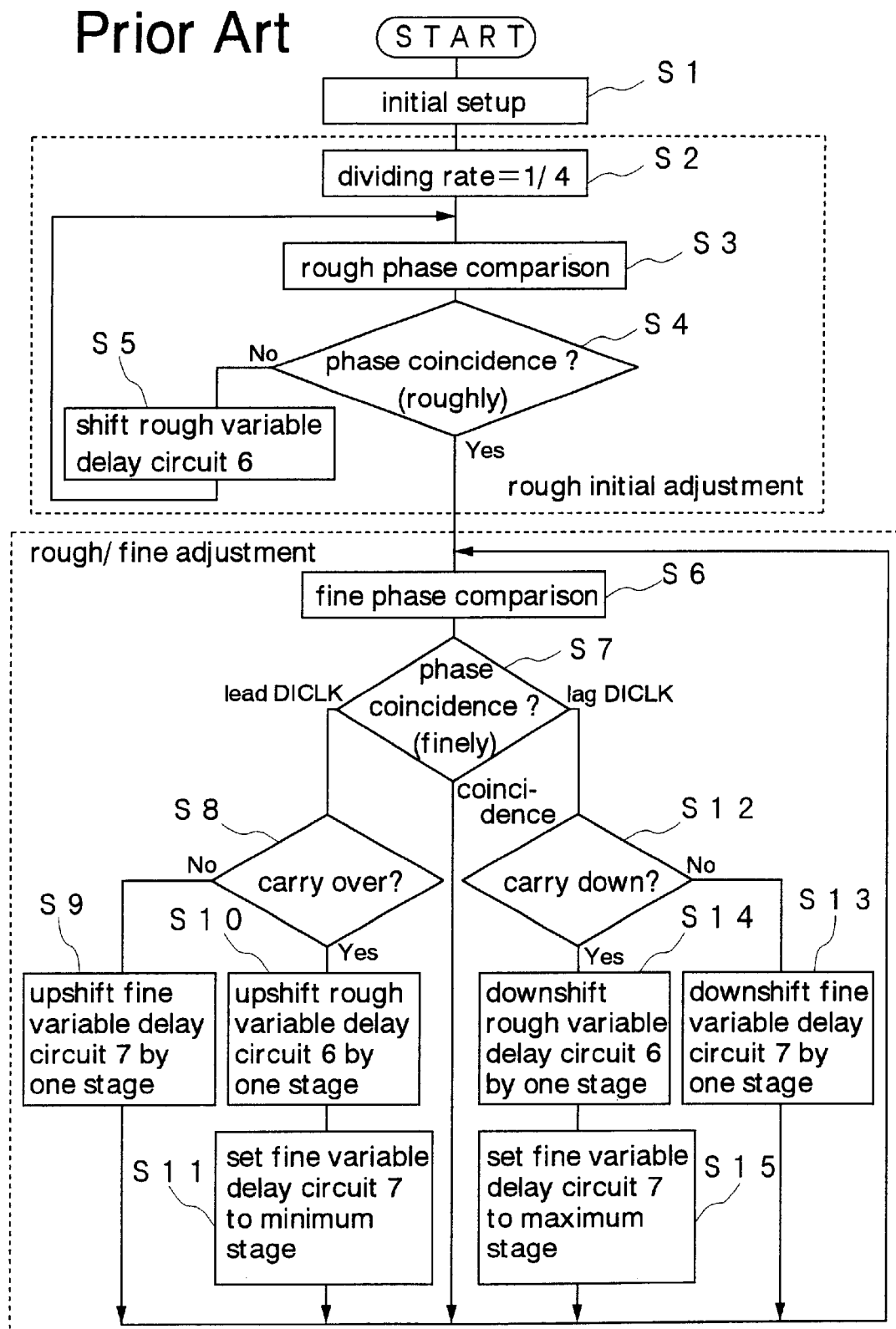
FIG. 2 is a flowchart showing the control for the conventional phase adjustment to a clock signal.
Figure 3:
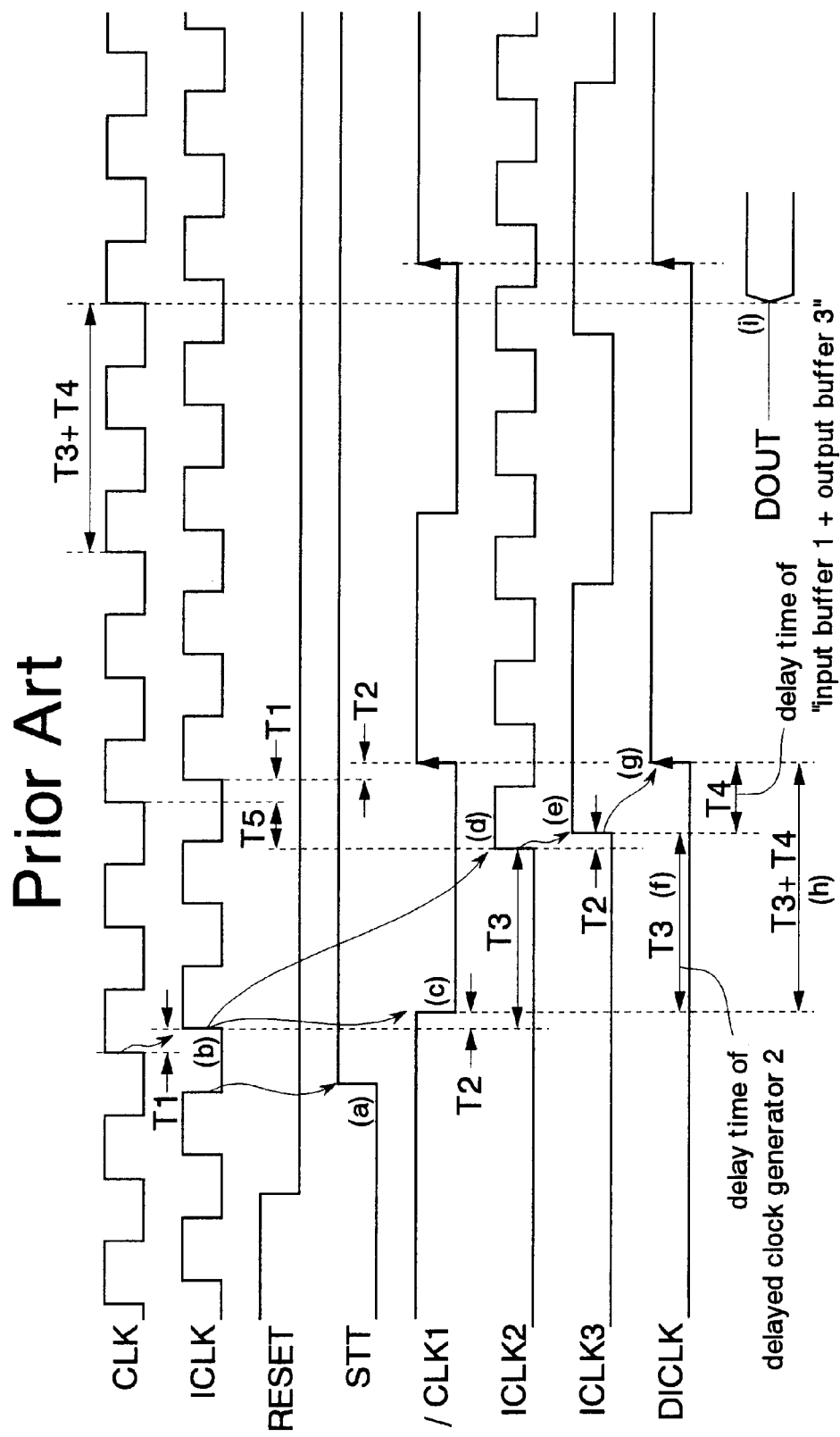
FIG. 3 is a timing chart showing the essential signals in the phase adjustment in FIG. 2.
Figure 4:
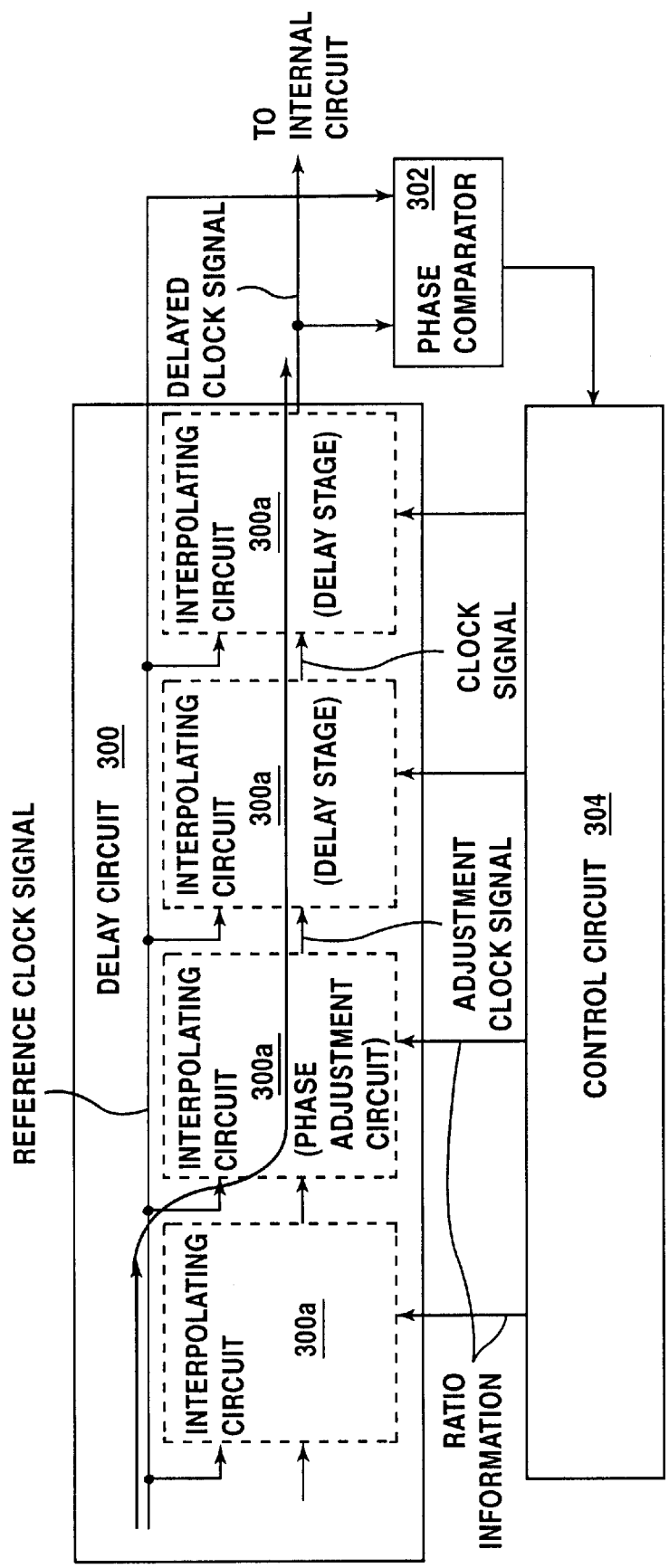
FIG. 4 is a block diagram showing the basic principle of first through third embodiments.

FIG. 4 is a block diagram showing the basic principle of first through third embodiments to be described later.

The delay circuit 300 of the present invention comprises a plurality of interpolators 300a connected in cascade. Each of the interpolators 300a receives a reference clock signal and the clock signal output from the interpolator 300a at the previous stage. One of the interpolator 300a operates as a phase adjustment circuit for generating an adjustment clock signal having a phase such that its transition edge is between the transition edge of the reference clock signal and the transition edge of the clock signal. A predetermined number of interpolators 300a subsequent to the phase adjustment circuit operate as delay stages for generating clock signals delaying by a predetermined time from the clock signals output from the preceding interpolators. Thus, a delayed clock signal is generated delaying from the reference clock signal by a predetermined time.

A phase comparator 302 compares the phases of the reference clock signal and the delayed clock signal. A control circuit 304 performs a control to supply ratio information to the phase adjustment circuit (300a) based on the comparison result from the phase comparator so that the phase of the reference clock signal coincide with the phase of the delayed clock signal.

Besides, the control circuit 304 roughly adjusts the delayed clock signal in phase at the beginning of the phase comparison based on the comparison result from the phase comparator 302. After the phase difference between the delayed clock signal and the reference clock signal becomes equal to or shorter than the delay time of the delay circuits 300a operating as the delay stages, the control circuit 304 supplies ratio information to the phase adjustment circuit based on the comparison result from the phase comparator 302, thereby finely adjusting the delayed clock signal in phase.

Figure 5:
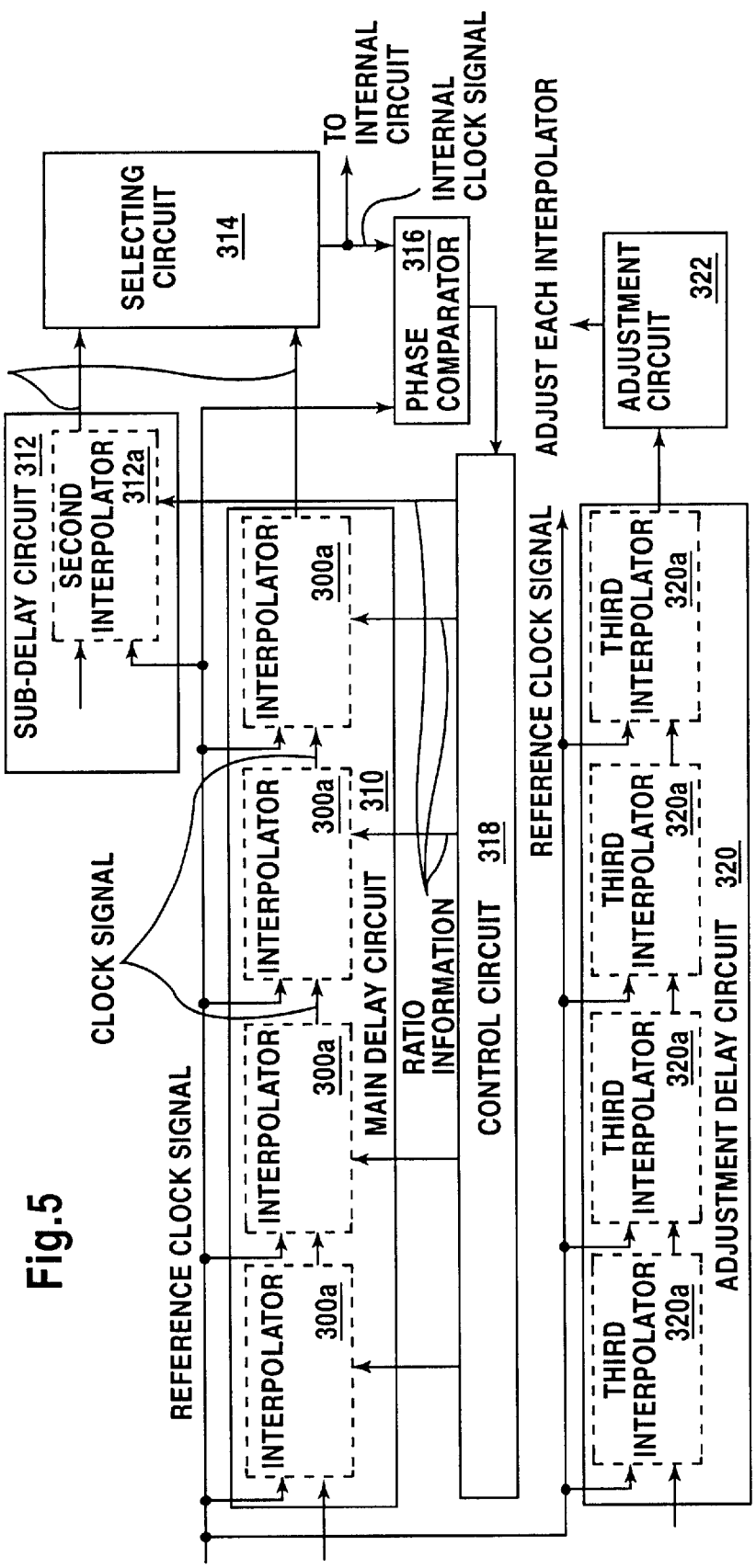
FIG. 5 is a block diagram showing the basic principle of a fourth embodiment.

FIG. 5 is a block diagram showing the basic principle of a fourth embodiment to be described later.

The semiconductor integrated circuit comprises a main delay circuit 310, a sub delay circuit 312, a selecting circuit 314, a phase comparator 316, and a control circuit 318.

The main delay circuit 310 comprises a plurality of interpolators 300a connected in cascade. Each of the interpolators 300a receives a reference clock signal and the clock signal output from the preceding interpolator 300a. One of the interpolator 300a operates as a phase adjustment circuit for generating an adjustment clock signal having a phase such that its transition edge is between the transition edge of the reference clock signal and the transition edge of the clock signal. A predetermined number of interpolators 300a subsequent to the phase adjustment circuit operate as delay stages for generating clock signals delaying by a predetermined time from the clock signals output from the previous stages. Thus, the main delay circuit 310 generates a delayed clock signal delaying from the reference clock signal by predetermined time.

The sub delay circuit 312 has an interpolator 312a for generating a second delayed clock signal having a phase such that its transition edge is between the transition edge of the reference clock and the transition edge of a clock signal, in accordance with ratio information.

The selecting circuit 314 outputs either of the delayed clock signals output from the main delay circuit 310 and the second delayed clock signal output from the sub delay circuit 312 as an internal clock signal. Besides, the selecting circuit 314 selects the second delayed clock signal output from the sub delay circuit 312 when a predetermined interpolator 300a at the front or back side of the main delay circuit 310 operates as the phase adjustment circuit.

The phase comparator 316 compares the phases of the reference clock signal and the internal clock signal. The control circuit 318 performs a control to supply ratio information to the phase adjustment circuit (300a) and the second interpolator 312a based on the comparison result from the phase comparator 316 so that the reference clock signal and the delayed clock signal (or the second delayed signal) coincide with each other in phase.

The semiconductor integrated circuit also comprises an adjustment delay circuit 320 and an adjustment circuit 322. The adjustment delay circuit 320 comprises a plurality of third interpolators 320a connected in cascade. The adjustment circuit 322 adjusts the third interpolators 320a in the adjustment delay circuit 320 so that the maximum delay time of the respective interpolators 300a in the main delay circuit 310 and the interpolator in sub delay circuit 312 becomes a value, which is one fraction of an integer of the cycle of the reference clock signal.

Now, the first embodiment of the delay circuit and the semiconductor integrated circuit will be described according to the present invention.

The delay circuit according to the present invention is formed as a semiconductor integrated circuit. The semiconductor integrated circuit is formed such as a DDR-SDRAM on a silicon substrate by using CMOS process technology. Like ordinary semiconductor memories, the DDR-SDRAM has a memory core unit and a peripheral circuit unit. In the memory core units are formed memory cell arrays having a plurality of memory cells, sense amplifiers, and the like. This DDR-SDRAM has the function of outputting the data signals read from the memory cells, in synchronization with the rises of complementary clock signals supplied from the exterior.

Figure 6:
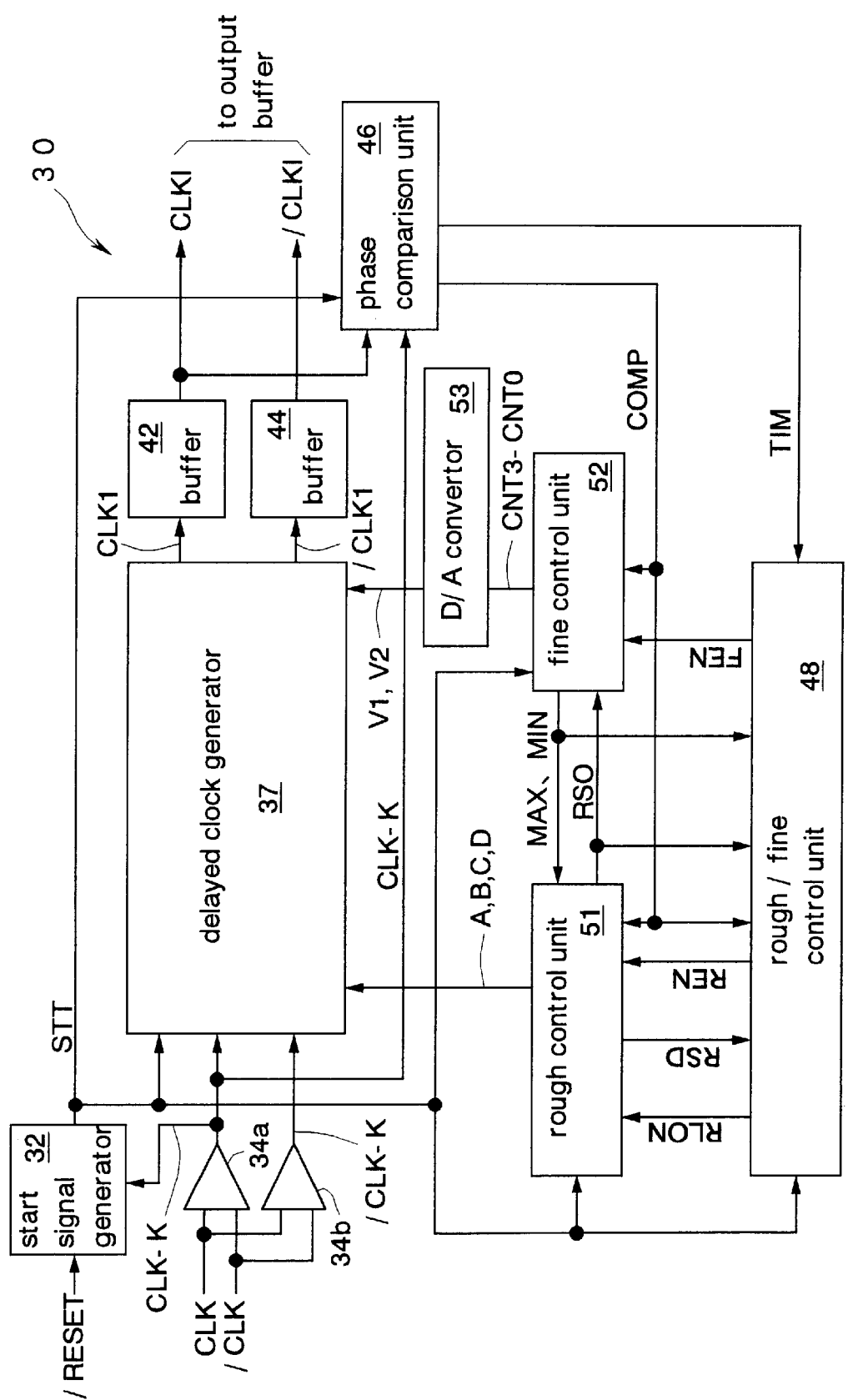
FIG. 6 is a block diagram showing the clock control unit in the first embodiment.

FIG. 6 shows a clock control unit 30 in the DDR-SDRAM.

The clock control unit 30 comprises a start signal generator 32, clock buffers 34a and 34b, a delayed clock generator 37, buffers 42 and 44, a phase comparison unit 46, a rough/fine control unit 48, a rough control unit 51, a fine control unit 52, and a D/A converter 53. The rough/fine control unit 48, rough control unit 51, fine control unit 52, and D/A converter 53 correspond to the control circuit 304 shown in FIG. 4.

The start signal generator 32 receives the inactivation of a reset signal /RESET generated inside the chip on the occasions such as the switching-on of the power and the release from a self refresh mode and turns a start signal STT to high level at a predetermined timing.

The clock buffers 34a and 34b are composed of current mirror differential amplifiers. The clock buffers 34a and 34b receive clock signals CLK and /CLK, and output internal clock signals CLK-K and /CLK-K, respectively. The clock signals CLK and /CLK correspond to the reference clock signal. The denotation "/" employed in the clock signal /CLK indicates the logic inversion with respect to the clock signal CLK.

The delayed clock generator 37 receives the internal clock signal CLK-K and /CLK-K, control signals A, B, C, and D (hereinafter, may also be shortened as control signals A–D), and the start signal STT, is supplied with control voltages V1 and V2, and outputs internal clock signals CLK1 and /CLK1.

The buffers 42 and 44 are circuits for shaping the signal waveforms of the internal clock signals CLK1 and /CLK1 output from the delayed clock generator 37, and outputting the resultant as internal clock signals CLKI and /CLKI, respectively. The internal clock signals CLKI and /CLKI are supplied to output buffers (not shown) in order to control the output of data signals.

The phase comparison unit 46 receives the start signal STT and the internal clock signals CLK-K and CLKI, compares the phases of the internal clock signals CLK-K and CLKI, and outputs a comparison result signal COMP and a timing signal TIM.

The rough/fine control unit 48 receives: the comparison result signal COMP; the timing signal TIM; a maximum signal MAX and a minimum signal MIN from the fine control unit 52; a rough shift order signal RSO and a rough shift direction signal RSD from the rough control unit 51; and the start signal STT. The rough/fine control unit 48 outputs a rough enable signal REN, a fine enable signal FEN, and a rough lock on signal RLON.

The rough control unit 51 receives the rough enable signal REN, the rough lock on signal RLON, the maximum signal MAX, the minimum signal MIN, and the start signal STT, and outputs the rough shift direction signal RSD, the rough shift order signal RSO, and the control signals A–D.

The fine control unit 52 receives the comparison result signal COMP, the fine enable signal FEN, the rough shift order signal RSO, and the start signal STT, and outputs the maximum signal MAX, the minimum signal MIN, and counter signals CNT3–CNT0. Hereinafter, the values of the counter signals CNT3–CNT0 may also be referred to as a counter value.

The D/A converter 53 receives the 4-bit counter signals CNT3–CNT0, generates the control voltage V1 in accordance with the counter value received, and generates the control voltage V2 in accordance with the inverted data of the counter value received.

Figure 7:
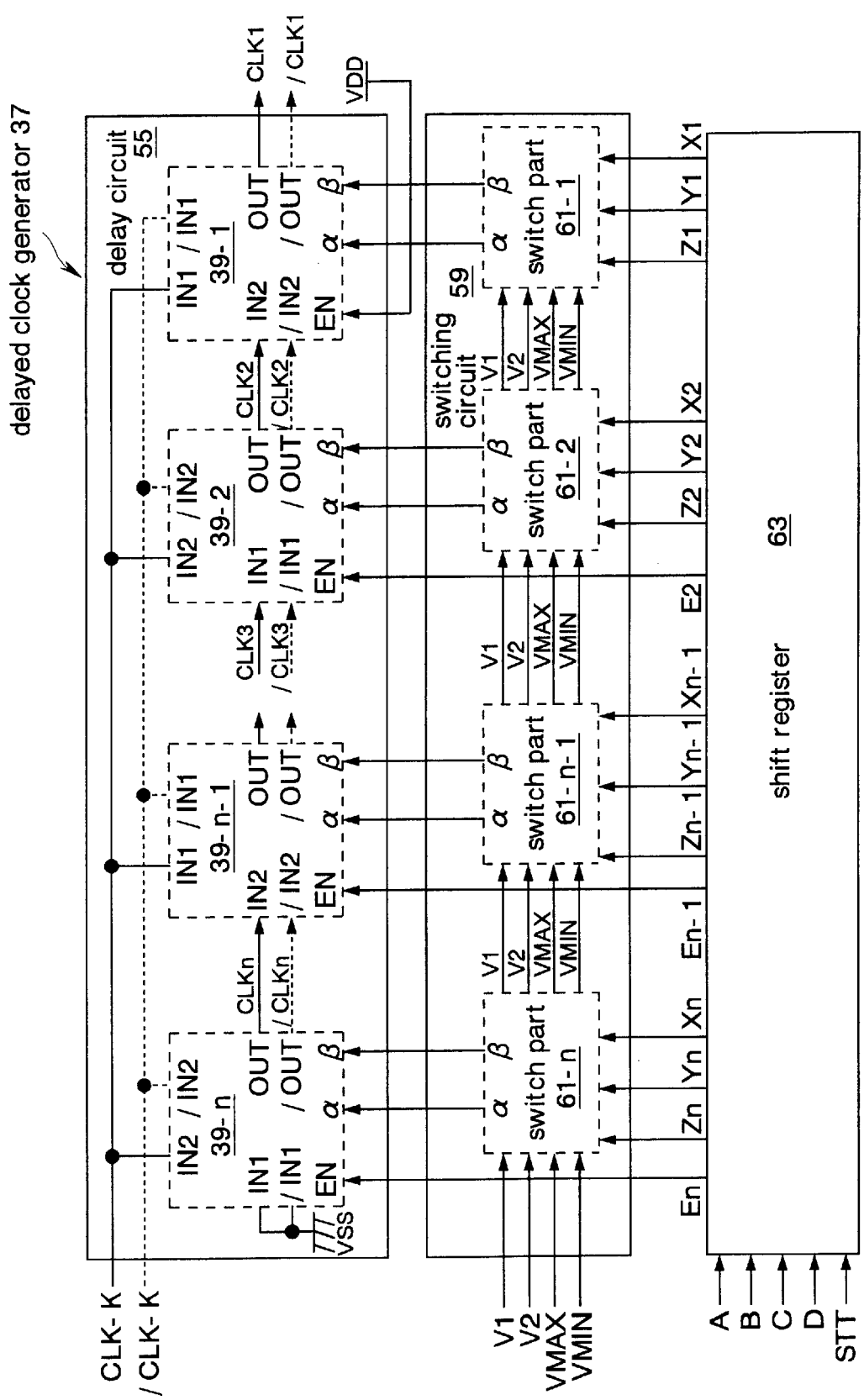
FIG. 7 is a block diagram showing the delayed clock generator in FIG. 6.

FIG. 7 shows the details of the delayed clock generator 37.

The delayed clock generator 37 comprises a delay circuit 55, a switching circuit 59, and a shift register 63.

The delay circuit 55 has a plurality of interpolators 39-1, 39-2, . . . , and 39-n. The interpolators 39-1, 39-2, . . . , and 39-n have input terminals IN1, /IN1, IN2, and /IN2, an enable terminal EN, control terminals α and β, and output terminals OUT and /OUT.

The interpolators 39 in the odd-numbered stages from the output side receive the internal clock signals CLK-K and /CLK-K at their input terminals IN1 and /IN1, respectively, and receive the outputs (for example, CLK2 and /CLK2) from the interpolators 39 in the previous stages at their input terminals IN2 and /IN2. The interpolators 39 in the even-numbered stages from the output side receive the internal clock signals CLK-K and /CLK-K at their input terminals IN2 and /IN2, respectively, and receive the outputs (for example, CLK3 and /CLK3) from the interpolators 39 in the previous stages at their input terminals IN1 and /IN1. The input terminals IN1 and /IN1 of the interpolator 39-n in the initial stage are connected to a ground line VSS. The interpolator 39-1 in the final stage outputs the internal clock signals CLK1 and /CLK1.

The interpolators 39-2, 39-3, . . . , and 39-n also receive enable signals E2, E3, . . . , and En out put from the shift resistor 63 at the enable terminals EN, respectively, and are supplied with the control voltages α and β output from the switching circuit 59 at the respective control terminals α and β.

Note that the internal clock signals (for example, CLK2 and /CLK2) output from the respective interpolators 39 are not fed back to the preceding interpolators 39.

The switching circuit 59 comprises switch parts 61-1, 61-2, . . . , and 61-n which correspond to the interpolators 39-1, 39-2, . . . , and 39-n in the delay circuit 58, respectively. The individual switch parts 61 are supplied with the same control voltages V1, V2, VMAX, and VMIN. Here, the control voltages VMAX and VMIN are identical with the maximum voltage and the minimum voltage the D/A converter 53 outputs. The control voltages VMAX and VMIN are generated by a voltage generator not shown. The switch parts 61-1, 61-2, . . . , and 61-n also receive switching signals X1, Y1, and Z1, switching signals X2, Y2, and Z2, . . . , and switching signals Xn, Yn, and Zn, respectively.

The switch parts 61-1, 61-2, . . . , and 61-n output the control voltages α and β to the interpolators 39-1, 39-2, . . . , and 39-n, respectively.

The shift register 63 receives the control signals A–D and the start signal STT, and outputs the enable signals E2, E3 . . . and En, and the switching signals X1, Y1, Z1, X2, Y2, Z2, . . . , Xn, Yn, and Zn.

Figure 8:
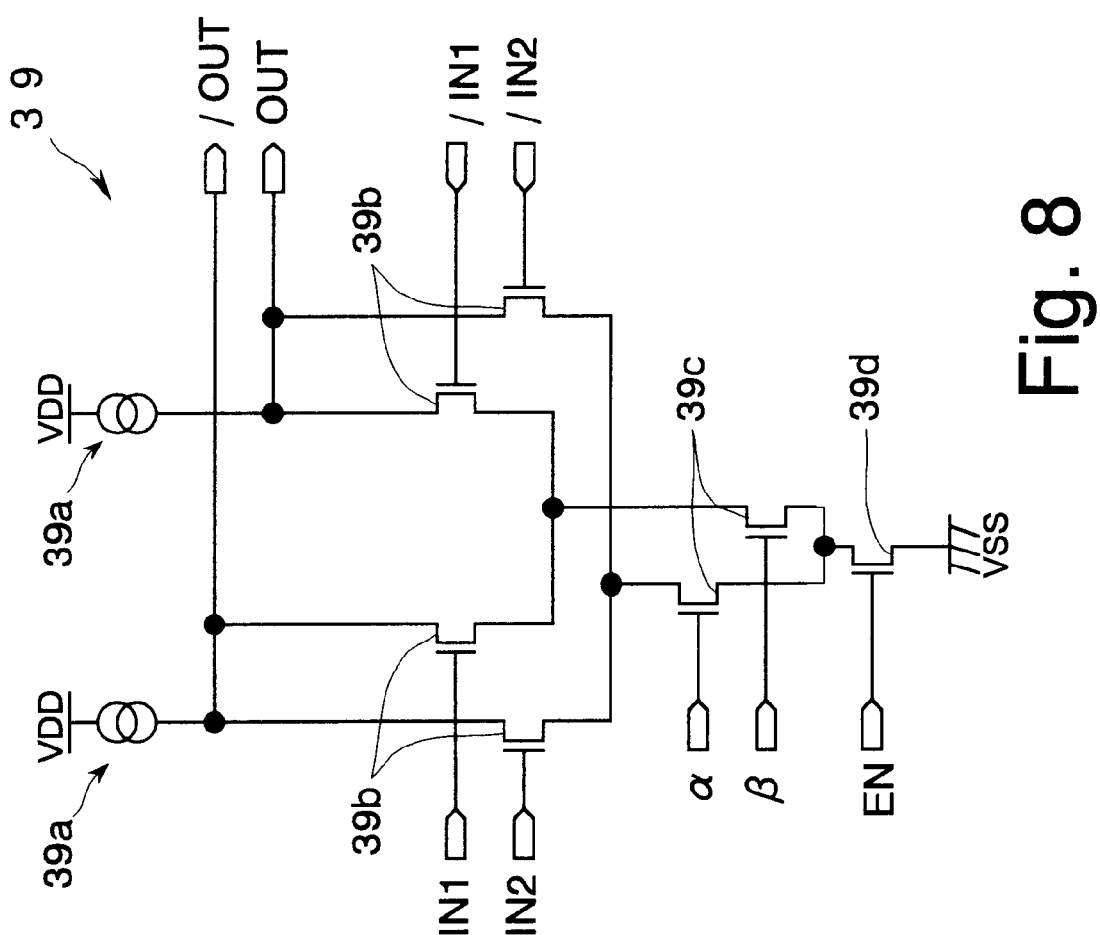
FIG. 8 is a circuit diagram showing an interpolator in FIG. 7.

FIG. 8 shows the details of the interpolators 39.

An interpolator 39 is composed of two differential amplifiers for receiving the input signals IN1 and /IN1 (or IN2 and /IN2) and outputting the output signals OUT and /OUT. Each of the differential amplifiers comprises: a constant-current source 39a consisting of a current mirror circuit or the like; nMOSs 39b for receiving the input signal IN1, /IN1, IN2, or /IN2; and an nMOS 39c for connecting the nMOSs 39b to the ground line VSS. The control voltage β is supplied to the gate of the nMOS 39c corresponding to the input signals IN1 and /IN1. The control voltage α is supplied to the gate of the nMOS 39c corresponding to the input signals IN2 and /IN2. Incidentally, the terminals supplied with the control voltages α and β will be also referred to as control terminals α and β.

Figure 9:
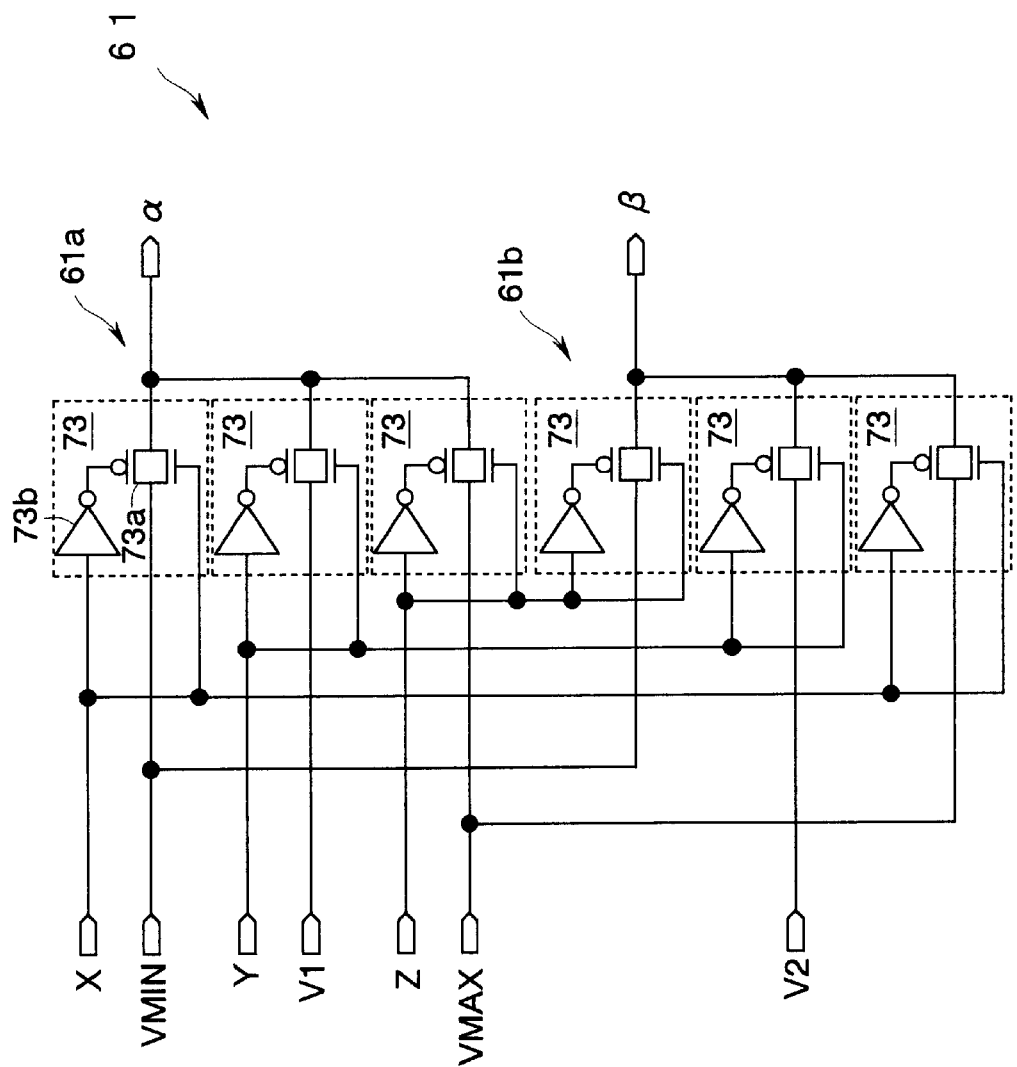
FIG. 9 is a circuit diagram showing a switch part in FIG. 7.

FIG. 9 shows each of the switch parts 61 in the switching circuit 59.

A switch part 61 comprises: a first switch part 61a supplied with the control voltages VMIN, V1, and VMAX, and outputting one of them as the control voltage α; and a second switch part 61b supplied with the control voltage VMIN, V2, and VMAX, and outputting one of them as the control voltage β. The first switch part 61a and the second switch part 61b are composed of three switches 73 each consisting of: a CMOS transmission gate 73a formed by connecting the sources and drains of a pMOS and an nMOS; and an inverter 73b connected to the PMOS of the CMOS transmission gate 71. Incidentally, in the following description, the terminals to output the control voltages α and β will be also referred to as control terminals α and β.

In the first switch part 61a, the switch 73 supplied with the control voltage VMIN is controlled by a switching signal X, the switch 73 supplied with the control voltage V1 is controlled by a switching signal Y, and the switch 73 supplied with the control voltage VMAX is controlled by a switching signal Z.

In the second switch part 62b, the switch 73 supplied with the control voltage VMIN is controlled by the switching signal Z, the switch 73 supplied with the control voltage V2 is controlled by the switching signal Y, and the switch 73 supplied with the control voltage VMAX is controlled by the switching signal X.

The output terminals of the respective switches 73 in the first switch part 61a are connected to one another. The output terminals of the respective switches 73 in the second switch part 61b are connected to one another.

Figure 10:
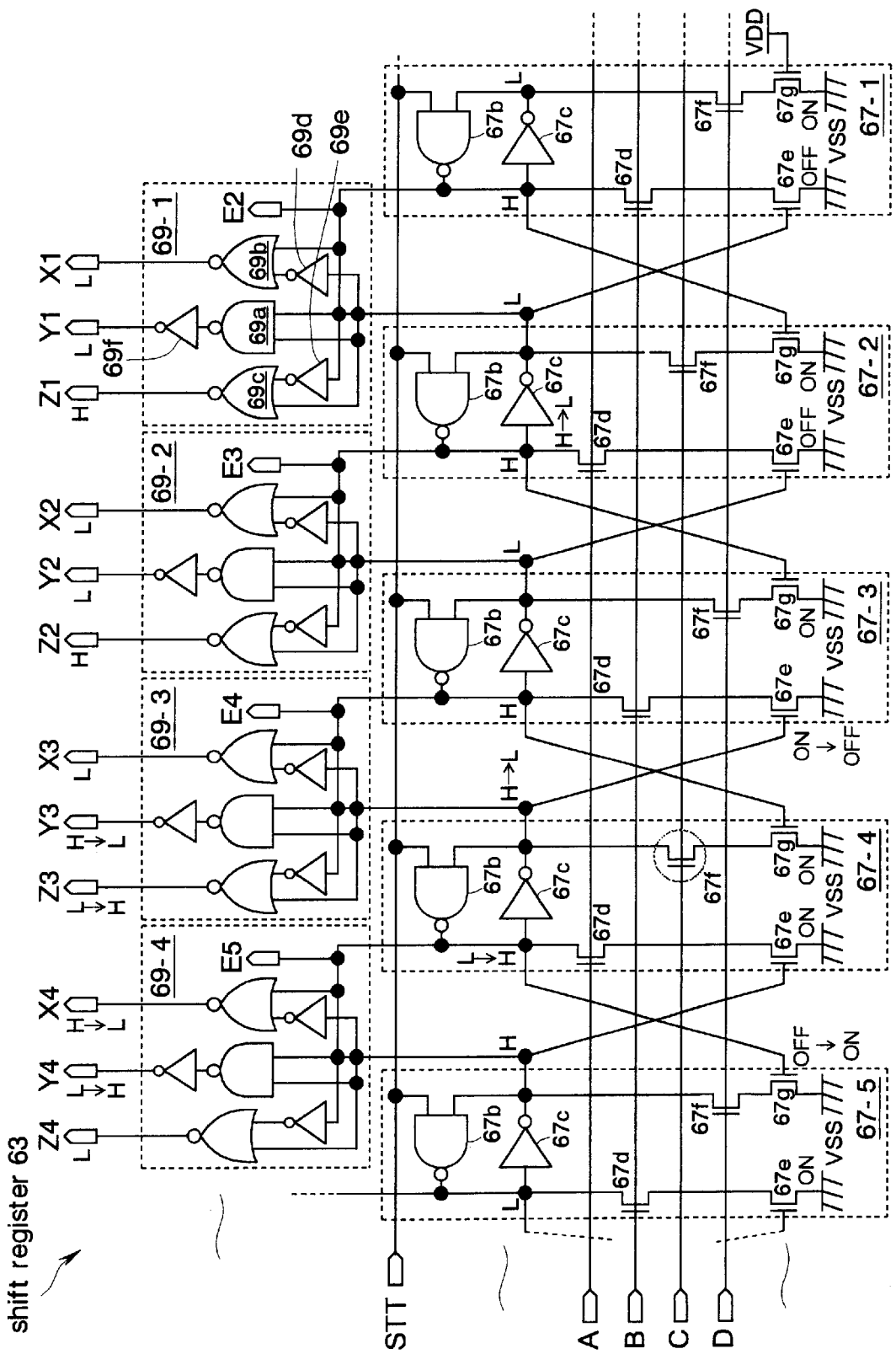
FIG. 10 is a circuit diagram showing the shift register in FIG. 7.

FIG. 10 shows the essential parts of the shift register 63.

The shift register 63 comprises a plurality of control circuits 67-1, 67-2, . . . and control circuits 69-1, 69-2, . . . corresponding to the switch parts 61-1, 61-2, . . . in the switching circuit 59 shown in FIG. 7.

Each of the control circuits 67 has a two-input NAND gate 67b, an inverter 67c, and nMOSs 67d, 67e, 67f, and 67g. The inputs of the NAND gate 66b are supplied with the start signal STT and the output of the inverter 67c. Through the outputs of the NAND gates 67b are output the enable signals E2, E3, . . . , and En. The output of the inverter 67c is connected to an input of the NAND gate 67b, the drain of the nMOS 67f, the gate of the nMOS 67e provided in the adjacent control circuit 67 on the subsequent stage (the right side in the FIG. 10), and a control circuit 69.

The nMOSs 67d and 67e are connected in series, and the source of the nMOS 67e is connected to the ground line VSS. The nMOSs 67f and 67g are connected in series, and the source of the nMOS 67g is connected to the ground line VSS. The gate of the nMOS 67e is connected to the output of the inverter 67c provided in the adjacent control circuit 67 on the previous stage (the left side in the FIG. 10). The gate of the nMOS 67g is connected to the output of the NAND gate 67b provided in the adjacent control circuit 67 on the subsequent stage. The gate of the nMOS 67g in the control circuit 67 at the final stage is connected to a power supply line VDD.

To the gates of the nMOSs 67d and 67f are connected the control signals A and C or the control signals B and D, respectively. That is, adjacent control circuits 67 are alternately supplied with the control signals A, C and the control signals B, D.

Besides, each of the control circuits 69 has a two-input NAND gate 69a, two-input NOR gates 69b and 69c, and inverters 69d, 69e, and 69f.

The inputs of the NAND gate 69a are connected to the output of the NAND gate 67b in a control circuit 67 and the output of the inverter 67c provided in the adjacent control circuit 67 on the previous stage. The inputs of the NOR gate 69b are connected to the output of the NAND gate 67b in the control circuit 67 and, through the inverter 69d, the output of the inverter 67c provided in the adjacent control circuit 67 on the previous stage. The inputs of the NOR gate 69c are connected to the output of the NAND gate 67b through the inverter 69e, and to the output of the inverter 67c provided in the adjacent control circuit 67 on the previous stage. The NAND gates 69a output the switching signals Y1, Y2, . . . through the inverters 69f. The NOR gates 69b output the switching signals X1, X2, . . . The NOR gates 69c outputs the switching signals Z1, Z2, . . .

The operations of the shift register 63 will be described with reference to the flowchart of a rough initial adjustment to be discussed later (step S6 in FIG. 30).

Figure 11:
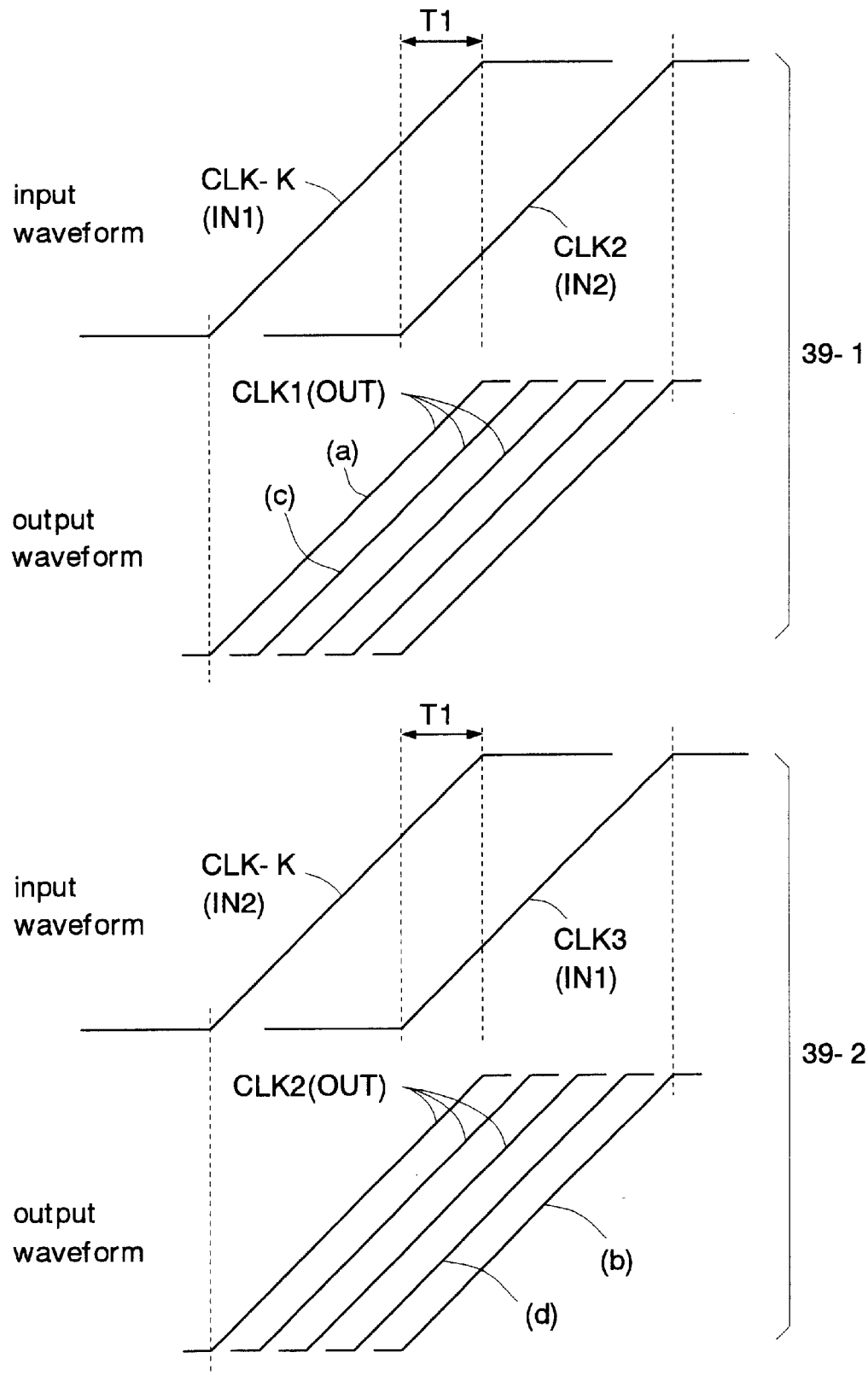
FIG. 11 is a timing chart showing the input waveforms and the output waveforms of the interpolators.

FIG. 11 shows the input waveforms of the internal clock signals supplied to the interpolators 39, and the output waveforms of the internal clock signals output from the interpolators 39. For proper operation of the interpolators 39, the internal clock signals CLK-K and CLKn require a period T for mutual overlapping. In this embodiment, gentle signals having the periods T1 for mutual overlapping are generated by the interpolators 39 in previous stages and the clock buffers 34a and 34b.

For example, the D/A converter 53 shown in FIG. 6 sets the control voltages V1 and V2 to the control voltage VMIN and the control Voltage VMAX, respectively, on receiving the counter value "zero." Incidentally, at this time, the switch parts 61 shown in FIG. 9 receive the high levels of the switching signals Y. The interpolator 39-1 at the odd-numbered stage outputs the internal clock signal CLK1 having almost the same phase as that of the internal clock signal CLK-K on receiving he control voltages V1 and V2 at its control terminals α and β, respectively (FIG. 11(a)). The interpolator 39-2 at the even-numbered stage outputs the internal clock signal CLK2 having almost the same phase as that of the internal clock signal CLK3 on receiving the control voltages V1 and V2 at its control terminals α and β, respectively (FIG. 11(b)). Parenthetically, in actual operation, the output waveforms lag behind the input waveforms in phase by the propagation delay time of the interpolators 39.

Moreover, the D/A converter 53 sets the control voltages V1 and V2 to 25% and 75% of "the control voltage VMAX—the control voltage VMIN," respectively, on receiving the counter value "4". The interpolator 39-1 at the odd-numbered stage outputs the internal clock signal CLK1 having a phase corresponding to 25% of the phase difference between the internal clock signals CLK2 and CLK-K on receiving those control voltages V1 and V2 at the control terminals α and β (FIG. 11(c)). The interpolator 39-2 at the even-numbered stage outputs the internal clock signal CLK2 having a phase corresponding to 75% the phase difference between the internal clock signals CLK3 and CLK-K on receiving those control voltages V1 and V2 at the control terminals α and β (FIG. 11 (d)).

Likewise, the internal clock signal output from each of the interpolators 39 is modified into 16 possible phases by changing the counter value.

Figure 12:
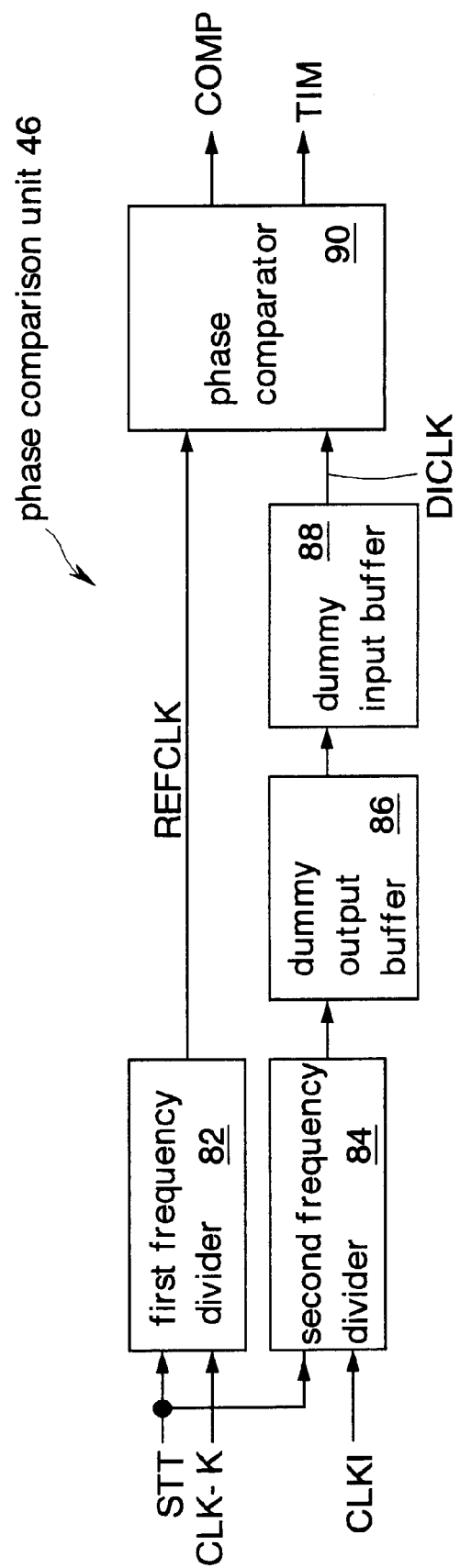
FIG. 12 is a block diagram showing the phase comparison unit in FIG. 5.

FIG. 12 shows the details of the phase comparison unit 46.

The phase comparison unit 46 comprises a first frequency divider 82, a second frequency divider 84, a dummy output buffer 86, a dummy input buffer 88, and a phase comparator 90.

The first frequency divider 82 receives the internal clock signal CLK-K and the start signal STT, and outputs a reference clock signal REFCLK with divided frequency to the phase comparator 90. The second frequency divider 84 receives the internal clock signal CLKI and the start signal STT, and output a clock signal with divided frequency. The clock signal divided by the second frequency divider 84 is transmitted to the dummy output buffer 86 and the dummy input buffer 88, and then output to the phase comparator 90 as an internal clock signal DICLK.

The phase comparator 90 compares the phases of the reference clock signal REFCLK and the internal clock signal DICLK, and outputs the comparison result signal COMP and the timing signal TIM.

Figure 13:
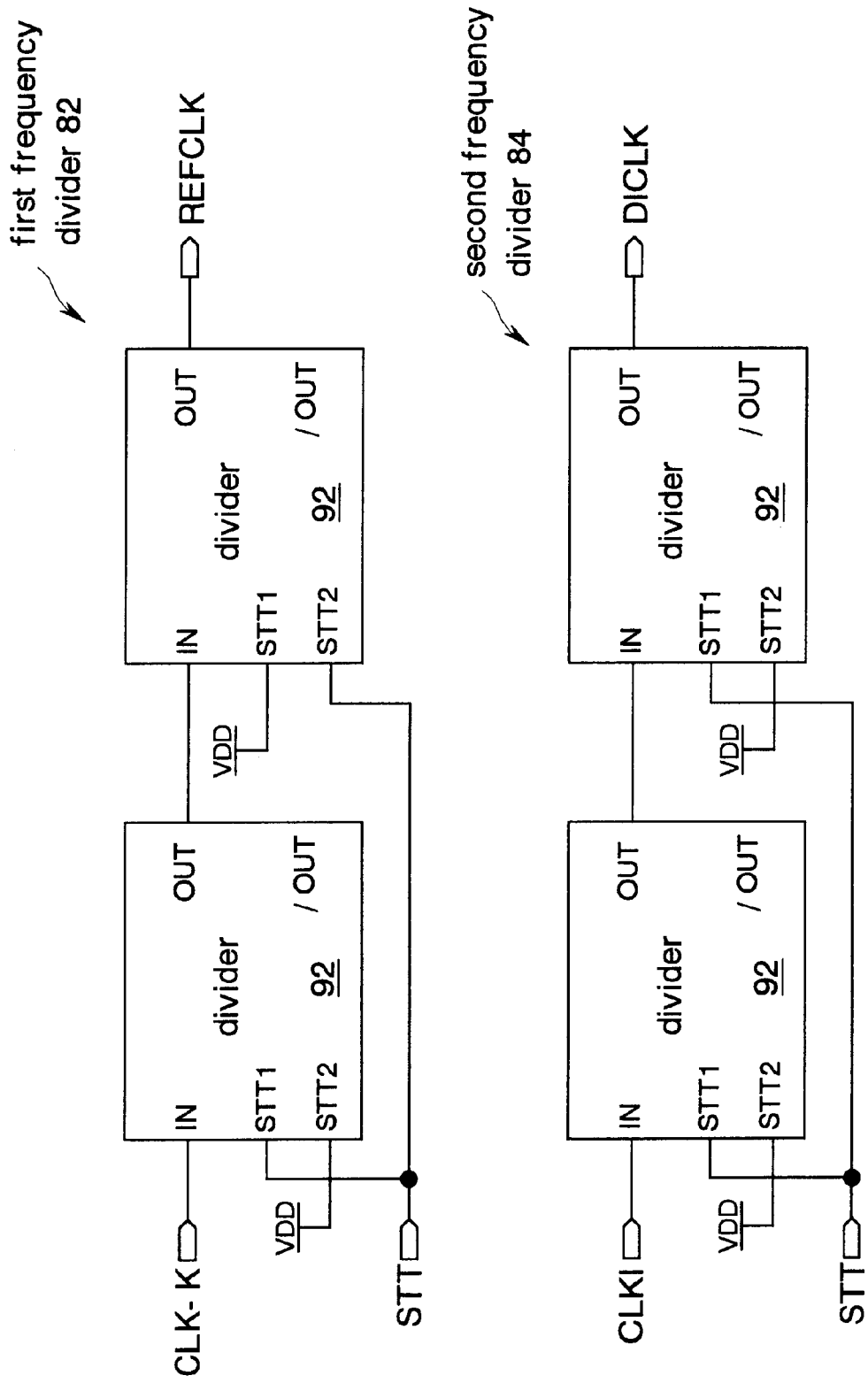
FIG. 13 is a block diagram showing the first divider and the second divider in FIG. 12.

FIG. 13 shows the first frequency divider 82 and the second frequency divider 84.

The first frequency divider 82 and the second frequency divider 84, composed of two dividers 92 connected in series, are circuits for dividing the frequency of a clock signal to a quarter.

The first frequency divider 82 receives the internal clock signal CLK-K at the input terminal IN of the divider 92 in the previous stage, and outputs the reference clock signal REFCLK from the output terminal OUT of the divider 92 in the subsequent stage. The output terminal OUT of the divider 92 in the previous stage is connected to the input terminal IN 20 of the divider 92 in the subsequent stage. The control terminal STT1 of the divider 92 in the previous stage and the control terminal STT2 of the divider 92 in the subsequent stage are supplied with the start signal STT. The control terminal STT2 of the divider 92 in the previous stage and the control terminal STT1 of the divider 92 in the subsequent stage are connected to the power supply line VDD.

The second frequency divider 84 receives the internal clock signal CLKI at the input terminal IN of the divider 92 in the previous stage, and outputs the internal clock signal DICLK from the output terminal OUT of the divider 92 in the subsequent stage. The output terminal OUT of the divider 92 in the previous stage is connected to the input terminal IN of the divider 92 in the subsequent stage. Each of the dividers 92 is supplied with the start signal at the control terminal STT1, and connected with the power supply line VDD at the control terminal STT2.

Figure 14:
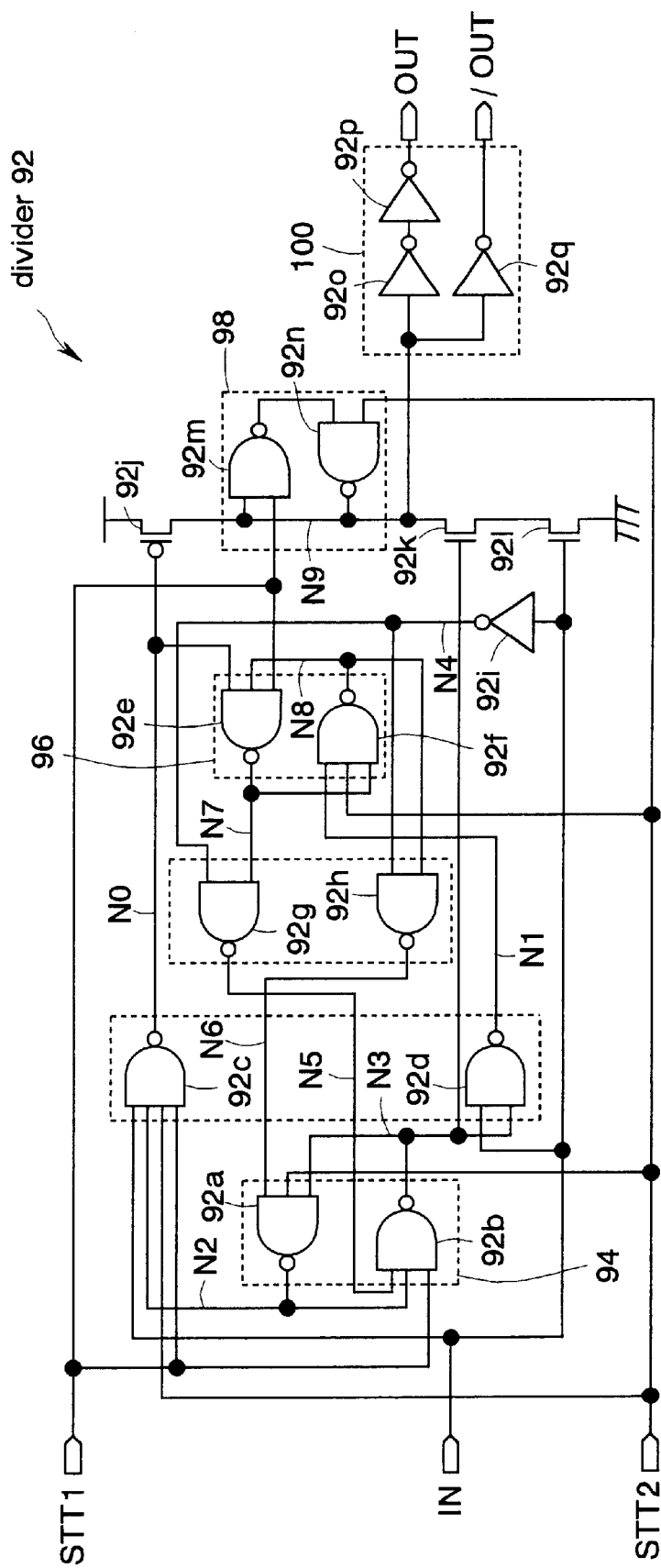
FIG. 14 is a circuit diagram showing a frequency divider in FIG. 13.

FIG. 14 shows the details of the dividers 92.

The divider 92 comprises: a first latch 94 consisting of three-input NAND gates 92a and 92b; a four-input NAND gate 92c and a two-input NAND gate 92d for transmitting the state of the first latch 94 to a second latch 96 in synchronization with the rise of the clock signal supplied through the input terminal; the second latch 96 consisting of three-input NAND gates 92e and 92f; two-input NAND gates 92g and 92h for transmitting the state of the second latch 96 to the first latch 94 in synchronization with the rise of the clock signal supplied through the input terminal; an inverter 92i for supplying the inverted logic of the clock signal to the NAND gates 92g and 92h; a pMOS 92j and nMOSs 92k, 92l connected in series, for controlling the output of the frequency-divided clock signal; an output latch 98 consisting of two-input NAND gates 92m and 92n; and an output circuit 100 consisting of inverters 92o, 92p, and 92q.

The output of the NAND gate 92a (the node N2) is connected to the inputs of the NAND gates 92b and 92c. The output of the NAND gate 92b (the node N3) is connected to input of the NAND gates 92a, 92d and the gate of the nMOS 92k. The output of the NAND gate 92c (the node N0) is connected to an input of the NAND gate 92e and the gate of the pMOS 92j. The output of the NAND gate 92d (the node N1) is connected to an input of the NAND gate 92f. The output of the NAND gate 92e (the node N7) is connected to the inputs of the NAND gates 92f and 92g. The output of the NAND gate 92f (the node N8) is connected to the inputs of the NAND gates 92e and 92h. The output of the NAND gate 92g (the node N5) is connected to an input of the NAND gate 92b. The output of the NAND gate 92h (the node N6) is connected to an input of the NAND gate 92a. The output of the inverter 92i (the node N4) is connected to the inputs of the NAND gates 92g and 92h. The output of the NAND gate 92m is connected to an input of the NAND gate 92n. The output of the NAND gate 92n is connected to an input of the NAND gate 92m and the drains of the transistors 92j and 92k. Besides, the output of the NAND gate 92n is output as the output signal OUT through the inverters 92o and 92p, and as the output signal /OUT through the inverter 92g.

The input terminal IN is connected to the NAND gates 92c and 92d, the inverter 92i, and the gate of the nMOS 92l. The control terminal STT1 is connected to the NAND gates 92b, 92c, 92e, and 92m. The control terminal STT2 is connected to the NAND gates 92a, 92c, 92f, and 92n. The sources of the transistors 92j and 92l are connected to the power supply line VDD and the ground line VDD, respectively.

Figure 15:
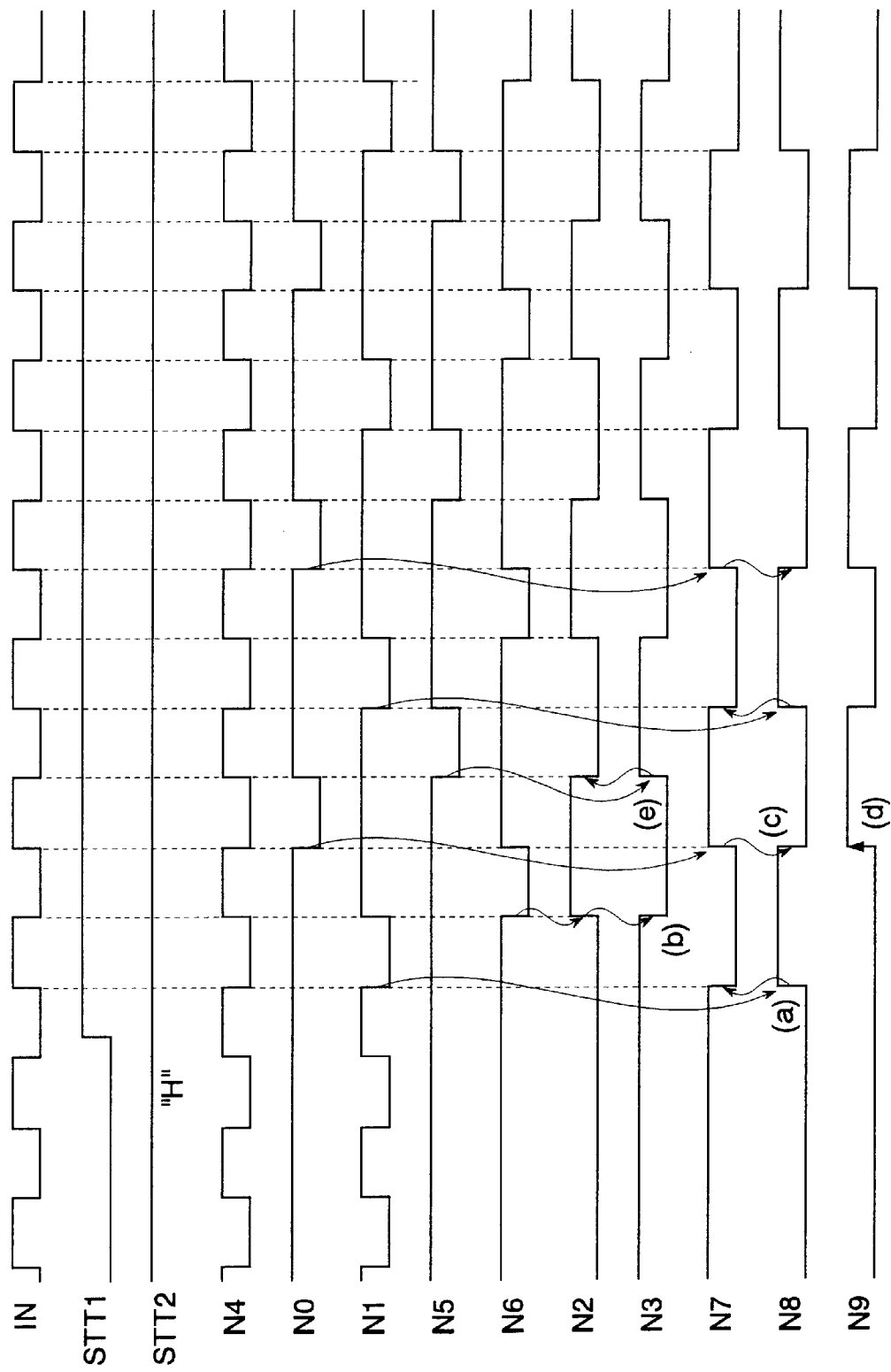
FIG. 15 is a timing chart showing the basic operations of the frequency divider in FIG. 14.
Figure 16:
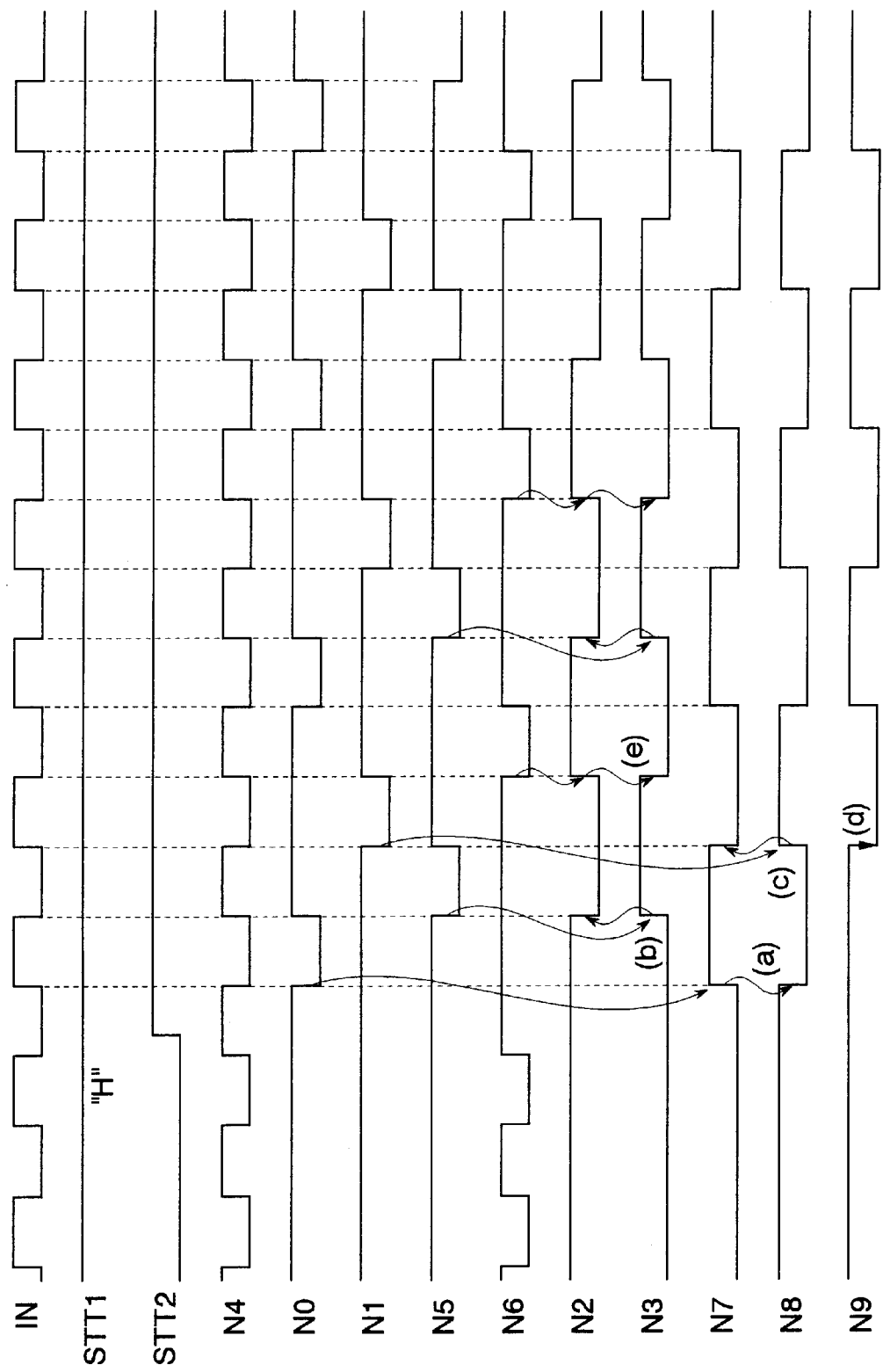
FIG. 16 is a timing chart showing the basic operations of the frequency divider in FIG. 14.

FIGS. 15 and 16 show the basic operations of the divider 92.

FIG. 15 shows the operations with the control terminal STT2 fixed to high level.

In their initial states, the NAND gate 92d and the inverter 92i shown in FIG. 14 are activated so that the clock signal supplied through the input terminal IN is transmitted to the nodes N1 and N4. Supplying high level to the control terminal STT1 activates the NAND gates 92d and 92f, so that the node N1 is turned to low level in synchronization with the rise of the clock signal. The low level of the node N1 turns the node N8 to high level, thereby turning the node N7 to low level (FIG. 15(a)).

The high level of the node N8 activates the NAND gate 92h, so that the node N6 is turned to low level in synchronization with the fall of the clock signal. The low level of the node N6 turns the node N2 to high level, thereby turning the node N3 to low level (FIG. 15(b)).

The high level of the node N2 activates the NAND gate 92c, so that the node N0 is turned to low level in synchronization with the rise of the clock signal. The low level of the node N0 turns the node N7 to high level, thereby turning the node N8 to low level (FIG. 15(c)).

In addition, the low level of the node N0 switches transistor 92j on, thereby turning the node N9 to high level (FIG. 15(d)).

The high level of the node N7 activates the NAND gate 92g, so that the node N5 is turned to low level in synchronization with the fall of the clock signal. The low level of node N5 turns the node N3 to high level, thereby turning the node N2 to low level (FIG. 15(e)).

Then, the operations described above are repeated so that the clock signal having a frequency obtained by dividing that of the supplied clock signal by two is generated on the output node, that is the node N9.

FIG. 16 shows the operations with the control terminal STT1 fixed to high level.

In their initial states, the NAND gate 92h and the inverter 92i shown in FIG. 14 are activated so that the clock signal supplied through the input terminal IN is transmitted to the nodes N4 and N6. Supplying high level to the control terminal STT2 activates the NAND gate 92c, so that the node N0 is turned to low level in synchronization with the rise of the clock signal. The low level of the node N0 turns the node N7 to low level, thereby turning the node N8 to high level (FIG. 16(a)).

The high level of the node N8 activates the NAND gate 92g, so that the node N5 is turned to low level in synchronization with the fall of the clock signal. The low level of the node N5 turns the node N3 to high level, thereby turning the node N2 to low level (FIG. 16(b)). The high level of the node N3 switches the transistor 92k on.

The high level of the node N3 activates the NAND gate 92d, so that the node N1 is turned to low level in synchronization with the rise of the clock signal. The low level of the node N1 turns the node N8 to high level, thereby turning the node N7 to low level (FIG. 16(c)).

In addition, the transistor 92l is switched on in synchronization with the rise of the clock signal, whereby the node N9 is turned to low level (FIG. 16(d)).

The high level of the node N8 activates the NAND gate 92h so that the node N6 is turned to low level. The low level of the node N6 turns the node n2 to high level, thereby turning the node N3 to low level (FIG. 16(e)).

Then, the operations described above are repeated so that the clock signal having a frequency obtained by dividing that of the supplied clock signal by two is generated on the output node, that is, the node N9.

As described above, the control signal STT1 is controlled to generate a frequency-divided signal starting with a rise, and the control signal STT2 is controlled to generate a frequency-divided signal starting with a fall.

Figure 17:
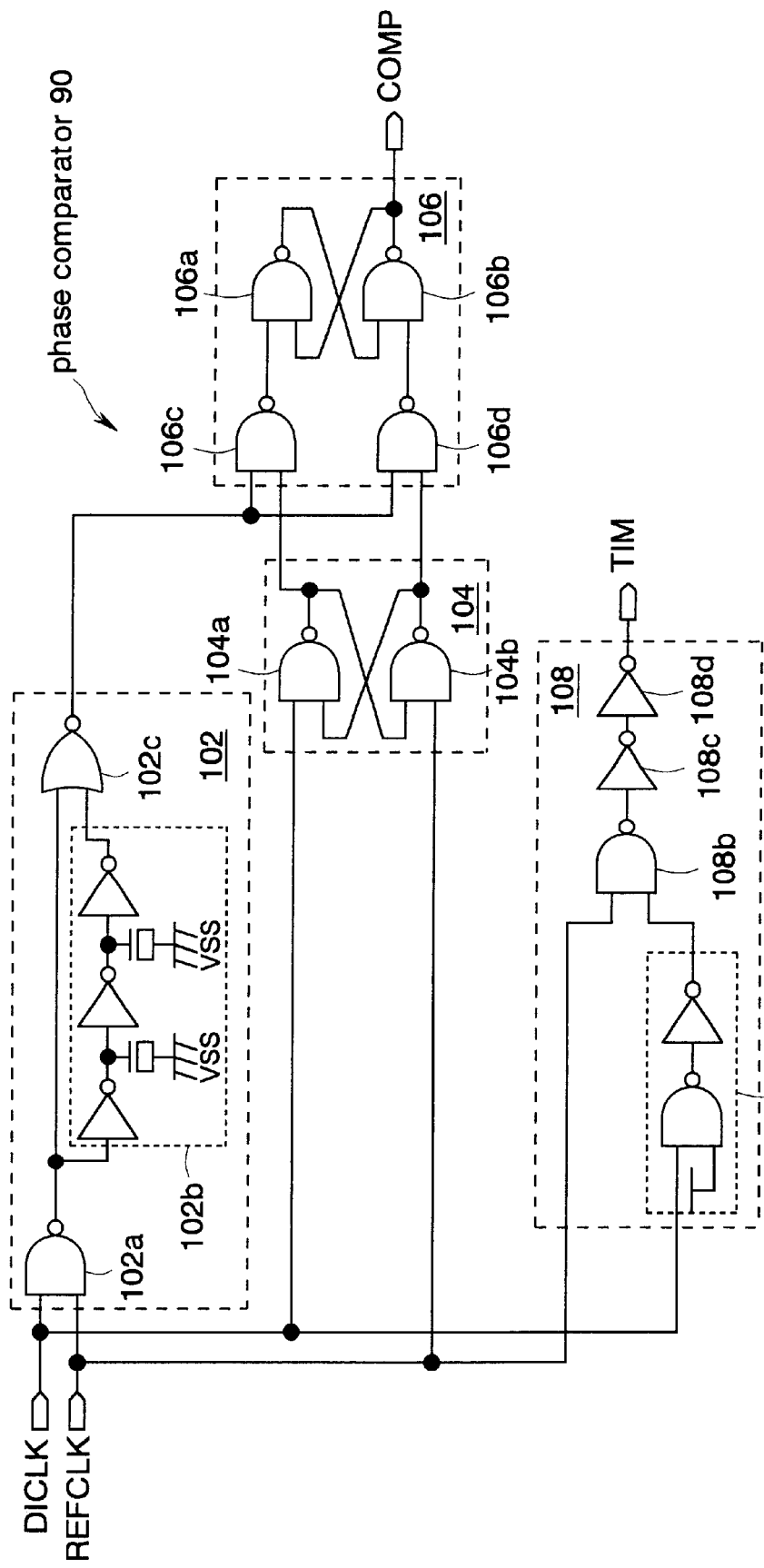
FIG. 17 is a circuit diagram showing the phase comparator in FIG. 12.

FIG. 17 shows the details of the phase comparator 90.

The phase comparator 90 comprises a pulse generator 102, flip-flops 104 and 106, and a timing generator 108.

The pulse generator 102 comprises: a two-input NAND gate 102 for receiving the internal clock signal DICLK and the reference clock signal REFCLK; a delay circuit 102b connected to the output of the NAND gate 102a; and a two-input NOR gate 102c for receiving the outputs of the NAND gate 102a and the delay circuit 102b. The delay circuit 102b comprises three inverters, and MOS capacitors connected therebetween. The pulse generator 102 is a circuit for generating a high pulse when both the internal clock signal DICLK and the reference clock signal REFCLK are turned to high level.

The flip-flop 104 comprises two-input NAND gates 104 and 104b having their outputs fed back to each other. Inputs of the NAND gates 104a and 104b are supplied with the internal clock signal DICLK and the reference clock signal REFCLK. The flip-flop 104 is a circuit for setting the output of the one rising earlier between the clock signals DICLK and REFCLK to low level.

The flip-flop 106 comprises: two-input NAND gates 106a and 106b having their outputs fed back to each other; and two-input NAND gates 106c and 106d connected to inputs of the NAND gates 106a and 106b. One inputs of the NAND gates 106c and 106d are connected to the output of the pulse generator 102. The other inputs of the NAND gates 106c and 106d are connected with the outputs of the NAND gates 104a and 104b, respectively. Through the output of the NAND gate 106b is output the comparison result signal COMP. The flip-flop 106 is a circuit for turning the comparison result signal COMP to high level when the internal clock signal DICLK leads the reference clock signal REFCLK in phase, and turning the comparison result signal COMP to low level when the internal clock signal DICLK lags behind the reference clock signal REFCLK in phase.

The timing generator 108 comprises: a delay circuit 108a consisting of a NAND gate and an inverter; a two-input NAND gate 108b for receiving the reference clock signal REFCLK and the delay circuit 108a; and inverters 108c and 108d connected in series with the output of the NAND gate 108b. Through the output of the inverter 108d is output the timing signal TIM. The timing generator 108 is a circuit for generating the timing signal TIM whose rise delays by the delay time of the delay circuit 108 from the rise of the reference clock signal REFCLK.

Figure 18:
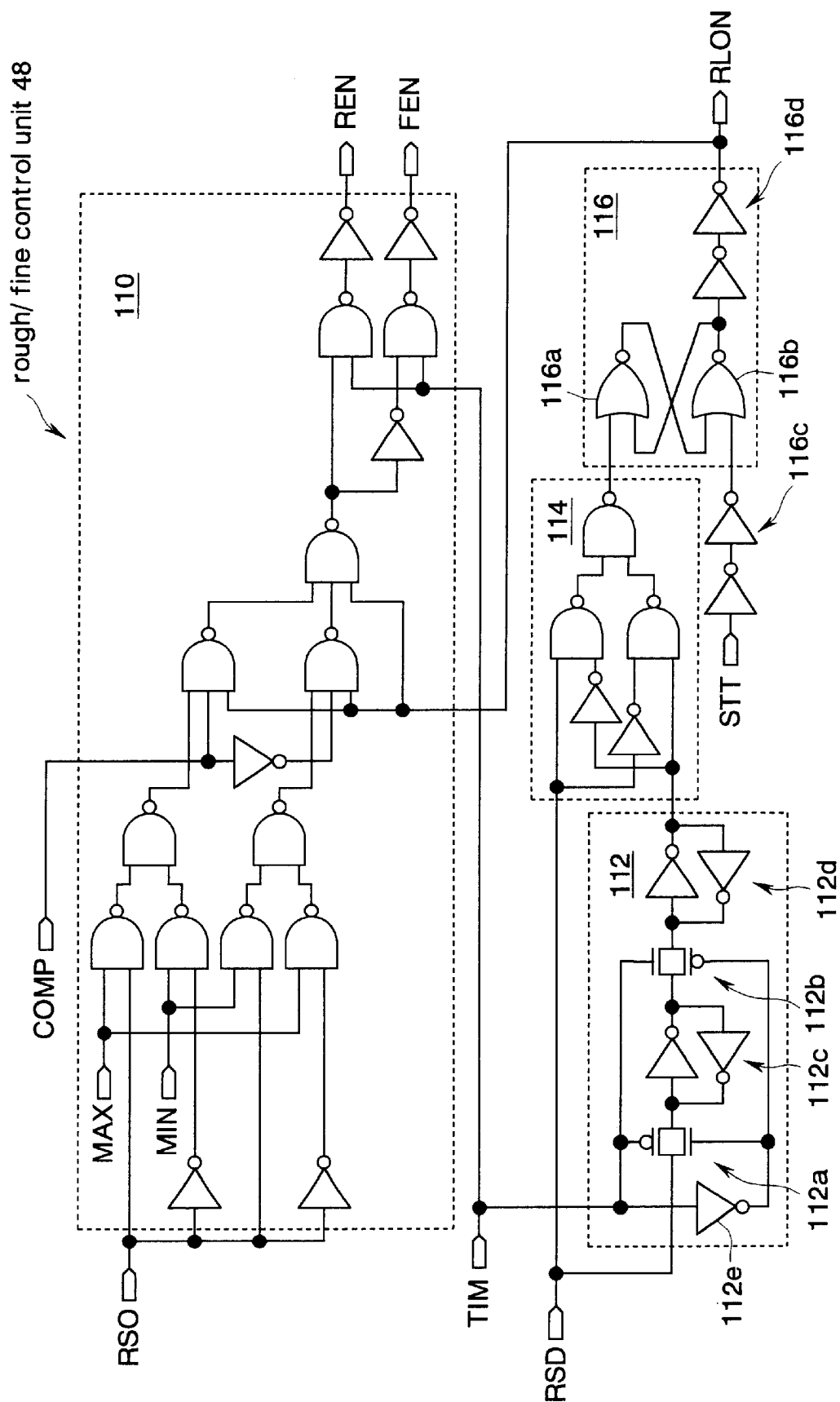
FIG. 18 is a circuit diagram showing the rough/fine control unit in FIG. 6.

FIG. 18 shows the details of the rough/fine control unit 48.

The rough/fine control unit 48 comprises: a combinational circuit 110 composed of NAND gates and inverters, for activating the rough enable signal REN or the fine enable signal FEN; a shift direction keeping circuit 112 for keeping the information of the rough shift direction signal RSD; an EOR circuit 114; and a lock on generator 116 for outputting the rough lock on signal RLON.

The combinational circuit 110 is a circuit for activating the rough enable signal REN or the fine enable signal REN in accordance with the controlling state diagram showing in FIG. 19. For example, the combinational circuit 110 activates the fine enable signal FEN in synchronization with the timing signal TIM when the rough lock on signal RLON is at low level. The combinational circuit 110 activates the rough enable signal REN in synchronization with the timing signal TIM when both of the rough lock on signal RLON, the rough shift order signal RSO, the maximum signal MAX, and the comparison result signal COMP are at high level.

The shift direction keeping circuit 112 comprises: a keeping unit consisting of CMOS transmission gates 112a, 112b and latches 112c, 112d alternately connected in series, the CMOS transmission gates 112a and 112b each having a pMOS and an nMOS whose sources and drains are connected to each other, the latches 112c and 112d each having two inverters whose inputs and outputs are connected to each other; and an inverter 112e for controlling the CMOS transmission gates 112a and 112b. The CMOS transmission gates 112a and 112b are controlled by the timing signal TIM. The shift direction keeping circuit 112 is a circuit for accepting the rough shift direction signal RSD in synchronization with the rise of the timing signal TIM, and keeping the same.

The EOR circuit 114 is a circuit for comparing the states of the current rough shift direction signal RSD and the rough shift direction signal RSD output from the shift direction keeping circuit 112 one clock before.

The lock on generator 116 comprises: a flip-flop consisting of two two-input NOR gates 116a and 116b having their outputs fed back to each other; an inverter row 116c connected to an input of the NOR gate 116b; and an inverter row 116d connected to the output of the NOR gate 116b. An input of the NOR gate 116a is connected to the output of the EOR circuit 114. The input of the inverter row 116c is supplied with the start signal STT through two inverters. Through the output of the inverter row 116d is output the rough lock on signal RLON.

Figure 20:
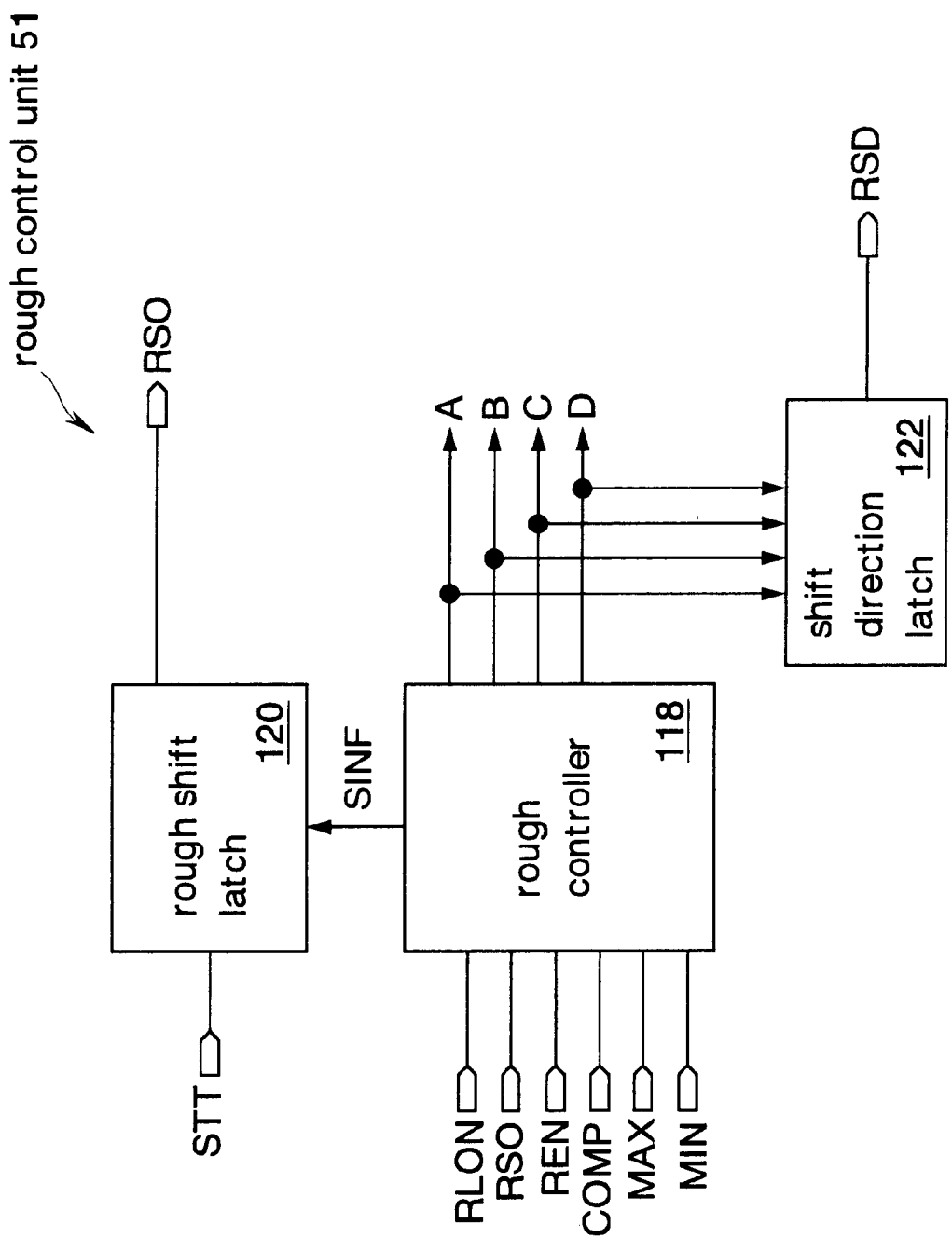
FIG. 20 is a block diagram showing the rough control circuit in FIG. 6.

FIG. 20 shows the details of the rough control unit 51.

The rough control unit 51 comprises a rough controller 118, a rough shift latch 120, and a shift direction latch 122.

The rough controller 118 receives the rough lock on signal RLON, the rough shift order signal RSO, the rough enable signal REN, the comparison result signal COMP, the maximum signal MAX, and the minimum signal MIN, and outputs a shift information signal SINF for generating a high pulse on the shift operation of the shift register 63, and the control signals A, B, C, and D for shifting the shift register 63.

The rough shift latch 120 receives the start signal STT and the shift information signal SINF, and outputs the rough shift order signal RSO.

The shift direction latch 122 receives the start signal STT and the control signals A, B, C, and D, and outputs the rough shift direction signal RSD.

Figure 21:
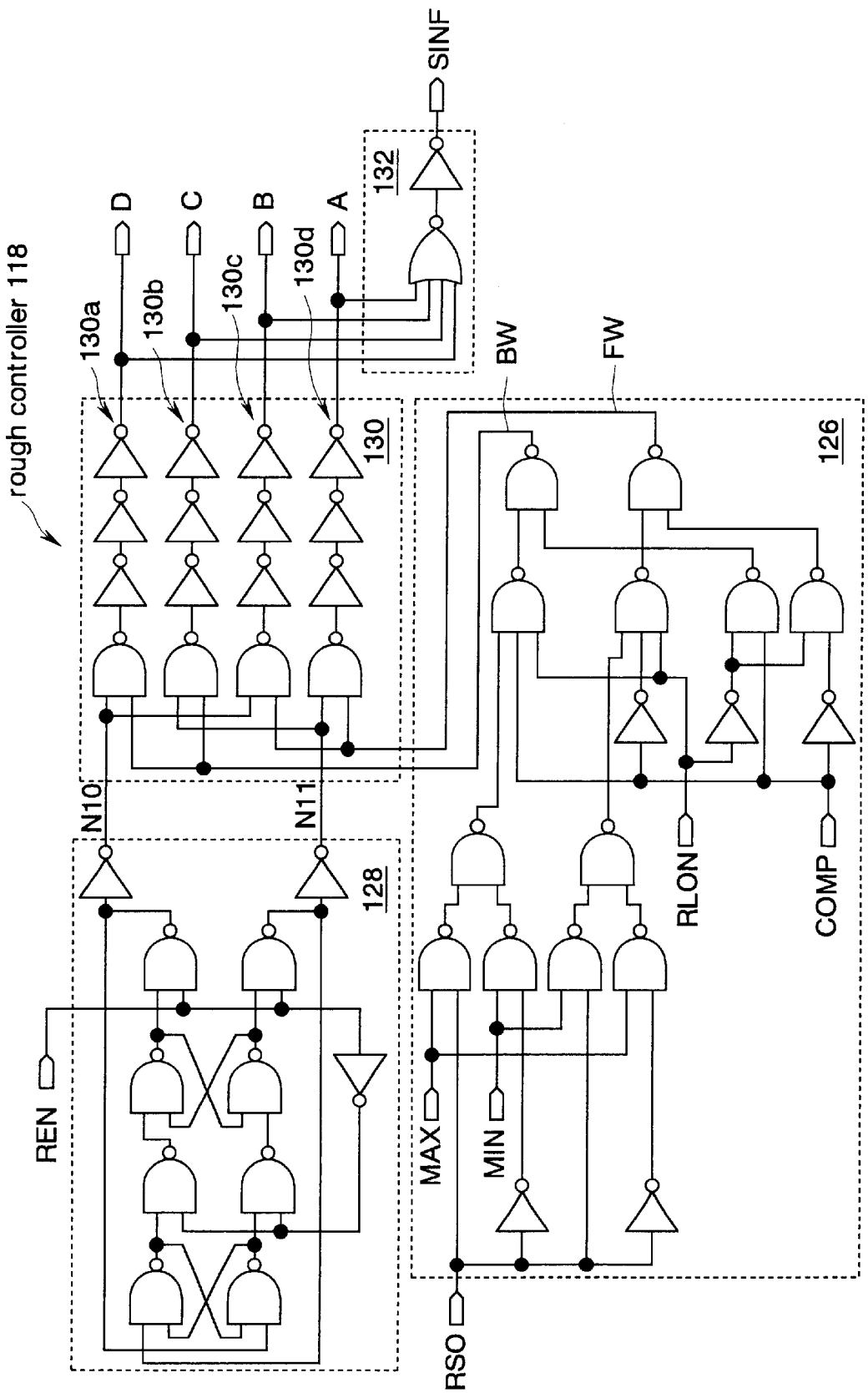
FIG. 21 is a circuit diagram showing the rough controller in FIG. 20.

FIG. 21 shows the details of the rough controller 118.

The rough controller 118 comprises: a combinational circuit 126 consisting of NAND gates and inverters; a divider 128; a control circuit 130 for generating the control signals A, B, C, and D; and a four-input OR circuit 132 for generating the shift information signal SINF in response to the high level of any of the control signals A, B, C, and D.

The combinational circuit 126 is a circuit for activating a forward signal FW or a backward signal BW in accordance with the controlling state diagram shown in FIG. 22. For example, the combinational circuit 126 activates the forward signal FW when both the rough lock on signal RLON and the comparison result signal COMP are at high level. The combinational circuit 126 activates the backward signal BW when each of the rough lock on signal RLON, the rough shift order signal RSO, the maximum signal MAX, and the comparison result signal COMP is at high level. The combinational circuit 126 inactivates both the forward signal FW and the backward signal BW when the rough lock on signal RLON and the rough shift order signal RSO are at high level and the maximum signal MAX and the minimum signal MIN are at low level.

The divider 128 is constituted by cascading two stages of flip-flops each consisting of eight two-input NAND gates in combination. The divider 128 is a circuit for dividing the frequency of the rough enable signal REN by two to output a pulsed signal having the same high periods as those of the rough enable signal REN, to the node N10 and the node N11 alternately.

The control circuit 130 has AND circuits 130a, 130b, 130c, and 130d each consisting of a two-input NAND gate and three inverters connected in cascade. The AND circuit 130a receives the pulsed signal on the node N10 and the backward signal BW, and outputs the control signal D. The AND circuit 130b receives the pulsed signal on the node N11 and the backward signal BW, and outputs the control signal C. The AND circuit 130c receives the pulsed signal on the node N10 and the forward signal FW, and outputs the control signal B. The AND circuit 130d receives the pulsed signal on the node N11 and the backward signal BW, and outputs the control signal A.

Figure 23:
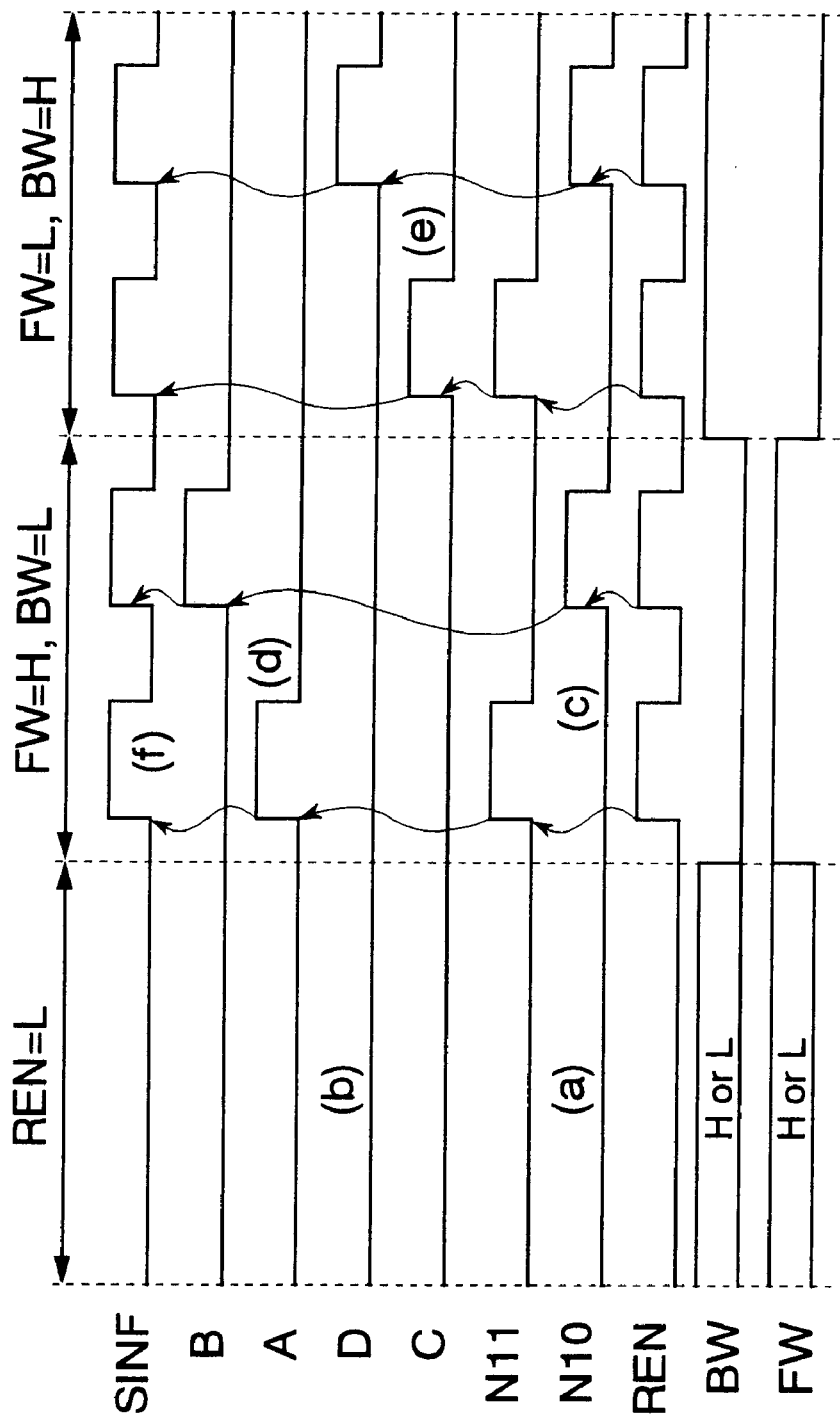
FIG. 23 is a timing chart showing an overview of the operations of the rough controller in FIG. 20.

FIG. 23 shows an overview of the operation timings for the rough controller 118.

Initially, description will be given of the case where the rough enable signal REN keeps its low level.

The divider 128 in the rough controller 118 shown in FIG. 21 receives the low level of the rough enable signal REN, and turns the nodes N10 and N11 to low level (FIG. 23(a)).

The control circuit 130 receives the low levels of the nodes N10 and N11, and turns the control signals A, B, C, and D to low level (FIG. 23(b)). That is, when the rough enable signal REN is at low level, the control signals A, B, C, and D are turned to low level irrespective of the levels of the forward signal FW and the backward signal BW.

Next, description will be given of the case where the rough enable signal REN generates clock pulses.

The divider 128 outputs the clock signal obtained by dividing the frequency of the rough enable signal REN by two, to the nodes N10 and N11 alternately (FIG. 23(c)). The control circuit 130 outputs the high-pulsed control signal A, B, C, or D depending on the levels of the clock signals on the nodes N10, N11 and the forward signal FW and the backward signal BW from the combinational circuits 126. That is, when the forward signal is at high level and the backward signal BW is at low level, the control circuit 130 turns the control signal A to high level in synchronization with the clock signal on the node N11, and turns the control signal B to high level in synchronization with the clock signal on the node N10 (FIG. 23(d)). When the forward signal FW is at low level and the backward signal BW is at high level, the control circuit 130 turns the control signal C to high level in synchronization with the clock signal on the node N11, and turns the control signal D to low level in synchronization with the clock signal on the node N10 (FIG. 23(e)).

The OR circuit 132 receives the high level of the control signal A, B, C, or D, and turns the shift information signal SINF to high level (FIG. 23(f)).

Figure 24:
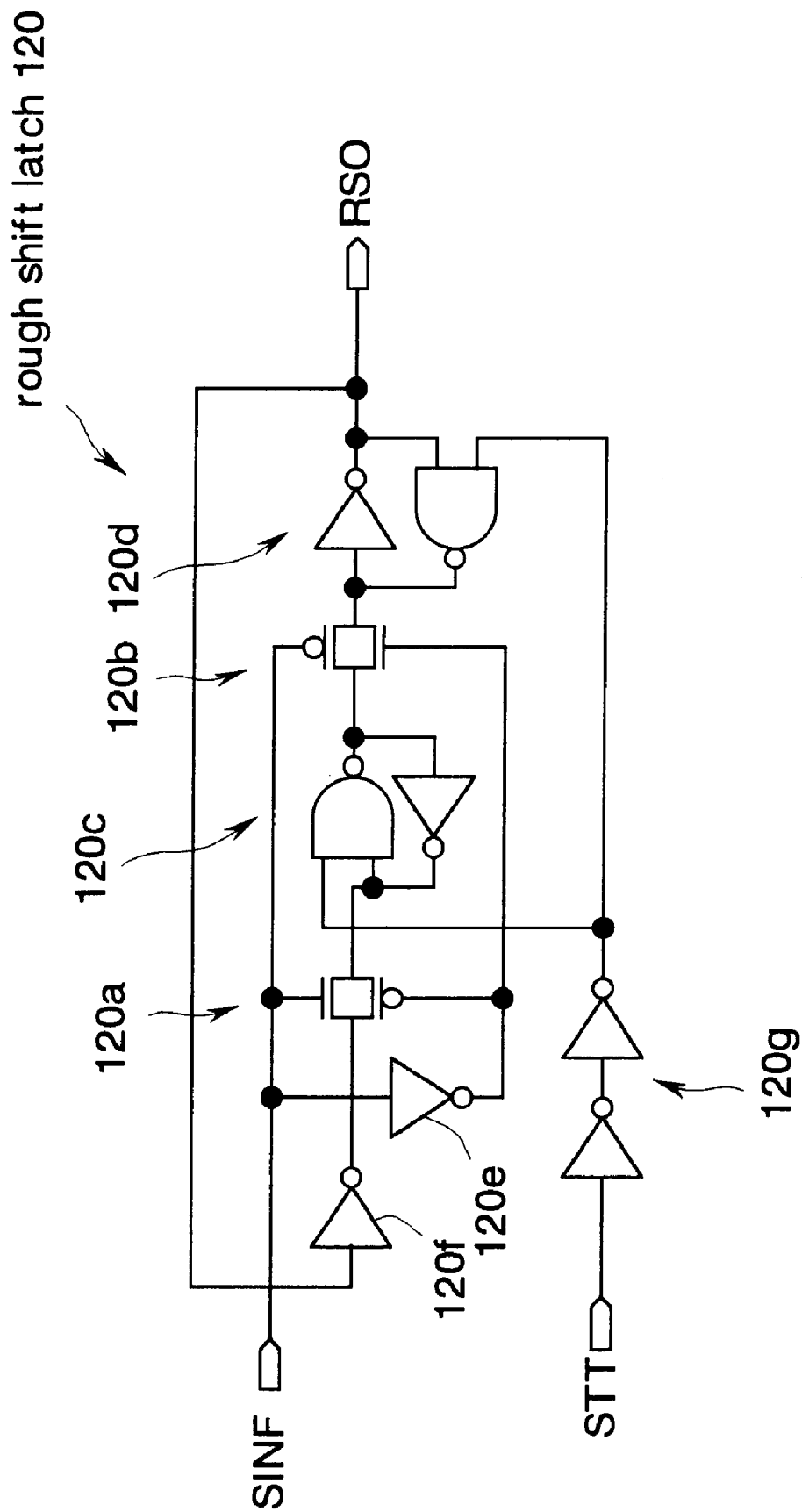
FIG. 24 is a circuit diagram showing the rough shift latch in FIG. 20.

FIG. 24 shows the details of the rough shift latch 120.

The rough shift latch 120 comprises: a keeping unit consisting of CMOS transmission gates 120a, 120b and latches 120c, 120d alternately connected in series, the CMOS transmission gates 120a and 102b each having a pMOS and an nMOS whose sources and drains are connected to each other, the latches 120c and 120d each having an inverter and a two-input NAND gate whose inputs and outputs are connected to each other; an inverter 120e for controlling the CMOS transmission gates 120a and 120b; an inverter 120f for feeding the output of the keeping unit back into an input of the same; and an inverter row 120g for controlling the two-input NAND gates. Through the output of the keeping unit is output the rough shift order signal RSO. The CMOS transmission gates 120a and 120b are controlled by the shift information signal SINF. The input of the inverter row 120g is supplied with the start signal STT. The rough shift latch 120 is a circuit for turning the rough shift order signal RSO to high level and low level alternately in synchronization with the rises of the shift information signal SINF.

Figure 25:
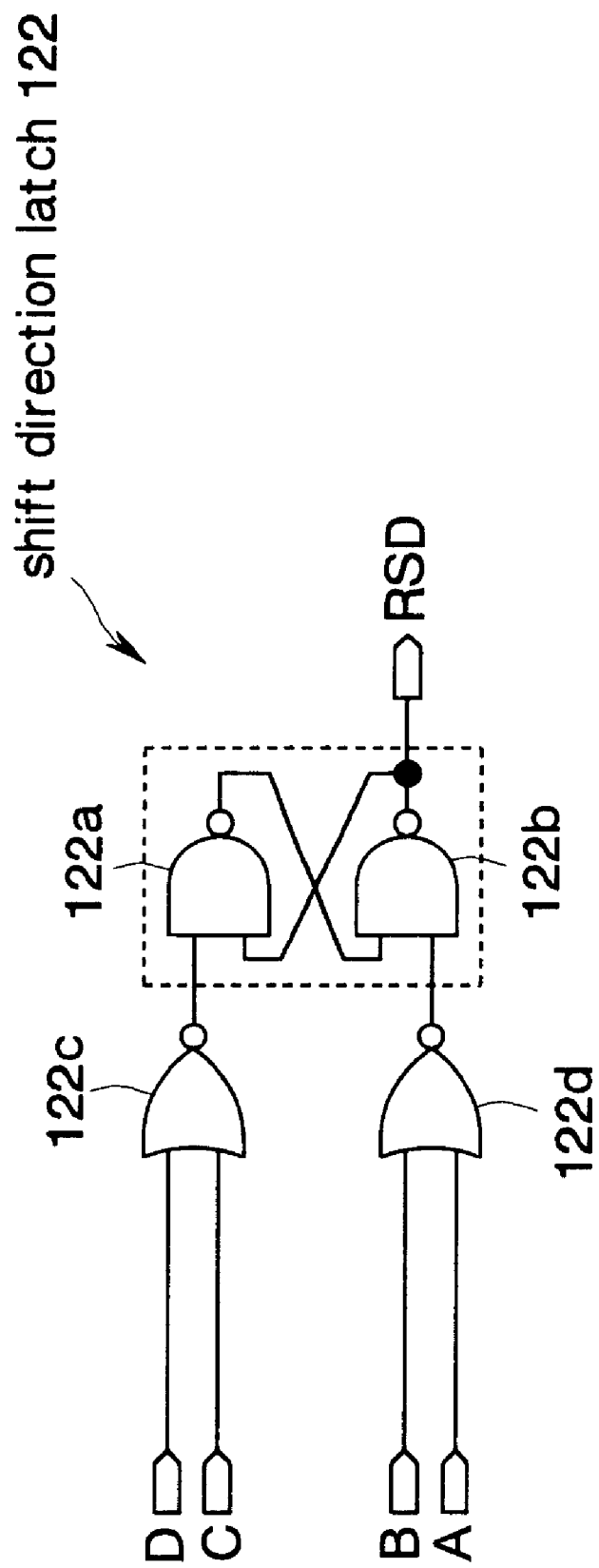
FIG. 25 is a circuit diagram showing the shift direction latch in FIG. 20.

FIG. 25 shows the details of the shift direction latch 122.

The shift direction latch 122 comprises: a flip-flop consisting of two-input NAND gates 122a and 122b having their outputs fed back to each other; and two-input NOR gates 122c and 122d connected to the inputs of the flip-flop. The inputs of the NOR gate 122c are supplied with the control signals C and D. The inputs of the NOR gate 122d are supplied with the control signals A and B. Through the output of the NOR gate 122b is output the rough shift direction signal RSD. The shift direction latch 122 is a circuit for turning the rough shift direction signal RSD to low level when the control signals C and D are turned to high level, and turning the rough shift direction signal RSD to high level when the control signals A and B are turned to high level.

Figure 26:
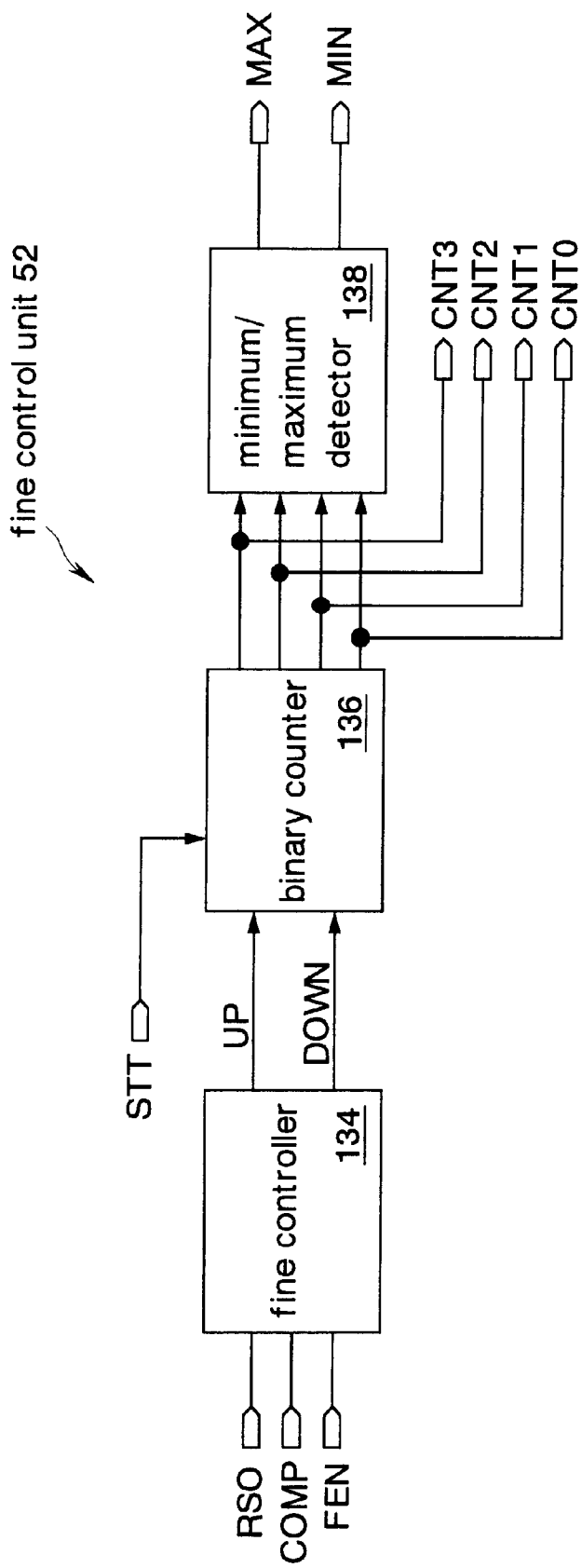
FIG. 26 is a block diagram showing the fine control unit in FIG. 6.

FIG. 26 shows the fine control unit 52.

The fine control unit 52 comprises a fine controller 134, a binary counter 136, and a minimum/maximum detector 138.

The fine controller 134 receives the rough shift order signal RSO, the comparison result signal COMP, and the fine enable signal REN, and outputs a count-up signal UP and a countdown signal DOWN.

The binary counter 136 increments its built-in counter on receiving the count-up signal UP, and decrements the built-in counter on receiving the countdown signal DOWN. The binary counter 136, constituted as a 4-bit counter, outputs the values of the respective bits as the counter signals CNT3-CNT0. Here, the counter signal CNT3 corresponds to the most significant bit.

The minimum/maximum detector 138 is a circuit for outputting the maximum signal MAX when the counter value reaches the maximum (all of the bits are at high level), and outputting the minimum signal MIN when the counter value becomes the minimum (zero).

Figure 27:
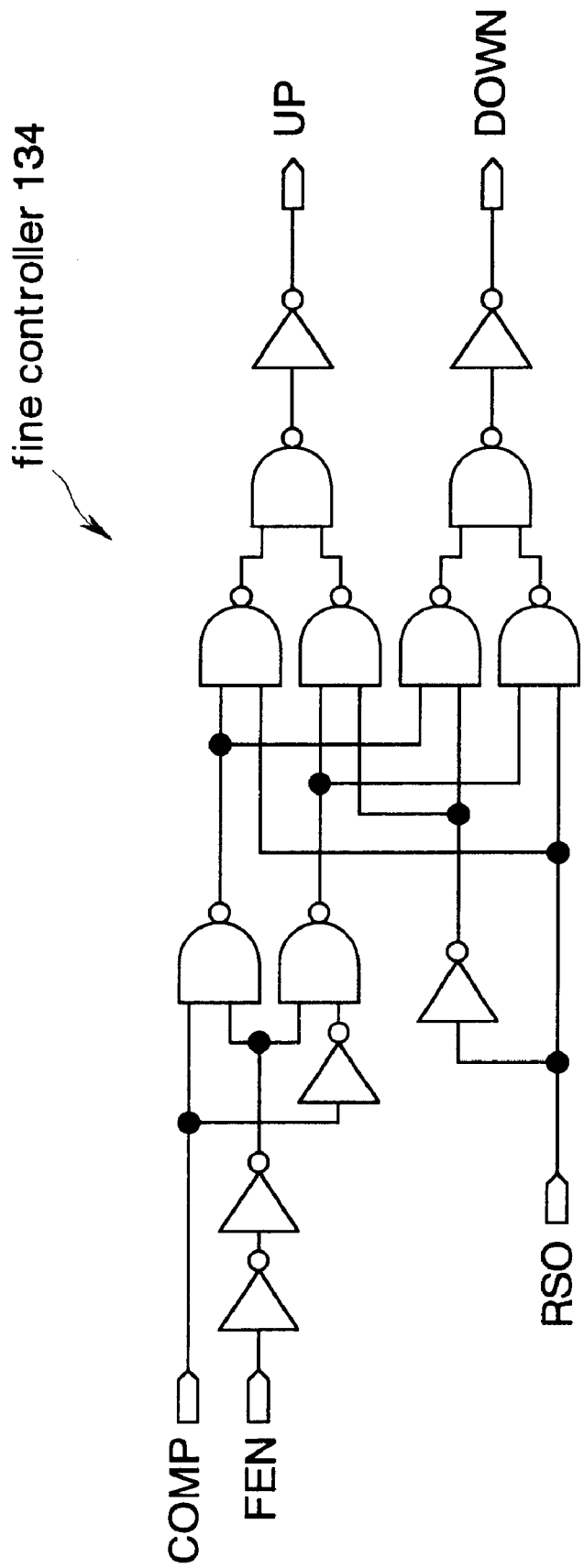
FIG. 27 is a circuit diagram showing the fine controller in FIG. 26.

FIG. 27 shows the details of the fine controller 134.

The fine controller 134 has a combinational circuit consisting of NAND gates and inverters. The fine controller 134 is a circuit for outputting the count-up signal UP and the countdown signal DOWN in accordance with the controlling state diagram shown in FIG. 28. For example, the count-up signal UP and the countdown signal DOWN inactivate when the fine enable signal FEN is at low level. The count-up signal UP is activated in the case where the fine enable signal FEN, the rough shift order signal RSO, and the comparison result signal COMP are at high level, and in the case where the fine enable signal FEN is at high level and the rough shift order signal RSO and the comparison result signal COMP are at low level. The countdown signal DOWN is activated in the case where the fine enable signal FEN and the rough shift order signal RSO are at high level and the comparison result signal COMP is at low level, and in the case where the fine enable signal FEN and the comparison result signal COMP are at high level and the rough shift order signal RSO is at low level.

In the semiconductor integrated circuit described above, the phase of the internal clock signal CLKI is adjusted as shown below. Hereinafter, description will be made on the clock signals of positive logic (CLK-K, CLK1, and the like); therefore, the clock signals of negative logic (/CLK-K, /CLK1, and the like) will be omitted from the following description. The timings for the negative-logic clock signals are the same as those for the positive-logic clock signals, excepting 180° shifts in phase.

Figure 29:
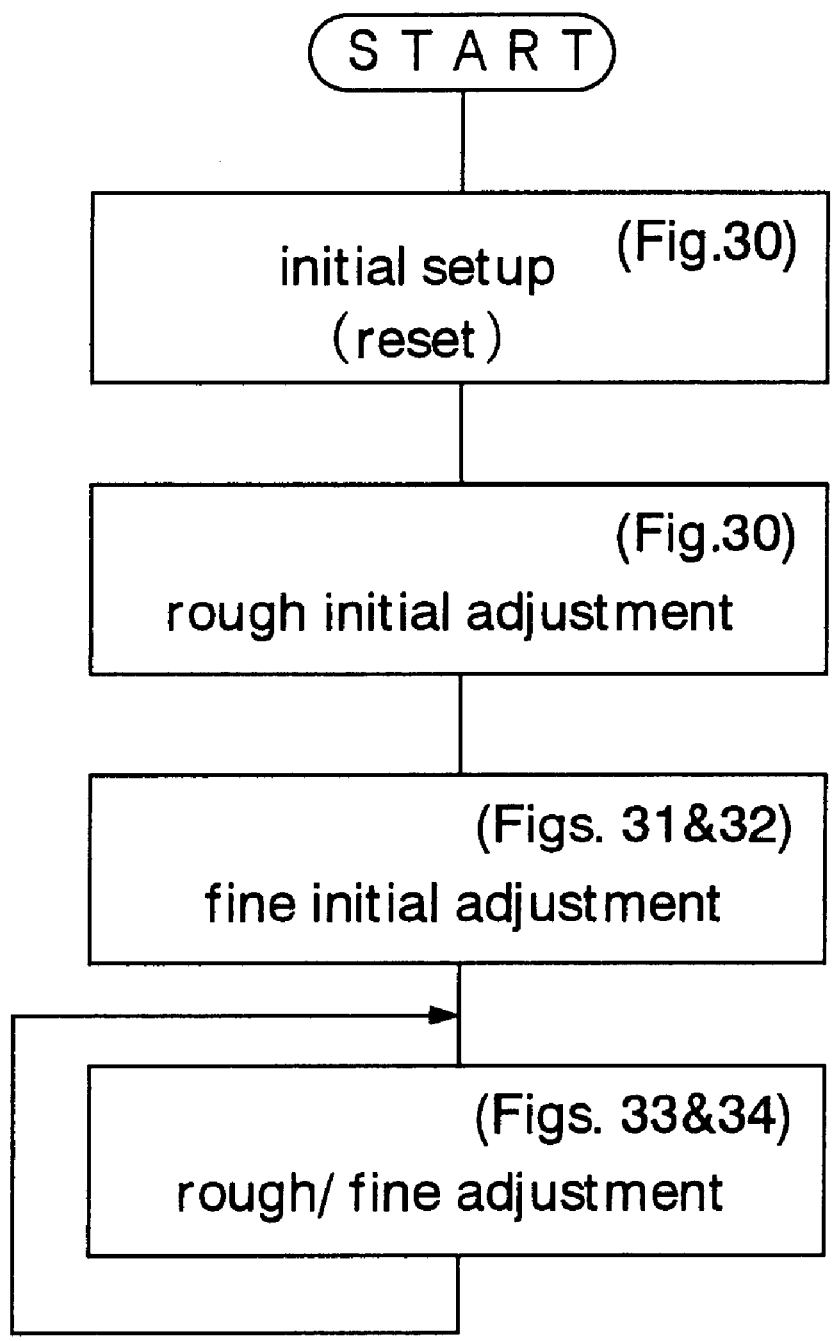
FIG. 29 is a flowchart showing the control for the phase adjustment in the first embodiment.

FIG. 29 is a flowchart showing the control for the phase adjustment to be performed by the circuits described above. The phase adjustment is started with the release of the reset signal /RESET. The initial setup (FIG. 30) is followed by the rough initial adjustment (FIG. 30), a fine initial adjustment (FIGS. 31 and 32), and a rough/fine adjustment (FIGS. 33 and 34) in sequence. The rough initial adjustment and fine initial adjustment correspond to the rough adjustment, and the rough/fine adjustment corresponds to the fine adjustment.

Figure 30:
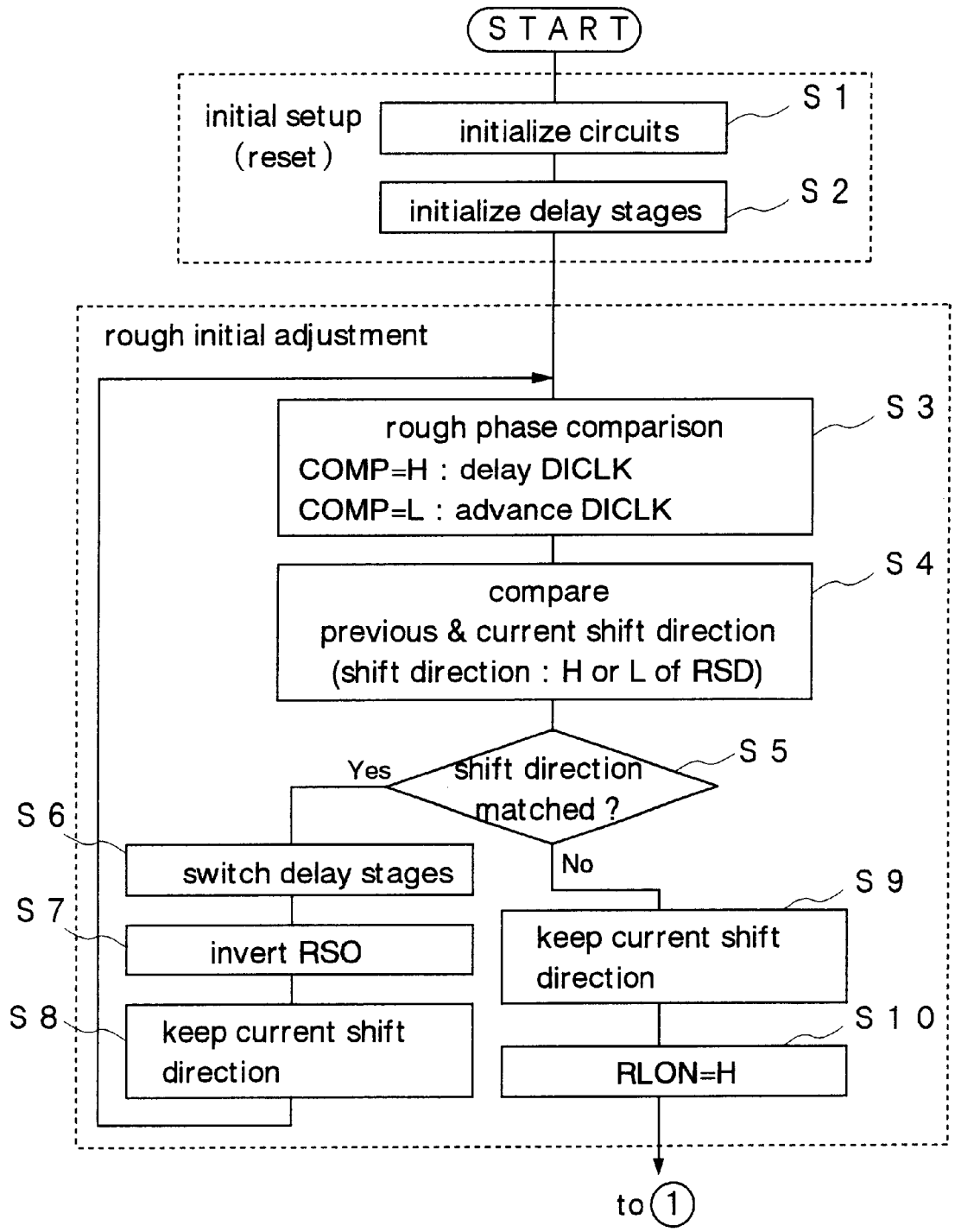
FIG. 30 is a flowchart showing the control for the initial setup and the rough initial adjustment of the phase adjustment in the first embodiment.

(a) Initial Setup (FIG. 30)

For a start, at step S1, the shift register 63 in the delayed clock generator 37, the rough/fine control unit 48, the rough shift latch 120 in the rough control unit 51, the binary counter 136 in the fine control unit 52, and the first and second dividers 82 and 84 in the phase comparison unit 46 shown in FIGS. 6 and 7, supplied with the start signal STT, are initialized.

Figure 35:
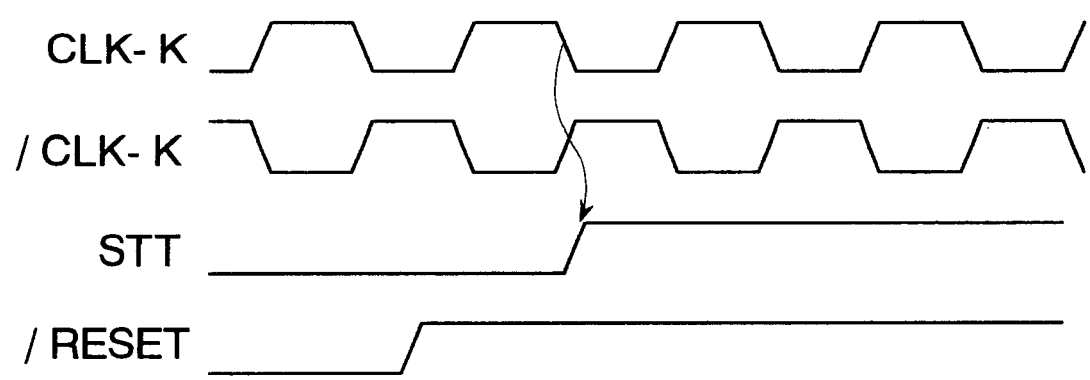
FIG. 35 is a timing chart showing the operation of the start signal generator in FIG. 6.

FIG. 35 shows the operation of the start signal generator 32.

After receiving the inactivation of the reset signal /RESET, the start signal generator 32 turns the start signal STT to high level in synchronization with the fall of the internal clock signal CLK-K. Accordingly, at the beginning of a phase comparison, the delayed clock generator 37, the phase comparison unit 46, and the like start their operations in synchronization with each other so that the phase comparison is always started with a predetermined state. Besides, in the first frequency divider 82 for example, the high-level period of the internal clock signal CLK-K is masked by the start signal STT, which prevents the occurrence of hazard and avoids malfunctions at the beginning of the phase comparison.

The reset signal /RESET is inactivated in response to a DLL start signal or a DLL reset release signal from the mode register implemented in the semiconductor integrated circuit, a detecting signal indicating that the power supply voltage increases up to a predetermined value, or the like.

Activated in response to the high level of the start signal STT, the shift register 63 (FIG. 10) becomes capable of receiving the control signals A, B, C, and D. The binary counter 136 (FIG. 26) in the fine control unit 52 receives the high level of the start signal STT, and sets the counter to the central value C (3:0)=(1,0,0,0). The D/A converter 53 receives the counter value (1,0,0,0), and sets the control voltages V1 and V2 to a value intermediate between the control voltage VMAX and the control voltage VMIN. That is, the control voltages V1 and V2 are set at the same voltage.

The rough/fine control unit 48 (FIG. 18) is initialized to set the rough lock on signal RLON to low level. The rough shift latch 120 is initialized to set the rough shift order signal RSO to low level.

The first and second dividers 82 and 84 (FIG. 13) receive the high level of the start signal STT, and activate the respective dividers 92.

Figure 36:
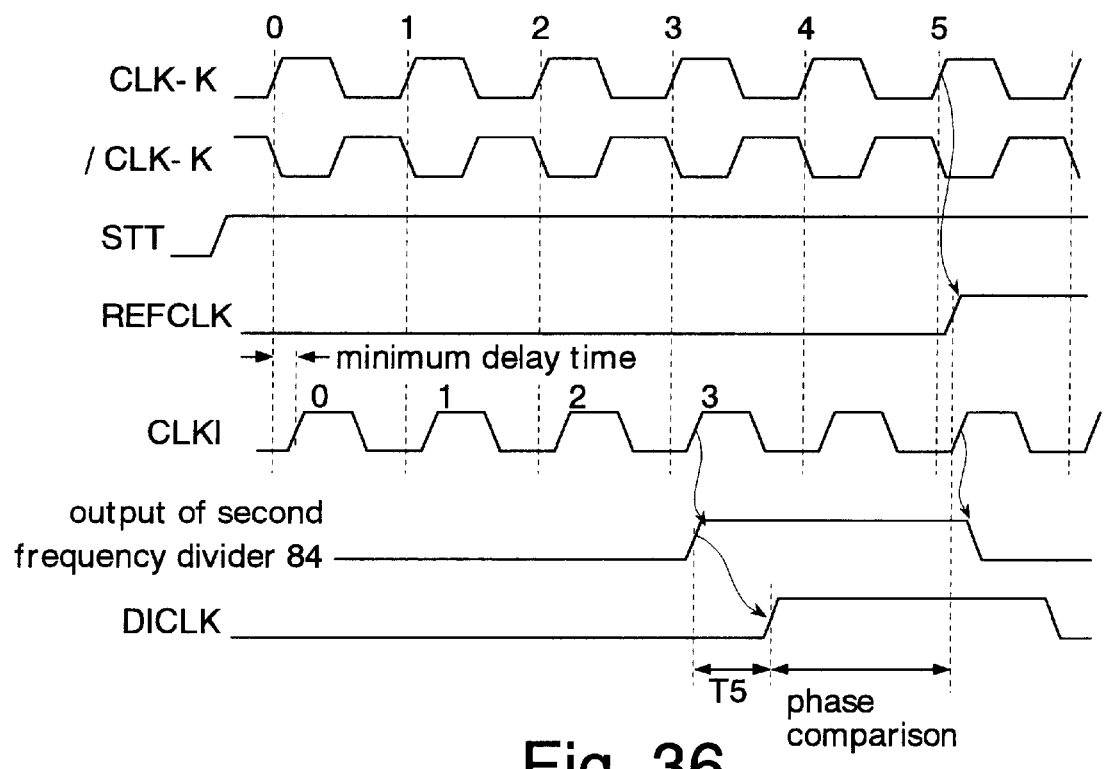
FIG. 36 is a timing chart showing the states of the respective clock signals in the phase comparison unit in FIG. 12.

FIG. 36 shows the timings for the individual clock signals in the phase comparison unit 46.

The first frequency divider 82 starts outputting the reference clock signal REFCLK in five clocks after receiving the internal clock signal CLK-K. The second frequency divider 84 starts outputting the frequency-divided signal in three clocks after receiving the internal clock signal CLKI. FIG. 36 shows the case where the delayed clock generator 37 is set at the minimum delay time. The signal output from the second frequency divider 84 is supplied to the dummy output buffer 86 and the dummy input buffer 88, whereby the internal clock signal DICLK delaying from the delay time T5 is generated.

The operations of the first and second frequency dividers 82 and 84 is performed in synchronization with the start signal STT so that the phase adjustment is always started with a predetermined phase difference.

Next, at step S2, the initial setup of the delayed clock generator 37 is performed.

For a start, the rough control unit 51 shown in FIG. 6 operates so that the shift register 63 shown in FIG. 10 sets the levels of the switch signals (X1, Y1, Z1), (X2, Y2, Z2), (X3, Y3, Z3), (X4, Y4, Z4), (X5, Y5, Z5), . . . to (L, L, H), (L, L, H), (L, H, L), (H, L, L), (H, L, L) . . . , respectively. Here, the enable signals E2, E3, and E4 are turned to high level, and the enable signals E5, E6, . . . are turned to low level. As a result, the interpolators 39-1, 39-2, 39-3, and 39-4 are activated. Since those unused interpolators 39-5, 39-6, . . . , 39-n are inactive, the power consumption is reduced.

Incidentally, the initial setup of the delayed clock generator 37 may be performed forcefully by using a not-shown initial circuit.

Figure 37:
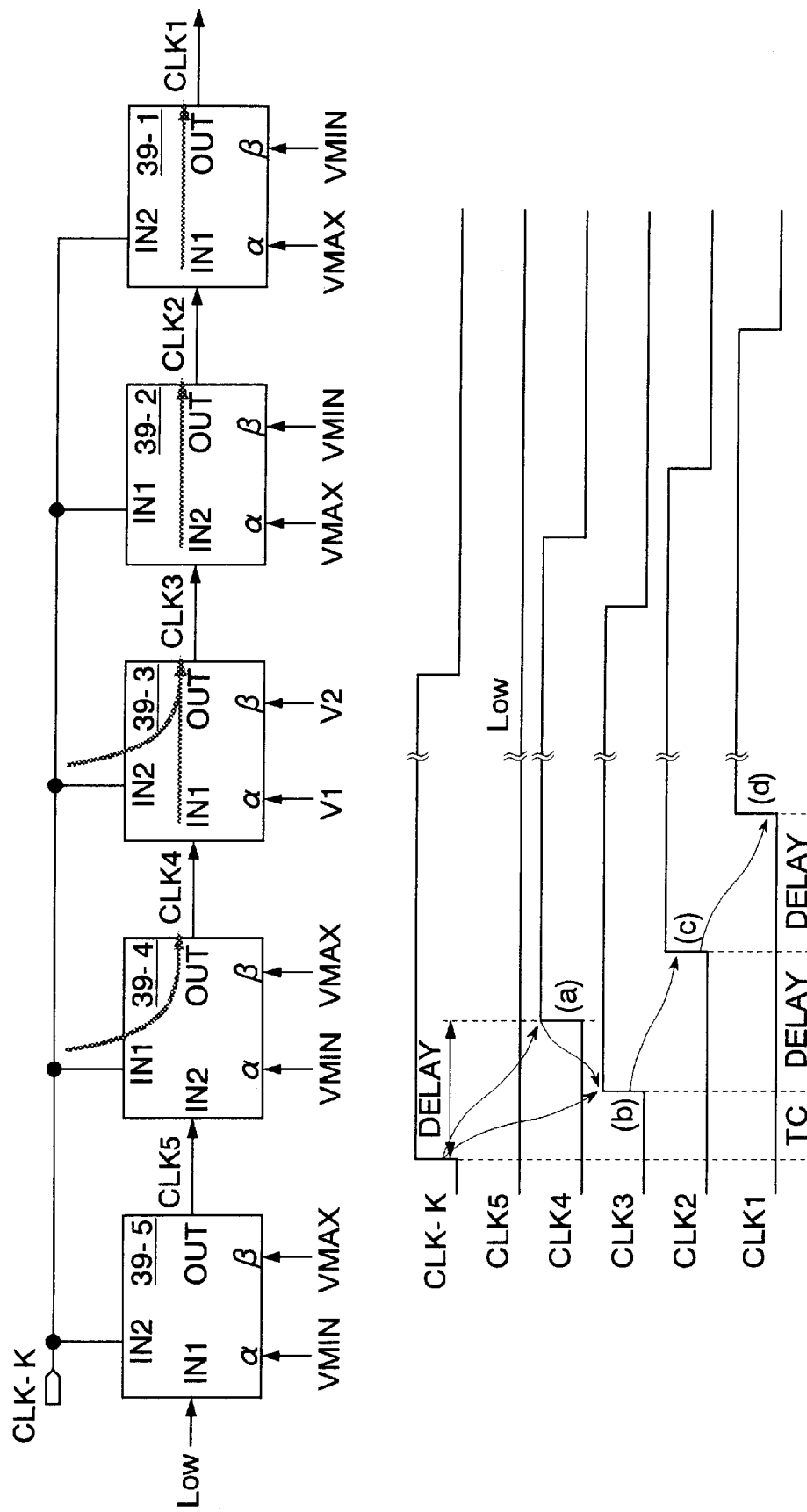
FIG. 37 is an explanatory diagram showing the states of the interpolators after the initial setup in the first embodiment.

FIG. 37 shows the states of the individual interpolators 39 after the initial setup.

The interpolators 39-5, 39-6 . . . , 39-n stop operating as described above. The switch part 61-4 (FIGS. 7 and 9) corresponding to the interpolator 39-4 receives the high level of the switching signal X4, and outputs the control voltages VMIN and the control voltage VMAX through the control terminals α and β. The interpolator 39-4 is supplied with the control voltage VMIN and the control voltage VMAX at the control terminals α and β, and outputs an internal clock signal CLK4 (FIG. 37(a)). Here, the internal clock signal CLK4 lags in phase behind the internal clock signal CLK-K by the propagation delay time DELAY of the interpolator 39-4. Since the interpolator 39-5 is inactivated, the input terminal IN2 of the interpolator 39-4 is, for example, supplied with an internal clock signal CLK5 fixed to low level. Besides, since the interpolator 39-6 is also inactivated, the input terminal IN1 of the interpolator 39-5 is, for example, supplied with low level.

The switch part 61-3 (FIGS. 7 and 9) corresponding to the interpolator 39-3 receives the high level of the switch signal Y3, and outputs the control voltages V1 and V2 through the control terminals α and β. The control voltages V1 and V2 are set at the value intermediate between the control voltage VMAX and the control voltage VMIN, as described above.

The interpolator 39-3 is supplied with the control voltage V1 and V2 at its control terminals α and β, and outputs the internal clock signal CLK3 having a phase approximately intermediate between those of the internal clock signal CLK-K supplied to its input terminal IN2 and the internal clock signal CLK4 supplied to its input terminal IN1 (FIG. 37(b)).

The switch part 61-2 (FIGS. 7 and 9) corresponding to the interpolator 39-2 receives the high level of the switching signal Z2, and outputs the control voltage VMAX and the control voltage VMIN through the control terminals α and β. The interpolator 39-2 is supplied with the control voltages VMAX and the control voltages VMIN at the control terminals α and β, and outputs the internal clock signal CLK2 (FIG. 37(c)). Here, the phase of the internal clock signal CLK2 lags behind the phase of the internal clock signal CLK3 by the propagation delay time DELAY of the interpolator 39-2. That is, the interpolator 39-2 operates as a delay stage.

Likewise, the interpolator 39-1 is supplied with the control voltage VMAX and the control voltage VMIN at the control terminals α and β, and operates as a delay stage to output the internal clock signal CLK1 (FIG. 37(d)).

As a result, the delay circuit 55, after the initial setup, outputs the internal clock signal CLK-K delayed by the time TC adjusted in the interpolator 39-3 and the propagation delay times DELAY of the interpolators 39-2 and 39-1, as the internal clock signal CLK1. Note that an interpolator supplied with the control voltages V1 and V2 operates as a phase adjustment circuit and an interpolator 39 supplied with the control voltage VMAX and the control voltage VMIN operates as a delay stage. An interpolator 39 supplied with the control voltage VMIN and the control voltage VMAX transmits a clock signal to the interpolator 39 operating as the phase adjustment circuit.

(b) Rough Initial Adjustment (FIG. 30)

For a start, at step S3, the phase comparator 90 shown in FIG. 12 compares the phase of the reference clock signal REFCLK with the phase of the internal clock signal DICLK.

When the internal clock signal DICLK leads the reference clock signal REFCLK in phase, the comparison result signal COMP is set to high level. The high level of the comparison result signal COMP is followed by the performance of a control to delay the internal clock signal DICLK. When the internal clock signal DICLK lags behind the reference clock signal REFCLK in phase, the comparison result signal is set to low level. The low level of the comparison result signal COMP is followed by the performance of a control to advance the internal clock signal DICLK in phase.

At step S4, the rough/fine control unit 48 shown in FIG. 18 uses the EOR circuit 114 to compare the information kept in the shift direction keeping circuit 112 (the previous shift direction) to the current shift direction for a match.

At step S5, if the comparison result on the shift directions indicates a match (the same shift directions), then the procedure shifts to step S6. If the comparison result indicates a mismatch (the shift direction is changed), then the phase of the internal clock signal DICLK is judged as being close to that of the reference clock signal REFCLK, and the procedure shifts to step S9 to complete the rough initial adjustment. The completion of the rough initial adjustment is easily judged by a simple latch circuit (the shift direction keeping circuit 112), thereby reducing the circuit scale.

The EOR circuit 114 in the rough/fine control unit 48 outputs high level when the comparison result indicates a mismatch. Immediately after the beginning of a phase adjustment, proper comparisons cannot be made; therefore, the procedure is forced to shift to step S6.

At step S6, the rough controller 118 shown in FIG. 21 performs a control to switch delay stages. The delay stage control is made in accordance with the controlling state diagram shown in FIG. 22 and the timing chart shown in FIG. 23. In the rough initial adjustment, the rough lock on signal RLON is set at low level. Therefore, when the comparison result signal COMP is at low level, the rough controller 118 turns the forward signal FW to high level, and turns the control signals A and B to high level. When the comparison result signal COMP is at high level, the rough controller 118 turns the backward signal BW to high level, and turns the control signals C and D to high level.

Figure 38:
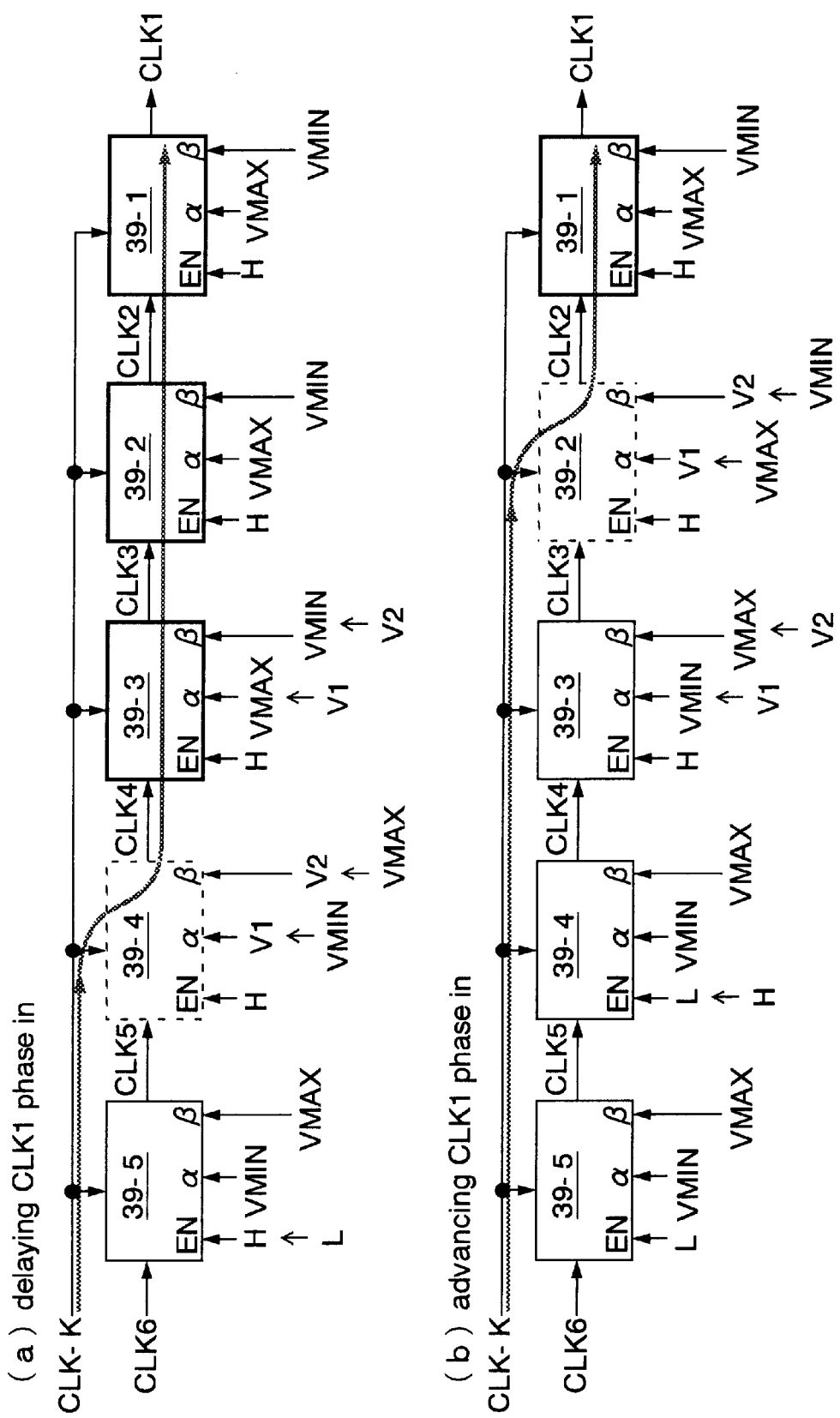
FIG. 38 is an explanatory diagram showing an overview of the switch control to the interpolators at the rough initial adjustment in the first embodiment.

FIGS. 38 shows an overview of the control to switch the interpolators 29 in the rough initial adjustment. In the diagram, those thick-framed interpolators 39 are shown operating as delay stages, and those broken-lined interpolators 39 are shown operating as the phase adjustment circuit.

When the phase comparison ends up with the comparison result signal COMP turned to low level, the control to delay the internal clock signal CLK1 in phase is performed as shown in FIG. 38(a).

Initially, the rough controller 118 shown in FIG. 21 receives the comparison result signal COMP, turns the backward signal BW to high level, and turns the control signals C and D to high level.

In response to the control signals C and D, the shift register 63 shown in FIG. 10 turns the enable signal E5 to high level, turns the switching signals Y3 and X4 to low level, and turns the switching signals Z3 and Y4 to high level. That is, the high level of the control signal D forcefully sets the output node of the NAND gate 67b in the control circuit 67-4 at high level. This high level turns the enable signal E5 to high level, turns the switching signal X4 to low level, and turns the switching signal Y4 to high level. In addition, the high level on the output node of the NAND gate 67b turns the output of the inverter 67c to low level, turns the switching signal Y3 to high level, and turns the switching signal Z3 to low level.

The interpolator 39-5 is activated by the high level of the enable signal E5. Besides, the low level of the switching signal Y3 and the high level of the switching signal Z3 cause the switch part 61-3 shown in FIG. 7 to output the control voltages VMAX and VMIN through the control terminals α and β, respectively. The low level of the switching signal X4 and the high level of the switching signal Y4 cause the switch part 61-4 to output the control voltages V1 and V2 through the control terminals α and β, respectively.

The interpolator 39-4 is supplied with the control voltages V1 and V2, and outputs the internal clock signal CLK4 having a phase intermediate between those of the internal clock signal CLK-K and the internal clock signal CLK5. The interpolator 39-3 is supplied with the control voltages VMAX and VMIN at the control terminals α and β, respectively, delays the internal clock signal CLK4 by the delay time DELAY, and outputs the resultant as the internal clock signal CLK3.

As a result, the phase of the clock signal CLK1 lags by the delay time DELAY. That is, the above-described control provides one additional stage to the delay stages consisting of interpolators 39.

On the other hand, when the comparison result signal COMP has turned to high level as a result of the phase comparison, the control to advance the internal clock signal CLK1 in phase is performed as shown in FIG. 38(b).

Initially, the rough controller 118 receives the comparison result signal COMP, turns the forward signal FW to high level, and turns the control signals A and B to high level.

In response to the control signals A and B, the shift register 63 shown in FIG. 10 turns the enable signal to low level, turns the switching signals Z2 and Y3 to low level, and turns the switching signals Y2 and X3 to high level.

The interpolator 39-4 is inactivated by the low level of the enable signal E4. Besides, the low level of the switching signal Y3 and the high level of the switching signal X3 cause the switch part 61-3 shown in FIG. 7 to output the control voltages VMIN and VMAX through the control terminals α and β, respectively. The low level of the switching signal Z2 and the high level of the switching signal Y2 cause the switch part 61-2 to output the control voltages V1 and V2 through the control signals α and β.

The interpolator 39-2 is supplied with the control voltages V1 and V2, and outputs the internal clock signal CLK2 having a phase intermediate between those of the internal clock signal CLK-K and the internal clock signal CLK3. The interpolator 39-3 is supplied with the control voltages VMIN and VMAX at the control terminals α and β, respectively, delays the internal clock signal CLK-K by the delay time DELAY, and outputs the resultant as the internal clock signal CLK3.

Consequently, the phase of the clock signal CLK 1 advances by the delay time DELAY. That is, the above-described control removes one stage from the delay stages consisting of interpolators 39.

When the shift direction is inverted due to the switch of the interpolators 39, the shift direction latch 122 shown in FIG. 25 inverts the level of the rough shift direction signal RSD.

Figure 39:
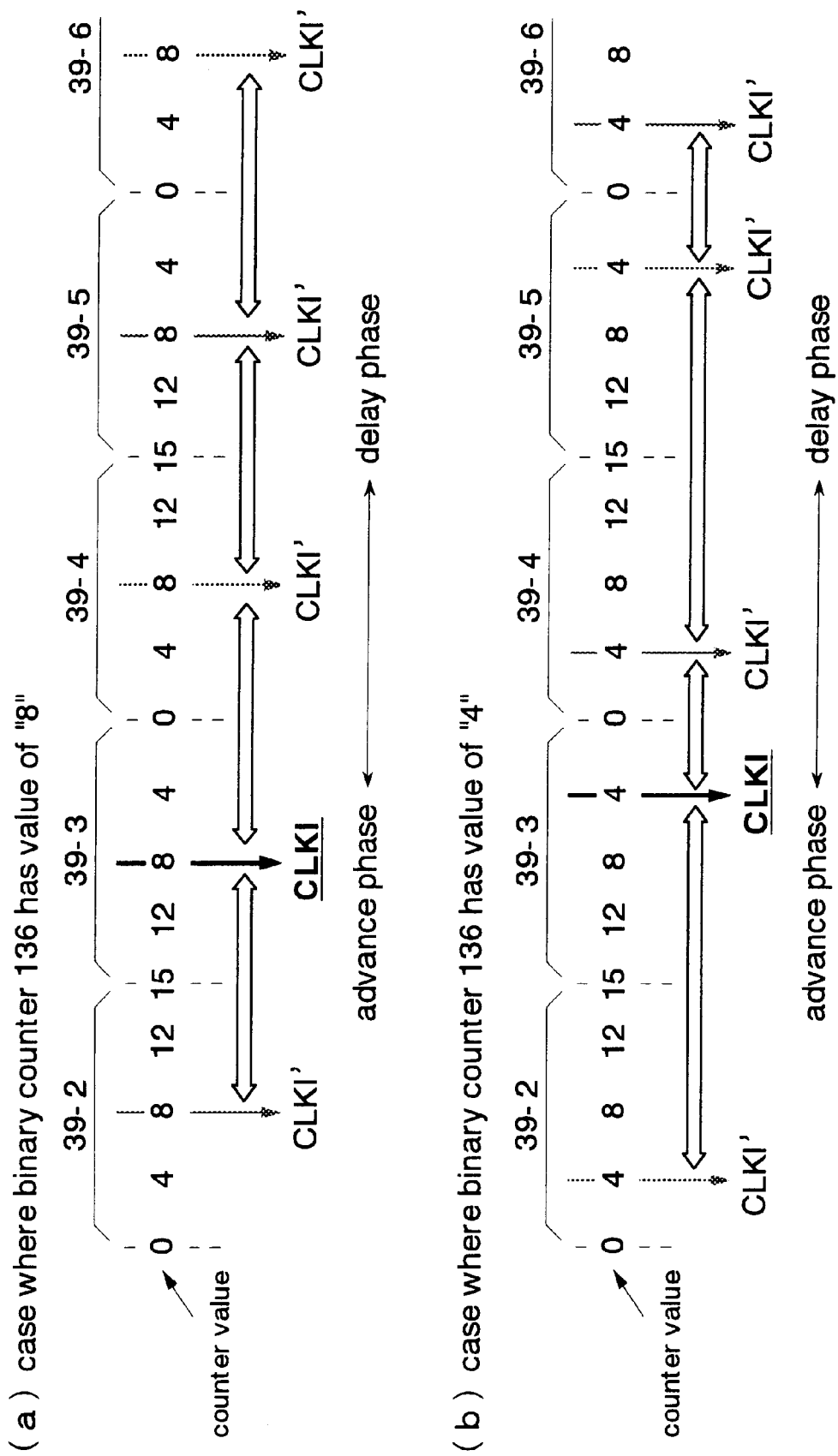
FIG. 39 is an explanatory diagram showing the internal clock signal's variations resulting from the initial values of the binary counter at the rough initial adjustment in the first embodiment.

FIGS. 39 shows the variations of the internal clock signal CLKI (CLK1) resulting from the switching of the interpolators 39. FIG. 39(a) shows the case where the binary counter 136 has the initial value of "8" at the center (employed in this embodiment), and FIG. 39(b) shows the case where the binary counter 136 has the initial value of "4." shifting from the center.

As discussed in FIG. 11, each interpolator 39 brings the phase of the output signal OUT (clock signal) closer to the phase of the input signal IN2 (clock signal) with an increasing counter value. Accordingly, in interpolators 39 at odd-numbered stages, the phase of the output signal OUT lags with the increasing counter value. In interpolators 39 at even-numbered stages, the phase of the output signal OUT advances with the increasing counter value. Therefore, when the counter value is set at the central value, the internal clock signal CLKI has the same phase variation at the times of switching the interpolators 39 as shown in FIG. 39(a).

On the other hand, in the case where the counter value is shifted from the central value, the internal clock signal CLKI no longer has the same phase variation at the times of switching the interpolators 39 as shown in FIG. 39(b). This increases the number of phase comparisons in the fine initial adjustment.

At step S7, the rough shift latch 120 shown in FIG. 24 receives the shift information signal SINF output from the rough controller 118, and inverts the rough shift order signal RSO to transmit to the individual circuits the fact that the inputting state to the interpolator 39 at the odd-numbered stage is inverted while the interpolator 39 at an even-numbered state is supplied with V1 and V2.

At step S8, the shift direction keeping circuit 112 in the rough/fine control unit 48 shown in FIG. 18 keeps the value of the current rough shift direction signal RSD. Then, control returns to step S3.

On the other hand, at step S9, the shift direction keeping circuit 112 in the rough/fine control unit 48 keeps the value of the current rough shift direction signal RSD.

Next, at step S10, the lock on generator 116 in the rough/fine control unit 48 receives the high level of the EOR circuit 114, and turns the rough lock on signal RLON to high level.

This completes the rough initial adjustment. Then, the fine initial adjustment is performed.

Figure 31:
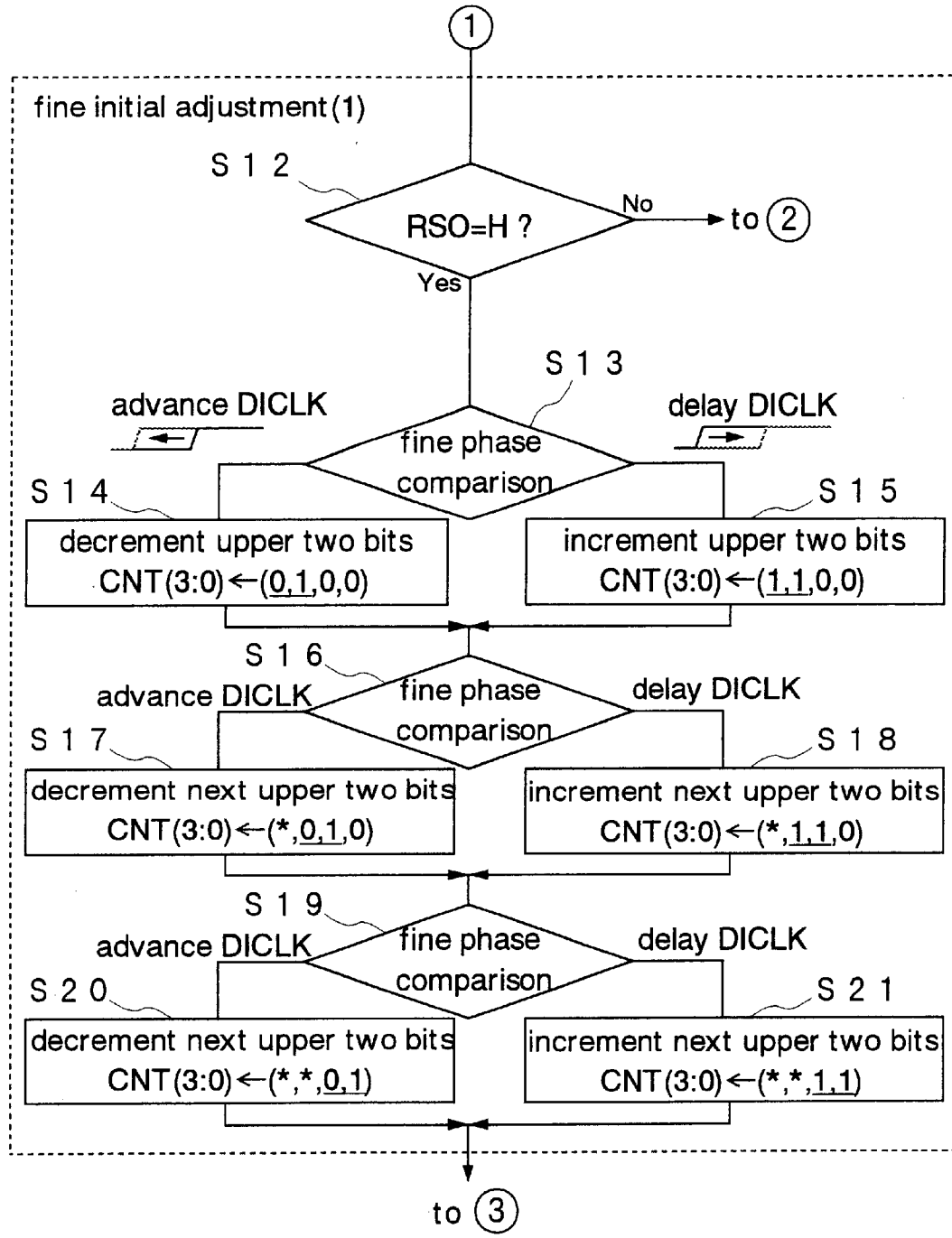
FIG. 31 is a flowchart showing the control for the fine initial adjustment in the first embodiment.
Figure 32:
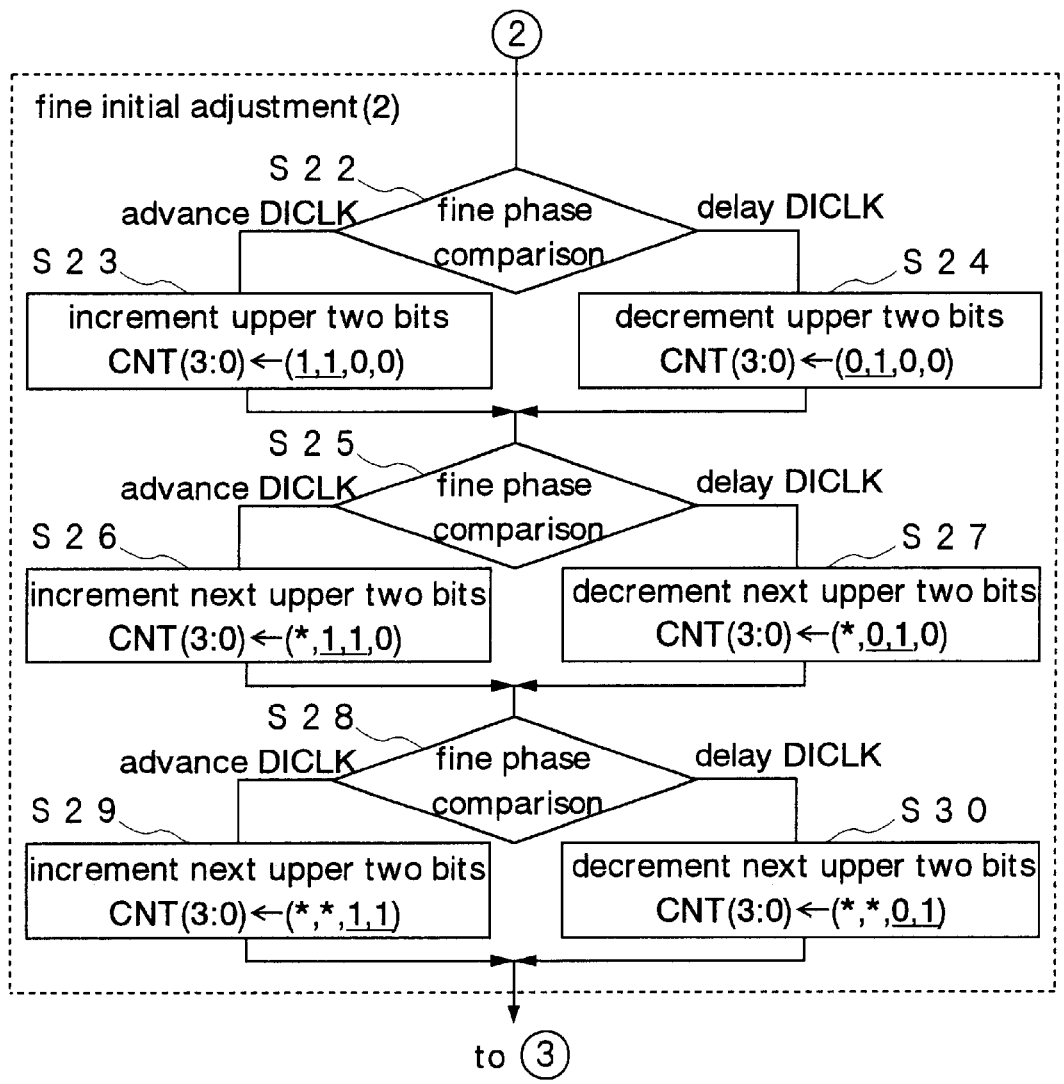
FIG. 32 is a flowchart showing the control for the fine initial adjustment in the first embodiment.

(c) Fine Initial Adjustment (FIGS. 31 and 32)

For a start, at step S12, the procedure branches off in accordance with the level of the rough shift order signal RSO. When the rough shift order signal RSO is at high level, that is, in the case of controlling the interpolator 39 at an even-numbered stage, the procedure shifts to step S13. When the rough shift order signal RSO is at low level, that is, in the case of controlling the interpolator 39 at an odd-numbered stage, the procedure shifts to step S22.

At step S13, the phase comparator 90 shown in FIG. 12 compares the phase of the internal clock signal DICLK with the phase of the reference clock signal REFCLK. When the internal clock signal DICLK lags behind the reference clock signal REFCLK in phase, the procedure shifts to step S14 to advance the internal clock signal DICLK in phase. When the internal clock signal DICLK leads the reference clock signal REFCLK in phase, the procedure shifts to step S15 to delay the internal clock signal DICLK in phase.

At step S14, the values of the upper two bits (CNT3 and CNT2) of the binary counter have a decrement by one so that the counter value is set at "4" in decimal.

At step S15, the values of the upper two bits (CNT3 and CNT2) of the binary counter increment by one so that the counter value is set at "12" in decimal.

Similarly, at steps S16–S18 and steps S19–S21, the values of next upper two bits of the binary counter are made "−1" or "+1" in accordance with the phase comparison results.

On the other hand, at step S22, the phase comparator 90 shown in FIG. 12 compares the phases of the internal clock signal DICLK and the reference clock signal REFCLK. When the internal clock signal DICLK lags behind the reference clock signal REFCLK in phase, the procedure shifts to step S23 to advance the internal clock signal DICLK in phase. When the internal clock signal DICLK leads the reference clock signal REFCLK in phase, the procedure shifts to step S24 to delay the internal clock signal DICLK in phase.

At step S23, the values of the upper two bits CNT3 and CNT2 of the binary counter are made "+1" so that the counter value is set at "12" in decimal.

At step S24, the values of the upper two bits CNT3 and CNT2 of the binary counter are made "−1" so that the counter value is set at "4" in decimal.

Similarly, at steps S25–S27 and steps S28–S30, the values of next upper two bits of the binary counter are made "+1" or "−1" in accordance with the phase comparison results.

FIG. 40(a) shows an overview of the fine initial adjustment in the interpolator 39 at an even-numbered stage. The counter value of the binary counter 136 is settled in sequence from the upper bit in accordance with the comparison results from the phase comparator 90. The phase of the internal clock signal CLKI then varies in accordance with the counter value.

FIG. 40(b) shows an overview of the fine initial adjustment in the interpolator 39 at an odd-numbered stage. The counter value of the binary counter 136 is settled in sequence from the upper bit in accordance with the comparison results from the phase comparator 90, as in FIG. 40(a). The phase of the internal clock signal CLKI then varies in accordance with the counter value.

As described above, modifying the phase of the internal clock signal CLKI at every other stage minimize the number of phase comparisons in the fine adjustment. This also leads to a quicker phase adjustment as compared to the case of making a fine adjustment immediately after the rough initial adjustment.

After the execution of step S20 or S21, or step S29 or S30, the procedure shifts to the rough/fine adjustment.

Figure 33:
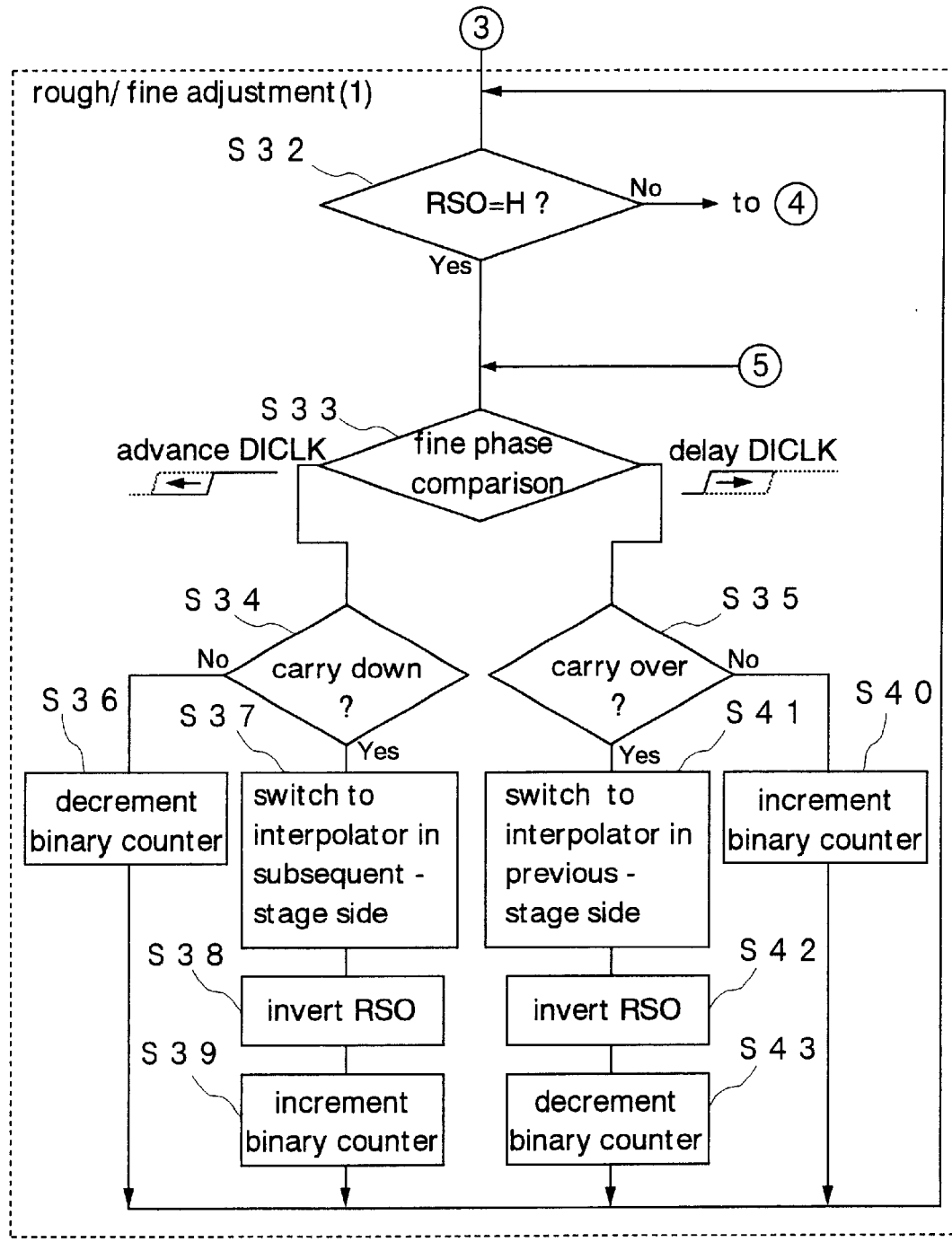
FIG. 33 is a flowchart showing the control for the rough/fine adjustment in the first embodiment.
Figure 34:
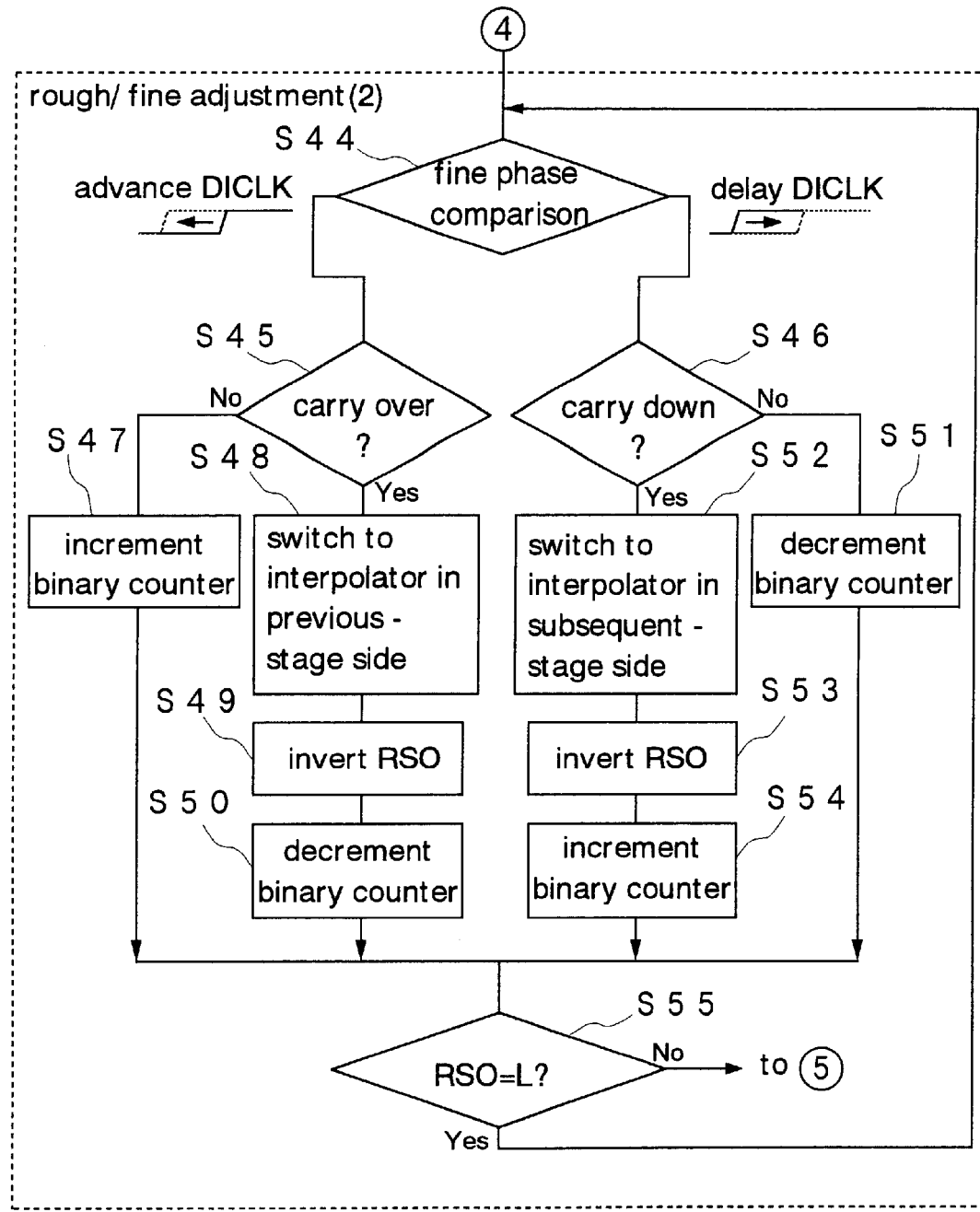
FIG. 34 is a flowchart showing the control for the rough/fine adjustment in the first embodiment.

(d) Rough/Fine Adjustment (FIGS. 33 and 34)

Initially, as step S32, the levels of the rough shift order signal RSO are compared. When the rough shift order signal RSO is at high level, that is, in the case of controlling the interpolator 39 at an even-numbered stage, the procedure shifts to step S33. When the rough shift order signal RSO is at low level, that is, in the case of controlling the interpolator 39 at an odd-numbered stage, the procedure shifts to step S44.

At step S33, the phase comparator 90 shown in FIG. 12 compares the phases of the internal clock signal DICLK and the reference clock signal REFCLK. When the internal clock signal DICLK lags behind the reference clock signal REFCLK in phase, the procedure shifts to step S34 to advance the internal clock signal DICLK in phase. When the internal clock signal DICLK leads the reference clock signal REFCLK in phase, the procedure shifts to step S35 to delay the internal clock signal DICLK in phase.

At step S34, the rough/fine control unit 48 shown in FIG. 18 monitors the level of the minimum signal MIN. When the minimum signal MIN is at low level, the rough/fine control unit 48 judges that advancing the internal clock signal DICLK in phase will not cause the binary counter 136 to carry down. Then, the rough/fine control unit 48 activates the fine enable signal FEN as shown in the controlling state diagram (A) of FIG. 19, and shifts the procedure to step S36. When the minimum signal MIN is at high level, the rough/fine control unit 48 judge that advancing the internal clock signal DICLK in phase will cause the binary counter 136 to carry down. Then, the rough/fine control unit 48 activates the rough enable signal REN as shown in the controlling state diagram (D) of FIG. 19, and shifts the procedure to step S37.

At step S36, the fine controller 134 shown in FIG. 27 receives the fine enable signal FEN, and activates the countdown signal DOWN as shown in the controlling state diagram (A) of FIG. 28. The binary counter 136 receives the countdown signal DOWN, decrements by one and outputs the resultant as the counter signals CNT3–CNT0. The interpolator 39 supplied with the control voltages V1 and V2 advances the phase of the internal clock signal CLKI in accordance with the counter signals CNT3–CNT0.

In the rough/fine adjustment, shifting the 4-bit counter value one by one makes it possible to precisely perform the phase adjustments in response to the phase shifts due to temperature fluctuations or the like.

At step S37, the rough controller 118 shown in FIG. 21, receives the rough enable signal REN, activates the forward signal FW as shown in the controlling state diagram (D) of FIG. 22, and activates the control signals A, B and the shift information signal SINF (FIG. 23(c), (d), and (g)).

The shift register 63 shown in FIG. 10 receives the control signals A and B, and executes a control to switch the destination of the control voltages V1 and V2 to the following interpolator 39 (at an odd-numbered stage). Meanwhile, the shift register 63 inactivates the preceding interpolator 39 (at an odd-numbered stage), thereby reducing the power consumed by the delay circuit 55.

Here, the interpolators 39 are switched when the binary counter 136 has the minimum counter value (zero). Therefore, as shown in FIG. 39(a), switching over the interpolators 39 will not vary the internal clock signal CLKI in phase. That is, the switching over the interpolators 39 causes no jitter to the internal clock signal CLKI.

At step S38, the rough shift latch 120 shown in FIG. 24 receives the shift information signal SINF, and inverts the level of the rough shift order signal RSO.

At step S39, the fine controller 134 shown in FIG. 27 activates the count-up signal UP. The binary counter 136 receives the count-up signal UP and increments the counter value by one.

In the rough/fine adjustment, the unit of the phase adjustment to the internal clock signal CLKI are equal to one unit of the binary counter 136 even when the delay stages are switched. Therefore, even when the result of the phase comparison instantaneously has a great change because of the occurrence of noise, the internal clock signal CLKI does not vary in phase affected by the change. This means the signal is less susceptible to noise.

On the other hand, at step S35, the rough/fine control unit 48 shown in FIG. 18 monitors the level of the maximum signal MAX. When the maximum signal MAX is at low level, the rough/fine control unit 48 judges that delaying the internal clock signal DICLK in phase will not cause the binary counter 136 to carry over. Then, the rough/fine control unit 48 activates the fine enable signal FEN as shown in the controlling state diagram (A) of FIG. 19, and shifts the procedure to step S40. When the maximum signal MAX is at high level, the rough/fine control unit 48 judges that delaying the internal clock signal DICLK in phase will cause the binary counter 136 to carry over. Then, the rough fine control unit 48 activates the rough enable signal REN as shown in the controlling state diagram (C) of FIG. 19, and shifts the procedure to step S41.

At step S40, the fine controller 134 shown in FIG. 27 receives the fine enable signal FEN, and activates the count-up signal UP as shown in the controlling state signal (B) of FIG. 28. The binary counter 136 receives the count-up signal UP, increments the counter value by one and outputs the resultant as the counter signals CNT3–CNT0. The interpolator 39 receiving the control voltages V1 and V2 delays the phase of the internal clock signal CLKI in accordance with the counter signals CNT3–CNT0.

At step S41, the rough controller 118 shown in FIG. 21 receives the rough enable signal REN, activates the backward signal BW as shown in the controlling state signal (C) of FIG. 22, and activates the control signals C, D and the shift information signal SINF (FIG. 23(e) and (f)).

The shift register 63 shown in FIG. 10 receives the control signals C and D, and performs a control to switch the destination of the control voltages V1 and V2 to the preceding interpolator 39 (at an odd-numbered stage). At the same time, the shift register 63 activates the preceding interpolator 39 (at an even-numbered stage).

Here, the interpolators 39 are switched when the binary counter 136 has the maximum count value ("16" in decimal). Therefore, as shown in FIG. 39(a), switching the delay stages will not vary the internal clock signal CLKI in phase. That is, as instep S37, switching the delay stages causes no jitter to the internal clock signal CLKI.

At step S42, the same control as that in the step S38 described above is performed to invert the rough shift order signal RSO.

At step S43, the fine controller 134 shown in FIG. 27 activates the countdown signal DOWN. The binary counter 136 receives the countdown signal DOWN and decrements the counter value by one.

After the execution of the step S36, S39, S40, or S43, the procedure returns to step S32.

On the other hand, in steps S44–S54, the controls are performed to advance and delay the internal clock signal DICLK in phase in an opposite way to those of the steps S33–S43 described above.

Initially, at step S44, the phase comparator 90 shown in FIG. 12 compares the phases of the internal clock signal DICLK and the reference clock signal REFCLK. When the internal clock signal DICLK leads the reference clock signal REFCLK in phase, the procedure shifts to step S45 to advance the internal clock signal DICLK in phase. When the internal clock signal DICLK lags behind the reference clock signal REFCLK in phase, the procedure shifts to step S46 to delay the internal clock signal DICLK in phase.

At step S45, the rough/fine control unit 48 shown in FIG. 18 monitors the level of the maximum signal MAX. When the maximum signal MAX is at low level, the rough/fine control unit 48 judges that advancing the internal clock signal DICLK in phase will not cause the binary counter 136 to carry over. Then, the rough/fine control unit 48 activates the fine enable signal FEN as shown in the controlling state diagram (F) of FIG. 19, and shifts the procedure to step S47. When the maximum signal MAX is at high level, the rough/fine control unit 48 judges that advancing the internal clock signal DICLK in phase will cause the binary counter 136 to carry over. Then, the rough fine control unit 48 activates the rough enable signal REN as shown in the controlling state diagram (G) of FIG. 19 and shifts the procedure to step S48.

At step S47, the same control as that of the step S40 described above is performed so that the binary counter 136 increments the counter value by one.

At step S48, the rough controller 118 shown in FIG. 21 receives the rough enable signal REN, activates the forward signal FW as shown in the controlling state signal (G) of FIG. 22, and activates the control signals A, B and the shift information signal SINF (FIG. 23 (c), (d), and (g)).

The shift register 63 shown in FIG. 10 receives the control signals C and D, and performs a control to switch the destination of the control voltages V1 and V2 to the subsequent interpolator 39 (at an odd-numbered stage). At the same time, the shift register 63 inactivates the preceding interpolator 39 (at an odd-numbered stage).

At step S50, the same control as that of the step S43 described above is performed so that the binary counter 136 decrements the counter value by one.

On the other hand, at step S46, the rough/fine control unit 48 shown in FIG. 18 monitors the level of the minimum signal MIN. When the minimum signal MIN is at low level, the rough/fine control unit 48 judges that delaying the internal clock signal DICLK in phase will not cause the binary counter 136 to carry down. Then, the rough/fine control unit 48 activates the fine enable signal FEN as shown in the controlling state diagram (F) of FIG. 19, and shifts the procedure to step S51. When the minimum signal MIN is at high level, the rough/fine control unit 48 judges that delaying the internal clock signal DICLK in phase will cause the binary counter 136 to carry down. Then, the rough/fine control unit 48 activates the rough enable signal REN as shown in the controlling state diagram (J) of FIG. 19, and shifts the procedure to step S52.

At step S51, the same control as that of the step S36 described above is performed so that the binary counter 136 decrements the counter value by one.

At step S52, the rough controller 118 shown in FIG. 21 receives the rough enable signal REN, activates the backward signal BW as shown in the controlling state diagram (J) of FIG. 22, and activates the control signals C, D and the shift information signal SINF (FIG. 23(e) and (f)).

The shift register 63 shown in FIG. 10 receives the control signals C and D, and performs a control to switch the destination of the control voltages V1 and V2 to the preceding interpolator 39 (at an odd-numbered stage). At the same time, the shift register 63 activates the next preceding interpolator 39 (at an even-numbered stage).

At step S53, the same control as that of the step S38 described above is performed to invert the level of the rough shift order signal RSO.

At step S54, the same control as that of the step S39 described above is performed so that the binary counter 136 increments the counter value by one.

After the execution of step S47, S50, S51, or S54, the procedure shifts to step S55.

At step S55, the rough shift order signal RSO is subjected to a level comparison. When the rough shift order signal RSO is at low level, the procedure returns to step S44. When the rough shift order signal RSO is at high level, the procedure shifts to step S33.

As described above, the steps S32–S55 are repeated to perform the rough/fine adjustment. The phase of the internal clock signal CLKI coincides with the phase of the clock signal CLK.

In the semiconductor integrated circuit configured as described above, the phase adjustment is performed in the three stages consisting of the rough initial adjustment, the fine initial adjustment (the rough adjustment), and the rough/fine adjustment (the fine adjustment). Therefore, the phase of the internal clock signal DICLK coincides with the reference clock signal REFCLK at a smaller number of phase comparisons.

The phase adjustment is performed by switching a plurality of interpolators in the rough adjustment and controlling a single interpolator in the fine adjustment. This allows quicker adjustment in phase.

Since the interpolators 39 are used for a phase adjustment circuit and an interpolator, the delay circuit 54 can be reduced in layout size.

In addition, since an interpolator 39 is used to finely adjust the phase, the minimum unit of the fine adjustment can be made smaller in accordance with the accuracy of the interpolator 39. This allows reliable adjustments in phase even in a semiconductor integrated circuit supplied with clock signals CLK and /CLK of higher frequency.

Since those unused interpolators 39 are inactivated, the power consumption can be reduced.

Besides, interpolators 39 can be connected with independent power supply lines so that the interpolators 39 are prevented from becoming unstable in operation under the influence of other circuits. Moreover, the independent power supply lines mentioned above can be connected to an internal power supply obtained by stepping down the power supply voltage supplied from the exterior, so that it is possible to operate the interpolators 39 with higher stability against the jitter in the external power supply, thereby allowing a reduction in the power consumption of the interpolators 39.

The start signal STT is activated in synchronization with the fall of the internal clock signal CLK-K. Accordingly, at the beginning of phase comparisons, the delayed clock generator 37, the phase comparison unit 46, and the like can start their operations in synchronization with each other so that the phase comparisons are always started with a predetermined state. Moreover, the high-level periods of the internal clock signal CLK-K or the like can be masked by the start signal STT, so as to prevent the occurrence of hazard and avoid malfunctions at the beginning of the phase comparisons.

The phase comparisons are made between the internal clock signal DICLK and the reference clock signal REFCLK having their frequencies divided to a fourth by using the first and second dividers 82 and 84. Therefore, even if supplied with clock signals CLK and /CLK of higher frequency, the phase comparator 90 can be operated with reliability. Besides, the power consumption can be reduced since the phase comparisons are reduced in frequency. Moreover, the frequency of the phase comparisons can be further lowered after the completion of the step S20 or S21 in FIG. 31, or a predetermined number of clocks after the rough lock on signal RLON is turned to high level, for a greater reduction in power consumption.

At the beginning of a phase comparison, the first frequency divider 82 and the second frequency divider 84 are operated in synchronization with the start signal STT so as to output the frequency-divided internal clock signal and reference clock signal REFCLK after predetermined clock numbers. Accordingly, as long as the frequencies of the clock signals CLK and /CLK fall within a certain range, the maximum deviation between the phases of the internal clock signal and the reference clock signal REFCLK supplied to the phase comparator 90 can be made small at the beginning of the phase comparison. This consequently allows a reduction in the number of phase comparisons in the rough adjustment. In general, semiconductor integrated circuits have a fixed range of operating frequencies by each product, and therefore the application of the present invention offers a considerable effect.

The determination to complete the rough initial adjustment is made by a simple latch circuit (the shift direction keeping circuit 112); therefore, the circuit scale can be reduced.

The counter value of the binary counter 136 is set at the central value in the rough initial adjustment. This allows the internal clock signal CLKI to has the same phase variation at the times of switching the delay stages. Accordingly, in the fine initial adjustment after the rough initial adjustment, the phase adjustment by an interpolator 39 can be limited to a predetermined range to minimize the number of phase comparisons is minimized.

In the fine initial adjustment, the phase of the internal clock signal CLKI is varied in every other step. This minimize the number of phase comparisons in the fine adjustment. This also permits a quicker phase adjustment as compared to the case of making a fine adjustment immediately after the rough initial adjustment.

In the rough/fine adjustment, increasing counter values always varies the phase of the internal clock signal CLKI from the phase of the signal supplied to the input terminal IN1 toward the phase of the signal supplied to the input terminal IN2. Decreasing counter values always varies the phase of the internal clock signal CLKI from the phase of the signal supplied to the input terminal IN2 toward the phase of the signal supplied to the input terminal IN1. Therefore, even if the counter value reaches the maximum or the minimum, it is not necessary to reset or set the counter value, but only to switch interpolators 39. Accordingly, as shown in FIG. 39(*a*), switching delay stages does not vary the internal clock signal CLKI in phase. This can prevent jitter from being occurred in the internal clock signal by switching delay stages.

In the rough/fine adjustment, the controls to shift the 4-bit counter value by one are performed. Therefore, even in the case where the phase comparison result instantaneously has a great change because of noise, the internal clock signal CLKI can be prevented from following to vary in phase. This means less susceptibility to noise.

In addition, the phases can be precisely adjusted corresponding to the phase shifts due to temperature variations, voltage variations, or the like.

Now, description will be given of the second embodiment of the semiconductor integrated circuit in the prevent invention. The same circuits and signals as those described in the first embodiment will be designated by identical reference numbers, and detailed description thereof will be omitted here.

Figure 41:
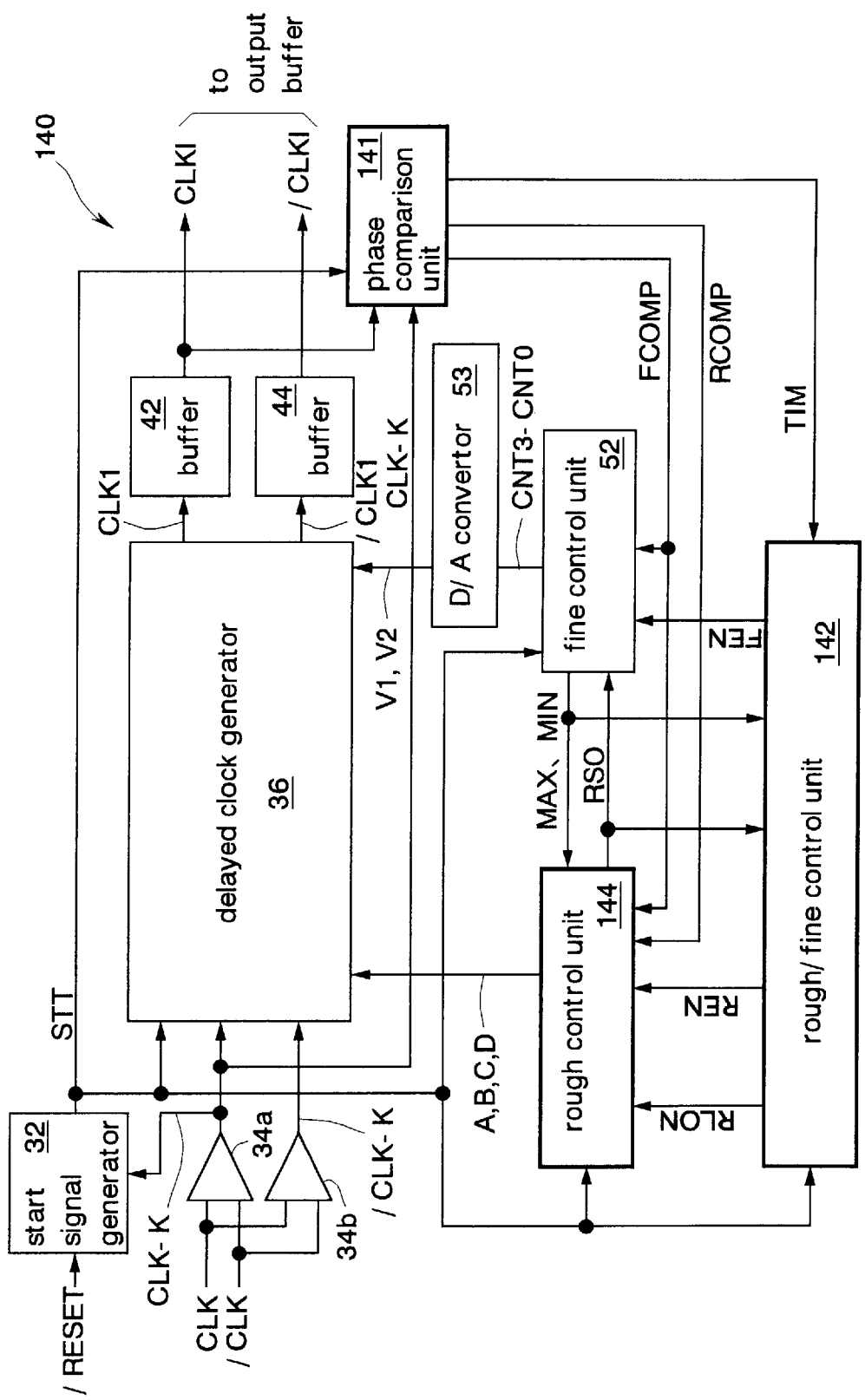
FIG. 41 is a block diagram showing the clock control unit in the second embodiment.

FIG. 41 shows a clock control unit 140 implemented in a DDR-SDRAM. The clock control unit 140 of this embodiment differs from that of the first embodiment in a phase comparison unit 141, a rough/fine control unit 142, and a rough control unit 144.

The phase comparison unit 141 receives internal clock signals CLKI, CLK-K and a start signal STT, and outputs a fine comparison result signal FCOMP, a rough comparison result signal RCOMP, and a timing signal TIM. The rough/fine control unit 142 receives the timing signal TIM, a maximum signal MAX, a minimum signal MIN, a rough shift order signal RSO, and the start signal STT, and outputs a rough enable signal REN, a fine enable signal FEN, and a rough lock on signal RLON. The rough control unit 144 receives the rough enable signal REN, the rough lock on signal RLON, the maximum signal MAX, the minimum signal MIN, and the start signal STT, and outputs the rough shift order signal RSO and control signals A–D.

Figure 42:
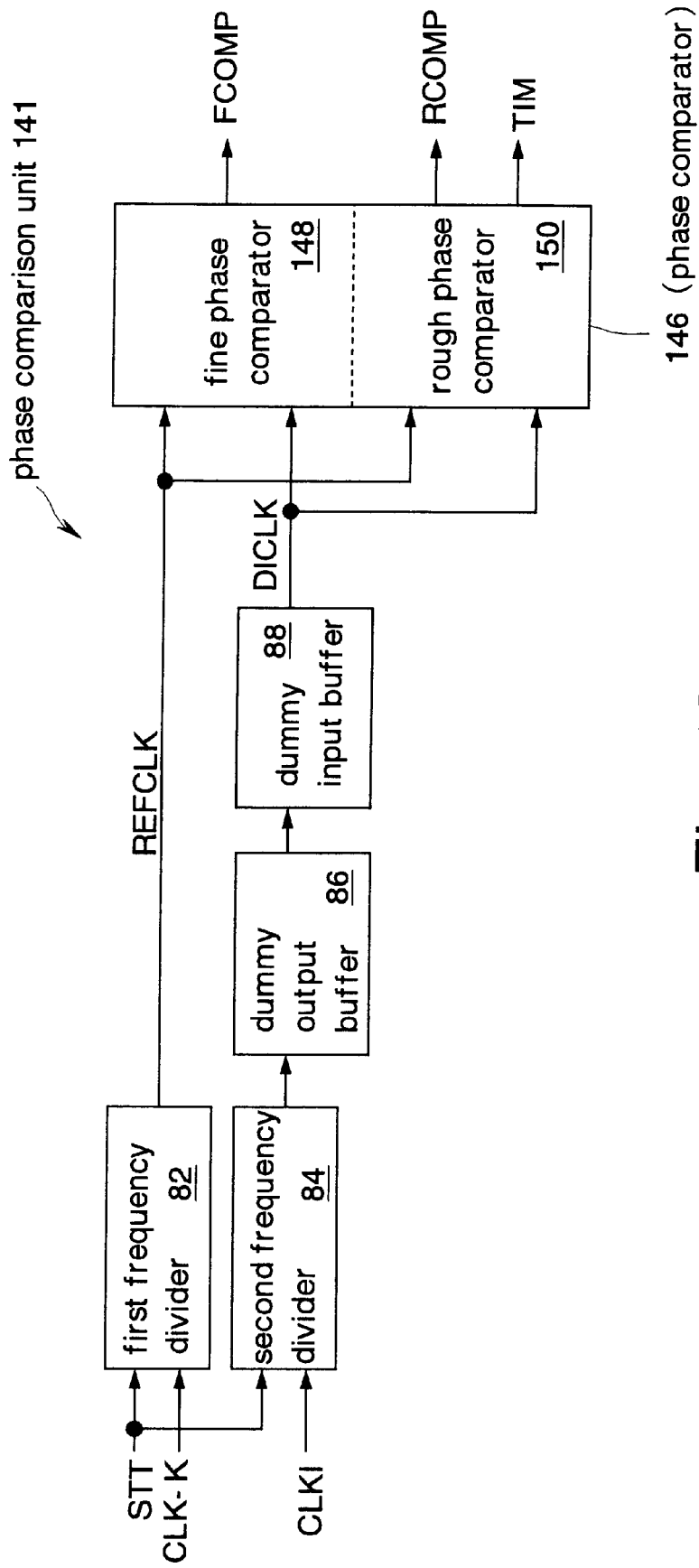
FIG. 42 is a block diagram showing the phase comparison unit in FIG. 41.

FIG. 42 shows the details of the phase comparison unit 141.

The phase comparison unit 141 comprises the same first frequency divider 82, second frequency divider 84, dummy output buffer 86, and dummy input buffer 88 as those of the first embodiment, and a fine phase comparator 148 and a rough phase comparator 150. The fine phase comparator 148 is a circuit for comparing the phases of a reference clock signal REFCLK and an internal clock signal DICLK, and outputting the fine comparison result signal FCOMP. The rough phase comparator 150 is a circuit for comparing the phases of the reference clock signal REFCLK and the internal clock signal DICLK, and outputting the rough comparison result signal RCOMP and the timing signal TIM.

Figure 43:
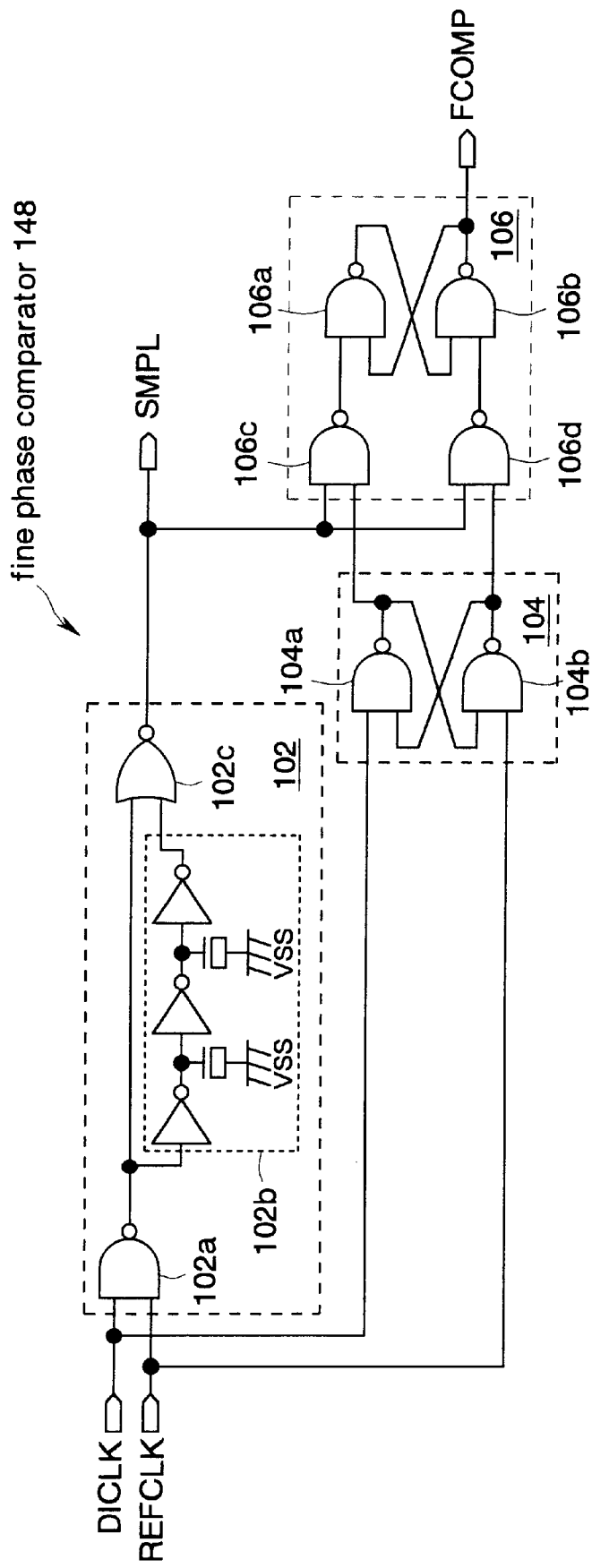
FIG. 43 is a circuit diagram showing the fine phase comparator in FIG. 42.

FIG. 43 shows the details of the fine phase comparator 148.

The fine phase comparator 148 is a circuit obtained by removing the timing generator 108 from the phase comparator 90 of the first embodiment. The fine phase comparator 148 outputs a sampling signal SMPL through the output of the NOR gate 102c in the pulse generator 102, and outputs the fine comparison result signal FCOMP through the output of the NAND gate 106b in the flip-flop 106.

Figure 44:
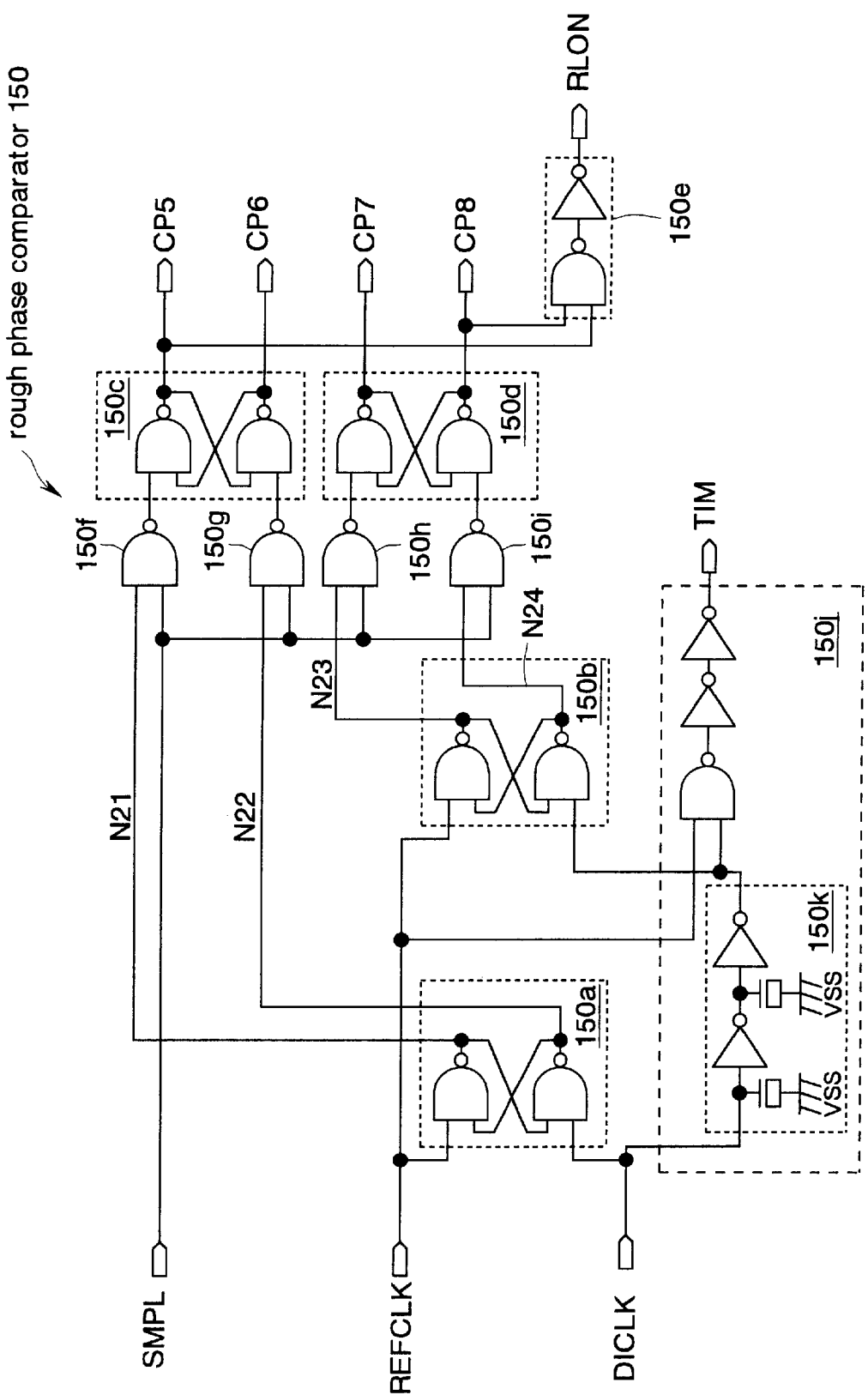
FIG. 44 is a circuit diagram showing the rough phase comparator in FIG. 42.

FIG. 44 shows the details of the rough phase comparator 150.

The rough phase comparator 150 comprises: flip-flops 150a, 150b, 150c, and 150d consisting of two two-input NAND gates; a two-input AND circuit 150e; two-input NAND gates 150f, 150g, 150h, and 150i connected to the inputs of the flip-flops 150c and 150d; and a timing generator 150j. The timing generator 150j is a circuit obtained by replacing the delay circuit 108a in the timing generator 108 of the first embodiment with a CR time constant circuit 150k. The CR time constant circuit 150k has delay time equal to or slightly longer than the delay time DELAY of the interpolators 39 shown in FIG. 7. The timing generator 150j receives at the NAND gate 108b the internal clock signal DICLK delayed by the CR constant circuit 150k and the reference clock signal REFCLK, and outputs the timing signal TIM.

The inputs of the flip-flop 150a are supplied with the reference clock signal REFCLK and the internal clock signal DICLK. The output nodes N21 and N22 of the flip-flop 150a are connected to one input of the NAND gates 150f and 150g, respectively. The inputs of the flip-flop 150b are supplied with the reference clock signal REF and the internal clock signal 150 delayed by the CR time constant circuit 150k in the timing generator 150j. The output nodes N23 and N24 of the flip-flop 150b are connected to one input of the NAND gates 150h and 150i, respectively.

The other inputs of the NAND gates 150f–150i are supplied with the sampling signal SMPL. The flip-flops 150c and 150d output comparison result signals CP5, CP6 and comparison result signals CP7, CP8, respectively. The AND circuit 150e receives the comparison result signals C5 and C8, and outputs the rough lock on signal RLON.

Figure 45:
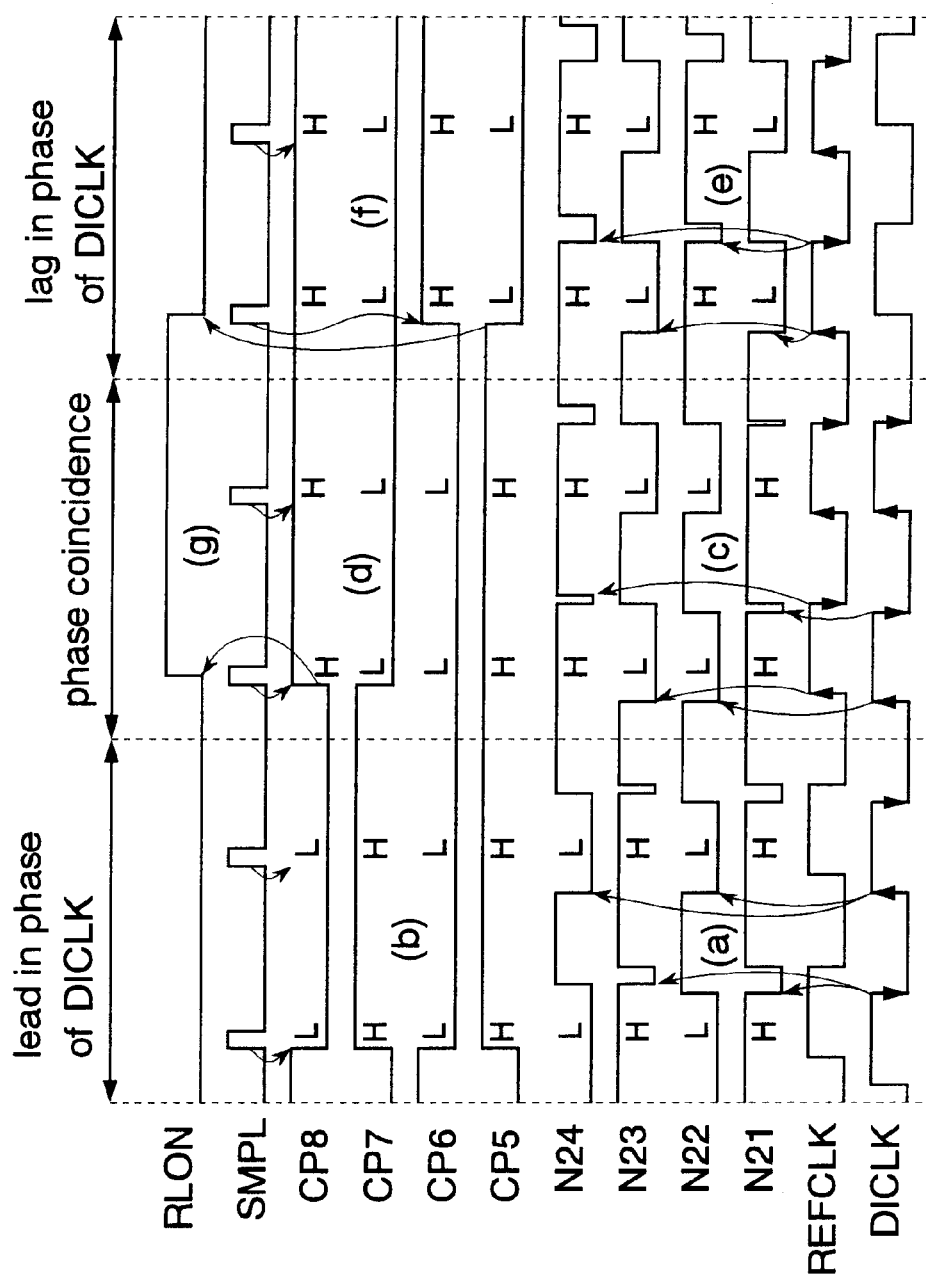
FIG. 45 is a timing chart showing the operations of the rough phase comparator in the second embodiment.

FIG. 45 shows the operation timing for the rough phase comparator 150.

When the internal clock signal DICLK leads the reference clock signal REFCLK in phase, both the flip-flops 150a and 150b shown in FIG. 44 operate in synchronization with the internal clock signal DICLK. Accordingly, onto the nodes N21, N23 and the nodes N22, N24 are output almost the same signals (FIG. 45(a)). Here, since the input of the flip-flop 150b is supplied with the internal click signal DICLK through the CR time constant circuit 150k, the signal waveforms are slightly different from each other. The flip-flops 150c and 150d accept the signals on the nodes N21–N24 in synchronization with the sampling signal SMPL, and outputs them as the comparison result signals CP5–CP8, respectively (FIG. 45(b)).

When the difference in phase between the internal clock signal DICLK and the reference clock signal REFCLK is shorter than the delay time of the CR time constant circuit 150k, the flip-flop 150a operates in synchronization with the internal clock signal DICLK, and the flip-flop 150b operates in synchronization with the reference clock signal REFCLK. Accordingly, onto the nodes N21, N23 and the nodes N22, N24 are output signals of opposite phases from each other (FIG. 45(c)). The flip-flops 150c and 150d accept the signals on the nodes N21–N24 in synchronization with the sampling signal SMPL, and output them as the comparison result signals CP5–CP8, respectively (FIG. 45(d)).

When the internal clock signal DICLK lags behind the reference clock signal REFCLK in phase, both the flip-flops 150a and 150b operate in synchronization with the reference clock signal REFCLK. Accordingly, onto the nodes N21, N23 and the nodes N22, N24 are output almost the same signals (FIG. 45(e)). The flip-flops 150c and 150d accept the signals on the nodes N21–N24 in synchronization with the sampling signal SMPL, and output them as the comparison result signals CP5–CP8, respectively (FIG. 45(f)).

Moreover, when the difference in phase becomes shorter than the delay time of the CR time constant circuit 150k and both the comparison signals CP5 and CP8 are turned to high level, the rough phase comparator 150 judges that the phases coincide in the rough initial adjustment to be described later. Then, the rough lock on signal RLON is activated (FIG. 45(g)). As described above, the coincidence of the phases in the rough initial adjustment is judged by the independent rough phase comparator 150. In contrast to the first embodiment, this eliminates the necessity for inverting the shift direction of an internal clock signal ACLK (or /BCLK). As a result, it is possible to perform the rough initial adjustment at high speed.

Figure 46:
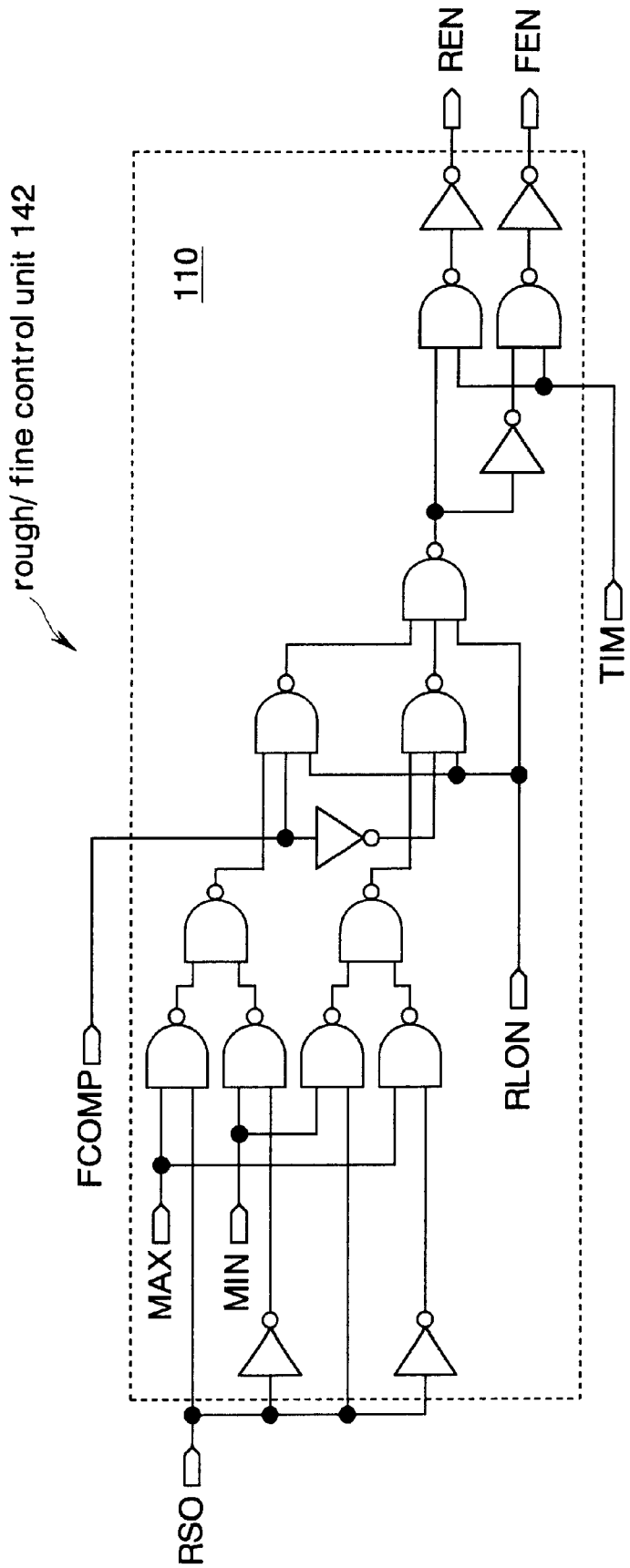
FIG. 46 is a circuit diagram showing the rough/fine control unit in FIG. 41.

FIG. 46 shows the details of the rough/fine control unit 142. The rough/fine control unit 142 is the same circuit as the combinational circuit 110 in the rough/fine control unit 48 of the first embodiment.

Figure 47:
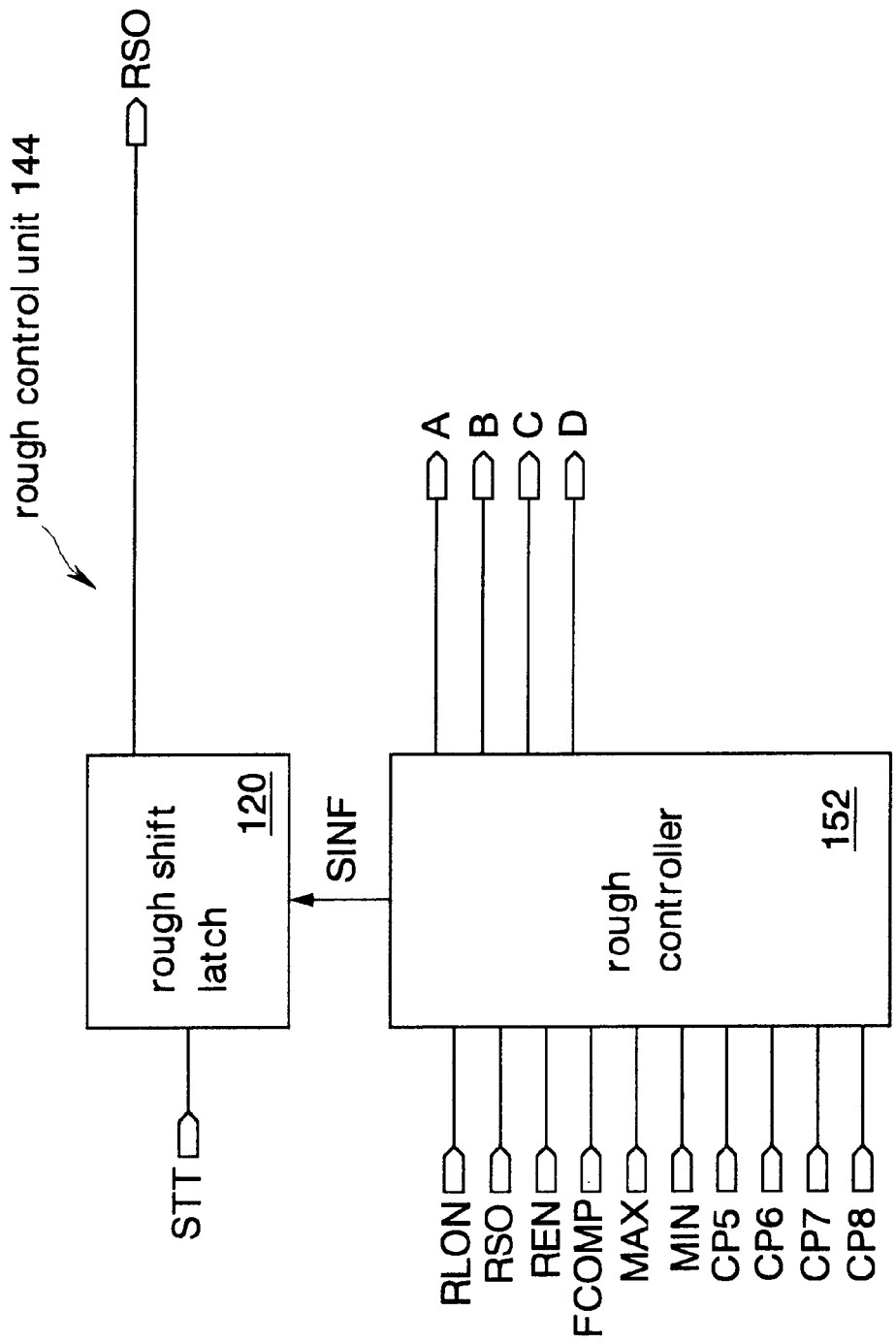
FIG. 47 is a circuit diagram showing the rough control unit in FIG. 41.

FIG. 47 shows the details of the rough control unit 144.

The rough control unit 144 consists of a rough controller 152 and a rough shift latch 120. The rough shift latch 120 is the same circuit as that of the first embodiment. In this embodiment, the shift direction latch 122 of the first embodiment is not implemented.

Figure 48:
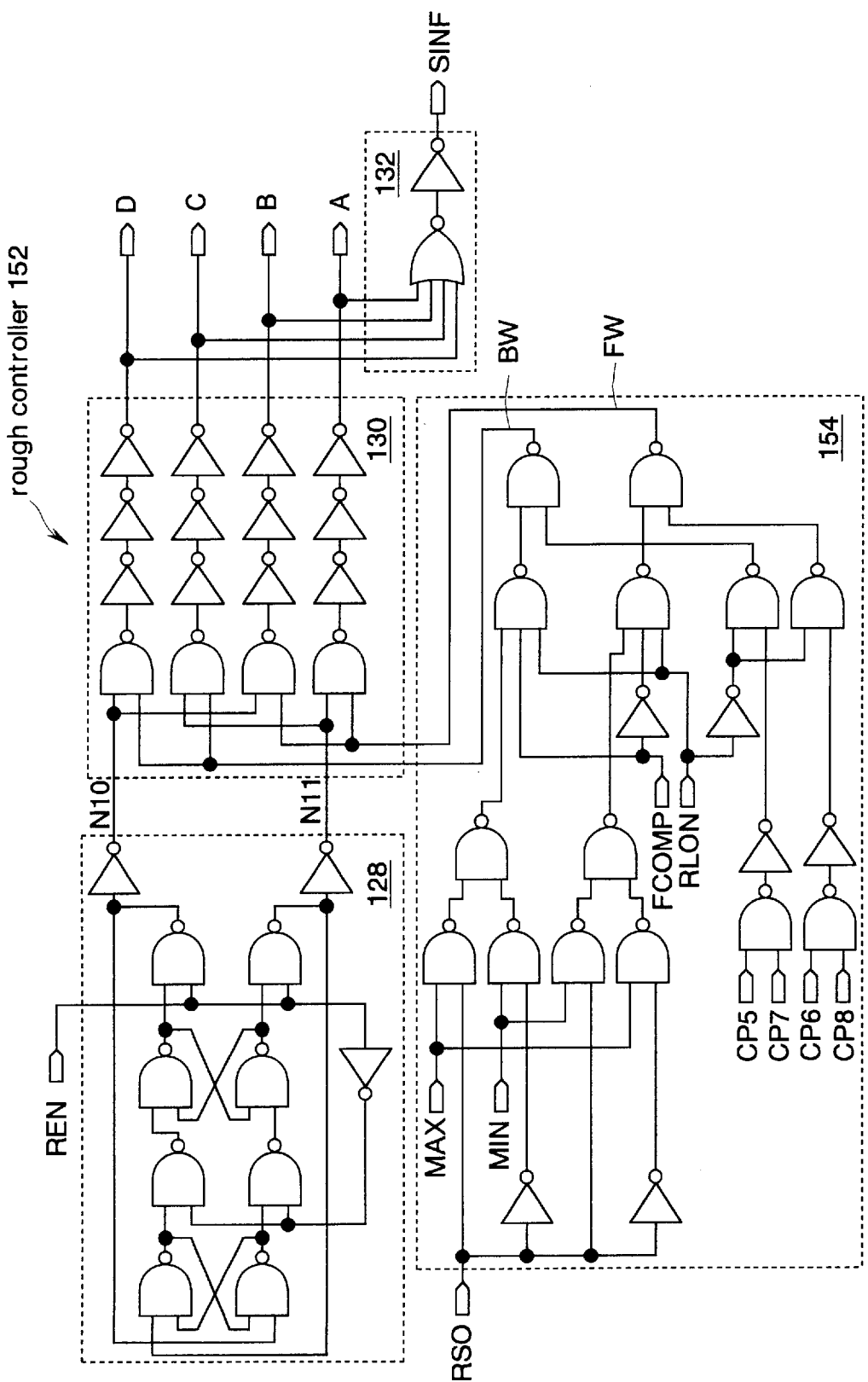
FIG. 48 is a circuit diagram showing the rough controller in FIG. 47.

FIG. 48 shows the details of the rough controller 152.

The rough controller 152 comprises a combinational circuit 154, a divider 128, a control circuit 130, and an OR circuit 132. The divider 128, the control circuit 130, and the OR circuit 132 are the same circuits as those of the first embodiment.

The combinational circuit 154 differs from the combinational circuit 126 of the first embodiment in the point as follows: That is, in the combinational circuit 126, the three-input NAND gate and the two-input NAND gates at the previous stages of the NAND gates outputting the forward signal FW and the backward signal BW are supplied with the logic of the comparison result signal COMP. In the combinational circuit 154, the three-input NAND gate is supplied with the logic of the fine comparison result signal FCOMP, and the two-input NAND gates are supplied, through AND gates, with the comparison result signals CP5, CP7, and the comparison result signals CP6, CP8, respectively.

FIG. 49 shows the controlling state diagram of the operations of the combinational circuit 154.

For example, the combinational circuit 154 activates the backward signal BW when the rough lock on signal RLON is at low level and the comparison result signals CP5 and CP7 are at high level, and activates the forward signal FW when the rough lock on signal RLON is at low level and the comparison result signals CP6 and CP8 are at high level. The combinational circuit 154 activates the backward signal BW when each of the rough lock on signal RLON, the rough shift order signal RSO, the maximum signal MAX, and the fine comparison result signal FCOMP is at high level. The combinational circuit 154 inactivates both the forward signal FW and the backward signal BW when the rough lock on signal RLON and the rough shift order signal RSO are at high level and the maximum signal MAX and the minimum signal MIN are at low level.

In the semiconductor integrated circuit described above, the phase adjustment to the internal clock signal CLKI is performed as described below.

Figure 50:
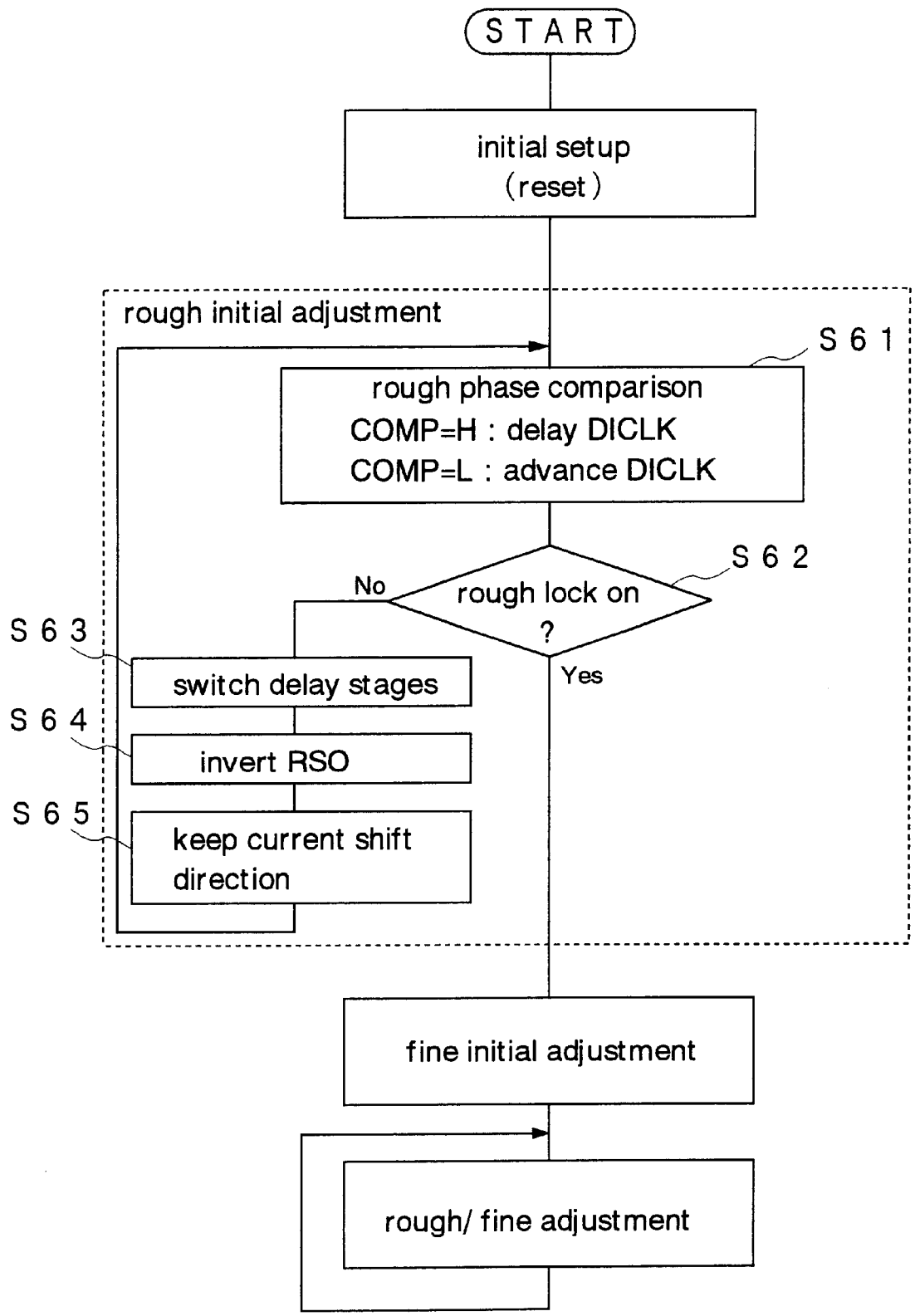
FIG. 50 is a flowchart showing the control for the phase adjustment in the second embodiment.

FIG. 50 is a flowchart showing the control for the phase adjustment to be performed by the circuits described above. The control for the phase adjustment is started by the release of the reset signal /RESET, and then the initial setup, the rough initial adjustment, the fine initial adjustment, and the rough/fine adjustment are performed in sequence.

Since the control flows for the initial setup, the fine initial adjustment, and the rough/fine adjustment are the same as those of the first embodiment, description thereof will be omitted here.

In the rough initial adjustment, at step S61, the rough phase comparator 150 shown in FIG. 42 compares the phases of the reference clock signal REFCLK and the internal clock signal DICLK. When the internal clock signal DICLK leads the reference clock signal REFCLK in phase, the rough comparison result signal RCOMP is set to high level. The high level of the rough comparison result signal RCOMP is followed by the control over delaying the internal clock signal DICLK. When the internal clock signal DICLK lags behind the reference clock signal REFCLK in phase, the rough comparison result signal RCOMP is set to low level. The low level of the rough comparison result signal RCOMP is followed by the performance of a control to advance the internal clock signal DICLK. Moreover, when the internal clock signal DICLK coincides with the reference clock signal REFCLK in phase, the rough lock on signal RLON is turned to high level.

At step S62, if the rough lock on signal RLON is at high level, then the procedure shifts to the fine adjustment. If the rough lock on signal RLON is at low level, then the procedure shifts to step S63.

At step S63, the rough controller 152 shown in FIG. 48 performs a control to switch delay circuits. The delay circuit is controlled in accordance with the controlling state diagram shown in FIG. 49.

The inversion of the rough shift order signal RSO at step S64 and the latching of the shift direction at step S65 are performed by the same procedures as those of the steps S7 and S8 in the first embodiment. Then, the procedure returns to step S61.

Then, after the rough initial adjustment, the fine initial adjustment and the rough/fine adjustment are performed so that the phase of the internal clock signal CLKI coincides with the phase of the internal clock signal CLK.

The semiconductor integrated circuit of this embodiment can offer the same effect as that obtained from the first embodiment described above. Moreover, in this embodiment, the phase comparator 146 is constituted by the fine phase comparator 148 and the rough phase comparator 150, and the judgement on the coincidences of the phases in the rough initial adjustment and in the fine initial adjustment are made by separate circuits. Therefore, the rough initial adjustment can be performed with efficiency and at high speed.

Next, description will be given of the third embodiment of the semiconductor integrated circuit in the present invention. The same circuits and signals as those described in the first embodiment will be designated by identical reference numbers, and detailed description thereof will be omitted.

This embodiment differs from the first embodiment only in a first divider 156, and the other configurations are identical. In addition, this embodiment offers a remarkable effect when applied to a semiconductor integrated circuit operating at lower frequencies as compared to the first embodiment.

Figure 51:
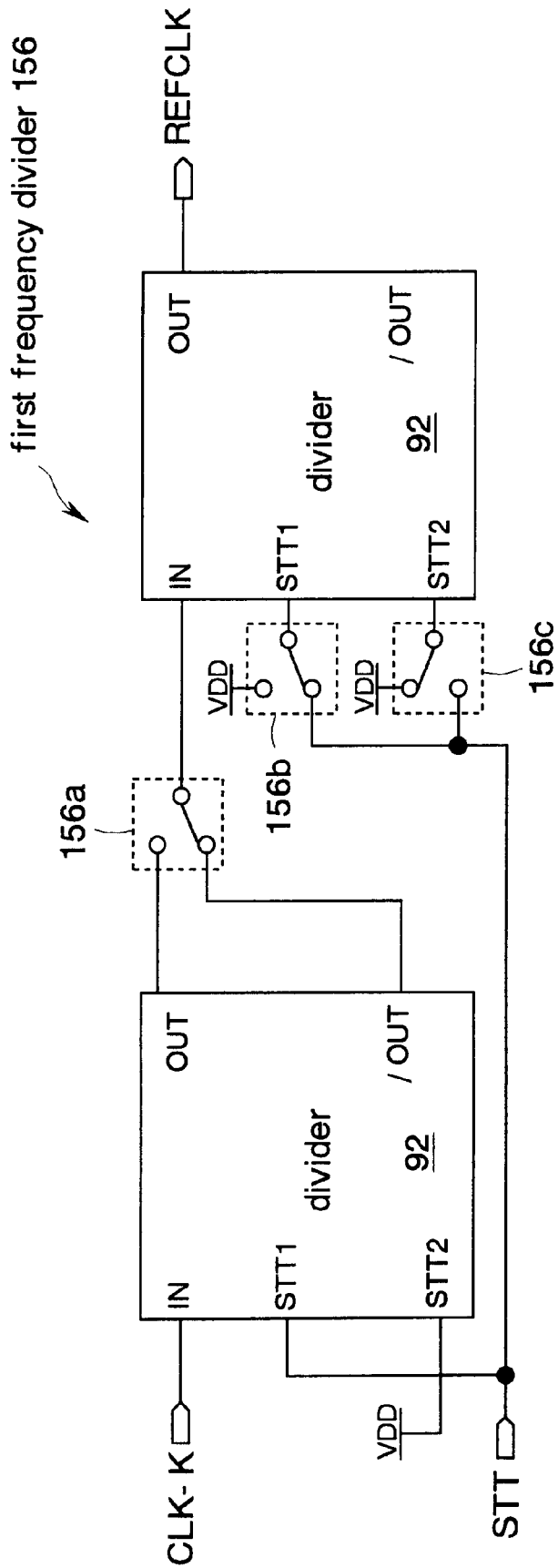
FIG. 51 is a block diagram showing the first divider in the third embodiment.

FIG. 51 shows the first divider 156.

The first frequency divider 156 has two dividers 92 identical to those of the first embodiment. The divider 92 at the previous stage is provided with an internal clock signal CLK-K at the input terminal IN, supplied with a start signal STT at the control terminal STT1, and connected with a power supply line VDD at the control terminal STT2. The input terminal IN and the control terminals STT1, STT2 of the divider 92 at the subsequent stage are connected to switches 156a, 156b, and 156c, respectively. The switch 156a is an element for connecting either of the output terminals OUT and /OUT of the divider 92 at the previous stage to the input terminal IN. The switch 156b is an element for supplying either the high level of the power supply line VDD or the start signal STT to the control terminal STT1. The switch 156c is an element for supplying either the high level of the power supply line VDD or the start signal STT to the control terminal STT2. Each of the switches 156a, 156b, and 156c is consists of a CMOS transmission gate. Each of the switches 156a, 156b, and 156c is switched by loading a predetermined value to a mode register for setting the operating mode of the semiconductor integrated circuit.

In the present embodiment, the input terminal IN of the divider 92 at the subsequent stage is connected with the output terminal /OUT of the divider 92 at the previous stage. The control terminal STT1 and the control terminal STT2 of the divider 92 at the subsequent stage are supplied with the start signal STT and the high level of the power supply line VDD.

Figure 52:
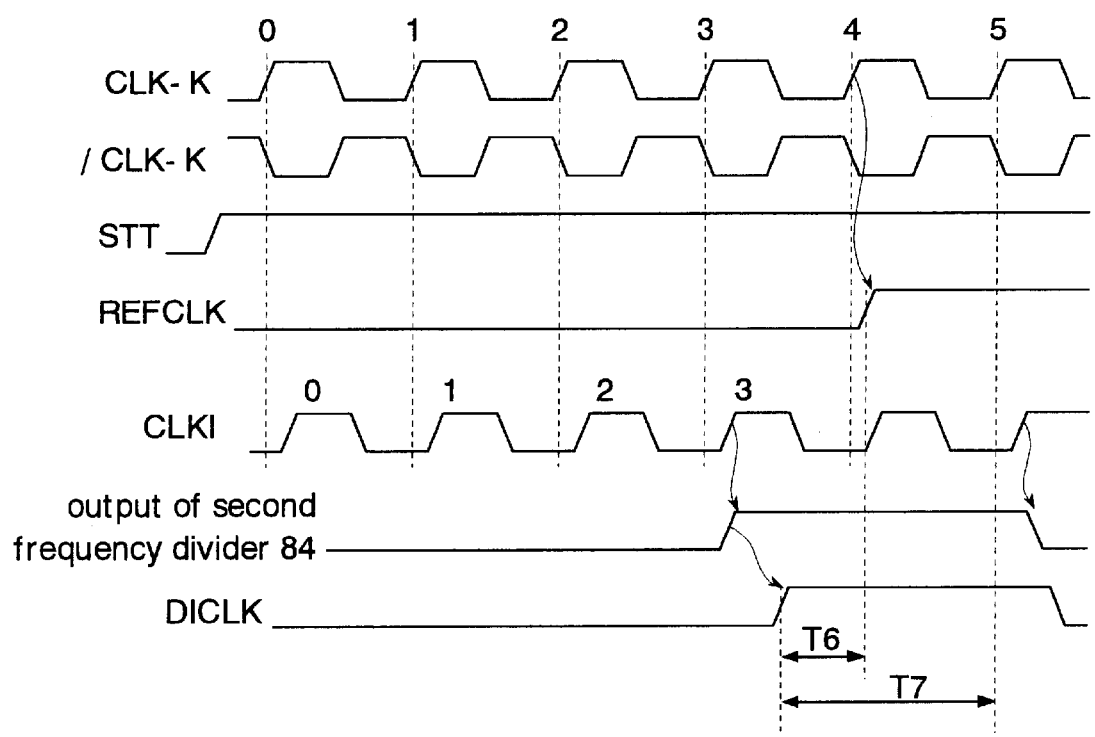
FIG. 52 is a timing chart showing the operations of the first and second dividers at the beginning of the phase adjustment in the third embodiment.

FIG. 52 shows the operation timing for the first divider 156 and the second frequency divider 84 (FIG. 13) at the beginning of a phase adjustment.

In this embodiment, the reference clock signal REFCLK from the first divider 156 starts to be output four clocks after the reception of the internal clock signal CLKI. Accordingly, the phase difference T6 between the internal clock signal DICLK and the reference clock signal REFCLK becomes smaller than the phase difference T7 of the case where the reference clock signal REFCLK is output in five clocks. Therefore, when the operating frequency is low, the clock number before the output of the reference clock signal REFCLK can be reduced to decrease the number of phase comparisons required in the rough initial adjustment. Besides, the phase difference between the internal clock signal DICLK and the reference clock signal REFCLK at the beginning of the rough initial adjustment can be reduced (for example, T7 to T6) so that the number of interpolators 39 to be activated in the delay circuit 55 shown in FIG. 7 decreases to reduce the power consumption.

Now, description will be given of the fourth embodiment of the semiconductor integrated circuit in the present invention. The same circuits and signals as those described in the first embodiment will be designated by identical reference numbers, and detailed description thereof will be omitted.

Figure 53:
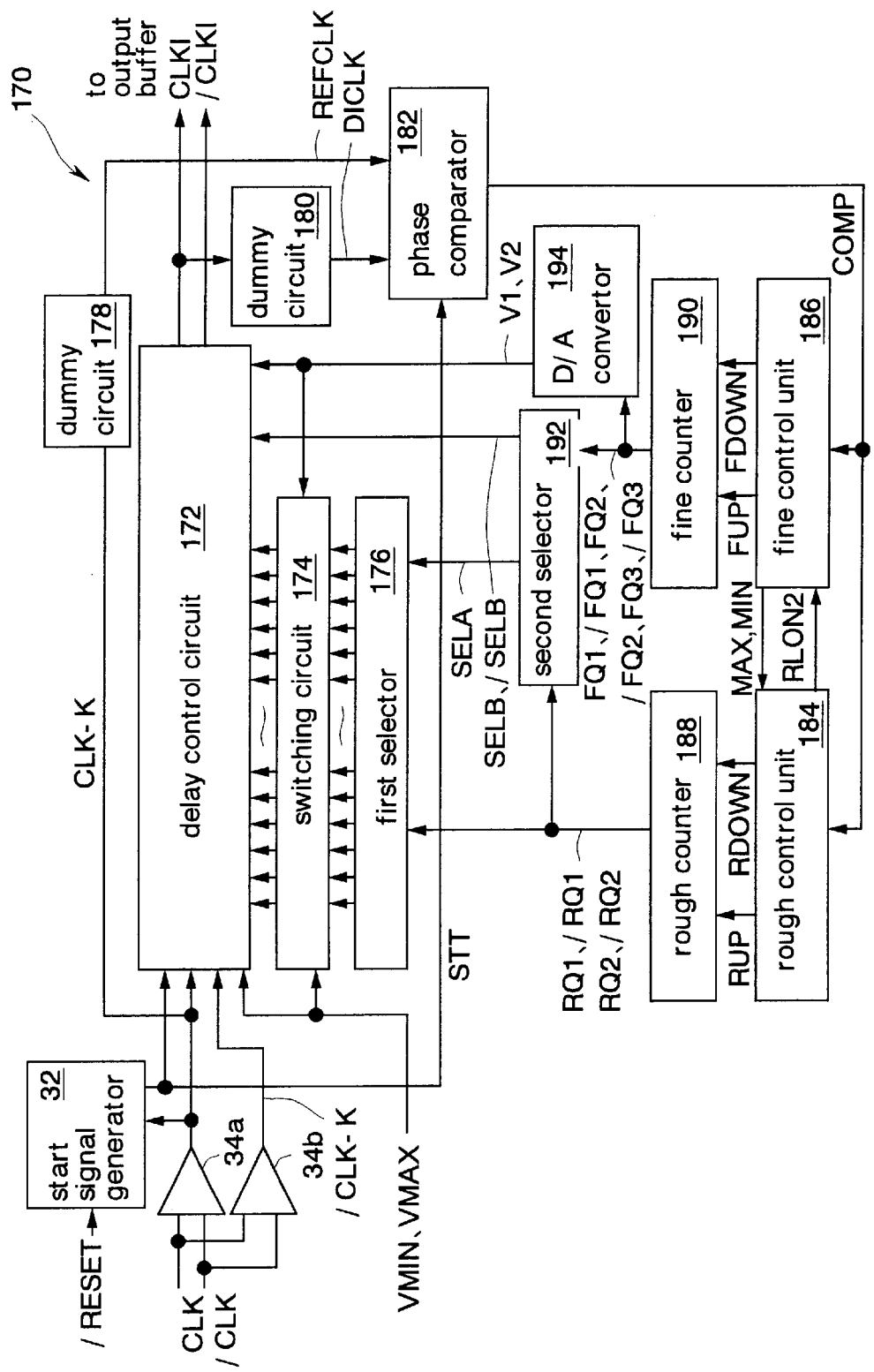
FIG. 53 is a block diagram showing the clock control unit in the fourth embodiment.

FIG. 53 shows a clock control unit 170 implemented in a DDR-SDRAM.

The clock control unit 170 comprises a start signal generator 32, clock buffers 34a and 34b, a delay control circuit 172, a switching circuit 174, a first selector 176, dummy circuits 178 and 180, a phase comparator 182, a rough control unit 184, a fine control unit 186, a rough counter 188, a fine counter 190, a second selector 192, and a D/A converter 194. The switching circuit 174, first selector 176, rough control unit 184, fine control unit 186, rough counter 188, fine counter 190, second counter 192, and D/A converter 194 correspond to the control circuit 318 shown in FIG. 5.

The delay control circuit 172 receives, internal clock signals CLK-K and /CLK-K, the control signals from the switching circuits, and is supplied with control voltages V1, V2, VMIN, and VMAX, and outputs internal clock signals CLKI and /CLKI. The internal clock signals CLK and /CLK correspond to the reference clock signal shown in FIG. 5.

The dummy circuit 178 receives the internal clock signal CLK-K, delays this clock signal CLK-K as much as a composite circuit 204 to be described later does, and outputs the resultant as a reference clock signal REFCLK.

The dummy circuit 180 receives the internal clock signal CLKI generated in the delay control circuit 172, and outputs an internal clock signal DICLK. The dummy circuit 180 uses, for example, the dummy output buffer 86 and the dummy input buffer 88 of the first embodiment (FIG. 12) when the present invention is used for the timing adjustment in an output circuit.

The phase comparator 182 compares the phases of the reference clock signal REFCLK and the internal clock signal DICLK, and outputs a comparison result signal COMP. The phase comparator 182 is constituted by removing the timing generator 108 from the phase comparator 90 of the first embodiment (FIG. 17).

The rough control unit 184 receives the comparison result signal COMP, a maximum signal MAX, and a minimum signal MIN, and outputs a count-up signal RUP, a count signal RDOWN, and a rough lock on signal RLON. The rough control unit 184 has the function of outputting the count-up signal RUP and the countdown signal RDOWN based on the comparison result signal COMP and activating the rough lock on signal RLON when the comparison result is inverted, in the rough adjustment to be described later.

The fine control unit 186 receives the comparison result signal COMP and the rough lock on signal RLON2, and outputs a count-up signal FUP, a countdown signal FDOWN, the maximum signal MAX, and the minimum signal MIN. The fine control unit 188 has the function of outputting the count-up signal FUP and the countdown signal FDOWN based on the comparison result signal COMP when the rough lock on signal RLON2 is activated (in the fine adjustment).

The rough counter 188 receives the count-up signal RUP and the countdown signal RDOWN, operates as a 2-bit counter, and outputs counter signals RQ1, /RQ1, RQ2, and /RQ2.

The fine counter 190 receives the count-up signal FUP and the countdown signal FDOWN, operates as a 3-bit counter, and outputs counter signals FQ1, /FQ1, FQ2, /FQ2, FQ3, and /FQ3.

The second selector 192 receives the counter signals RQ1, /RQ1, RQ2, /RQ2, FQ1–FQ3, and /FQ1–FQ3, and output select signals SELA, SELB, and /SELB in accordance with the counter values.

The DA converter 194 receives the counter signals FQ1–FQ3 and /FQ1–/FQ3, and outputs eight possible values of control voltages V1 and V2 in accordance with this counter value. As in the first embodiment, the control voltage V1 increases with an increasing counter value and the control voltage V2 decreases with an increasing counter value. Moreover, at the maximum counter value, the control voltages V1 and V2 are set to the control voltage VMAX and the control voltage VMIN, respectively. At the minimum counter value, the control voltages V1 and V2 are set to the control voltage VMIN and the control voltage VMAX, respectively.

The first selector 176 receives the counter signals RQ1, /RQ1, RQ2, and /RQ2, and the select signal SELA, and outputs a plurality of switching signals for controlling the switching circuit 174.

The switching circuit 174 receives the switching signals from the first selector 176 and the control voltages V1, V2, VMIN, and VMAX, and outputs a plurality of control signals.

Figure 54:
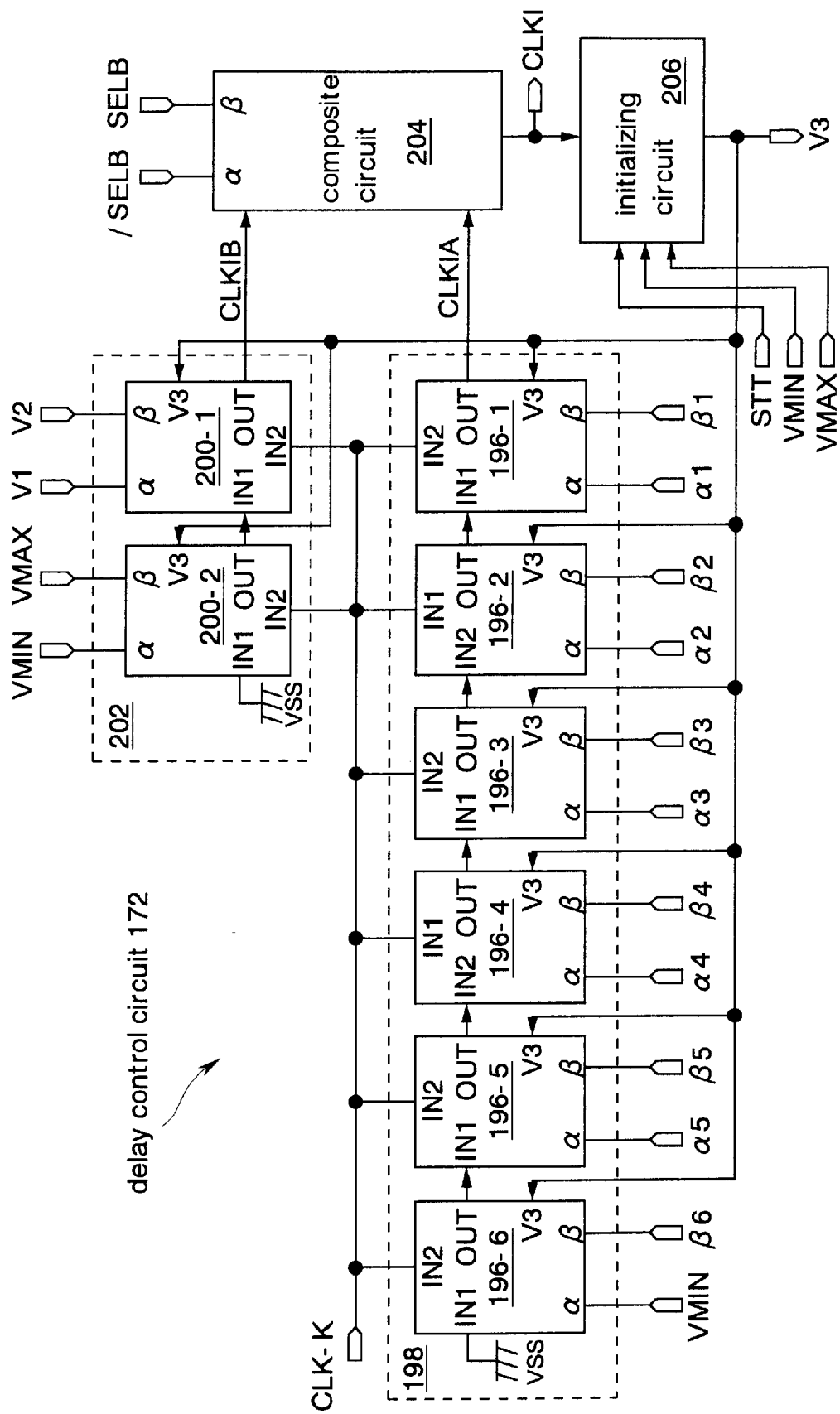
FIG. 54 is a block diagram showing the delay control circuit in FIG. 53.

FIG. 54 shows the details of the delay control circuit 172. The delay control circuit 172 comprises: a delay circuit 198 consisting of six interpolators 196 connected in series; a delay circuit 202 consisting of two interpolators 200 connected in series; a composite circuit 204 consisting of an interpolator; and an initializing circuit 206. The delay circuit 198, the delay circuit 202, and the composite circuit 204 correspond to the main delay circuit 310, the sub delay circuit 312, and the selecting circuit 314 shown in FIG. 5, respectively.

Like the delay circuit 55 (FIG. 7) of the first embodiment, the delay control circuit 172 receives the negative-logic clock signal /CLK-K which is not shown. Like the interpolators (FIG. 8) of the first embodiment, the interpolators 196 and 200 have the input terminals /IN1 and /IN2, output terminal /OUT, and enable terminal EN which are not shown. Here, these signals are omitted of illustration for the sake of simplicity. In this embodiment, the interpolators 196 and 200 are identical with one another, and have identical characteristics.

The interpolators 196 in the delay circuit 198, exclusive of the initial stage 196-6, receive the internal clock signal CLK-K at the input terminals IN1 and IN2 alternately. The interpolator 196-6 is connected with a ground line VSS at the input terminal IN1, and receives the internal clock signal CLK-K at the input terminal IN2. The interpolator 196-6 also is supplied with the control voltage VMIN and a control voltage $\beta6$ at the control terminals $\alpha$ and $\beta$, respectively. The interpolators 196-1 to 196-5 are supplied with control voltages $\alpha1$–$\alpha5$ and $\beta1$–$\beta5$ at the control terminals $\alpha$ and $\beta$, respectively. Through the output terminal OUT of the interpolator 196-1 is output an internal clock signal CLKIA.

The interpolator 200-2 in the delay circuit 202 is connected with the ground line VSS at the input terminal IN1, and receives the internal clock signal CLK-K at the input terminal IN2. The interpolator 200-2 also is supplied with the control voltage VMIN and the control voltage VMAX at the control terminals $\alpha$ and $\beta$, respectively. The interpolator 200-1 receives the output of the interpolator 200-2 at the input terminal IN1, and receives the internal clock signal CLK-K at the input terminal IN2. The interpolator 200-1 also is supplied with the control voltages V1 and V2 at the control terminals $\alpha$ and $\beta$, respectively. Through the output terminal OUT of the interpolator 200-1 is output an internal clock signal CLKIB having the same phase as that of the internal clock signal CLKIA.

The composite circuit 204 receives the select signals SELB and /SELB, synthesizes the internal clock signals CLKIA and CLKIB, and outputs the resultant as the internal clock signal CLKI. The composite circuit 204 outputs the internal clock signal CLKIB as the internal clock signal CLKI on receiving the select signal SELB of high level (/SELB=low level), and outputs the internal clock signal CLKIA as the internal clock signal CLKI on receiving the select signal SELB of low level (/SELB=high level). In addition, the composite circuit 204, as described later, receives the internal clock signals CLKIA and CLKIB in identical phase when the select signals SELB and /SELB are switched. Therefore, switching the select signals SELB and /SELB causes no jitter to the internal clock signal CLKI.

The initializing circuit 206 receives the start signal STT, the control voltage VMIN, the control voltage VMAX, and the internal clock signal CLKI, and outputs a control voltage V3. The initializing circuit 206 is activated in the initial adjustment to be described later.

Figure 55:
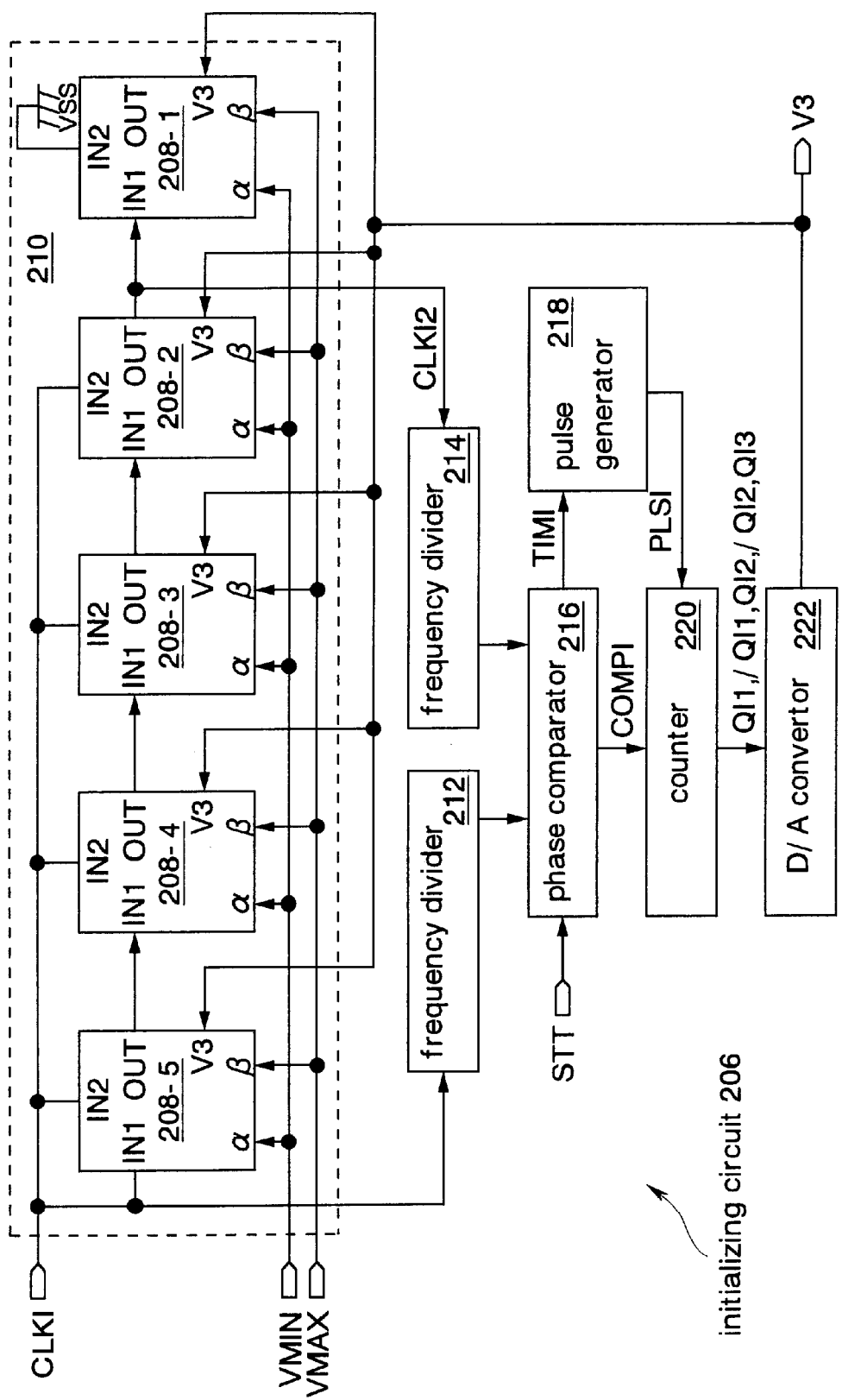
FIG. 55 is a block diagram showing the initializing circuit in FIG. 53.

FIG. 55 shows the details of the initializing circuit 206.

The initializing circuit 206 comprises: a delay circuit 210 consisting of five interpolators 208 connected in series; frequency dividers 212 and 214; a phase comparator 216; a pulse generator 218; a counter 220; and a D/A converter 222. The interpolators 208 are identical with the interpolators 196 and 200 shown in FIG. 54, and have the same characteristics. The delay circuit 210 corresponds to the adjustment delay circuit 320 shown in FIG. 5. Moreover, the phase comparator 216, pulse generator 218, counter 220, and D/A converter 222 correspond to the adjustment circuit 322 shown in FIG. 5.

The interpolator 208-2 to the interpolator 208-5 receive the internal clock signal CLKI at the input terminals IN2, and are supplied with the control voltage VMIN and the control voltage VMAX at the control terminals α and β, respectively. The interpolator 208-5 receives the internal clock signal CLKI at the input terminal IN1. The interpolators 208-1 to 208-4 receive the output signals of the previous stages at the input terminals IN1. The interpolator 208-1 is connected with the ground line VSS at the input terminal IN2, and is supplied with the control voltage VMIN and the control voltage VMAX at the control terminals α and β, respectively. The interpolator 208-2 outputs an internal clock signal CLKI2. As described later, the interpolator 208-2 to the interpolator 208-5 are circuits for delaying the received clock signals by 90° in phase. The interpolator 208-1 functions as a load.

The frequency divider 212 divides the frequency of the received internal clock signal CLKI to a fourth for output. The frequency divider 214 divides the frequency of the received internal clock signal CLKI2 to a fourth for output. The frequency dividers 212 and 214 are identical with the first frequency divider 82 (FIG. 13) of the first embodiment. Here, the frequency dividers 212 and 214 may also be removed so that the internal clock signals CLKI and CLKI2 are compared each time.

The phase comparator 216 compares the phases of the clock signals received from the frequency dividers 212 and 214, and outputs a comparison result signal COMPI and a timing signal TIMI. The phase comparator 216 has the same configuration as that of the phase comparator 90 (FIG. 17) in the first embodiment.

The pulse generator 218 generates a pulsed signal PLSI in synchronization with the timing signal TIMI from the phase comparator 216.

The counter 220 receives the pulsed signal PLSI and operates as a 3-bit counter (QI1, /QI1, QI2, /QI2, and QI3). The counter 220 increments the counter value when the comparison result signal COMPI is at high level, and decrements the counter value when the comparison result signal COMPI is at low level.

The D/A converter, 222 receives the counter value from the counter 220, and outputs eight possible values of control voltage V3 in accordance with this counter value. The control voltage V3 is supplied to all of the interpolators 196, 200, and 208.

Figure 56:
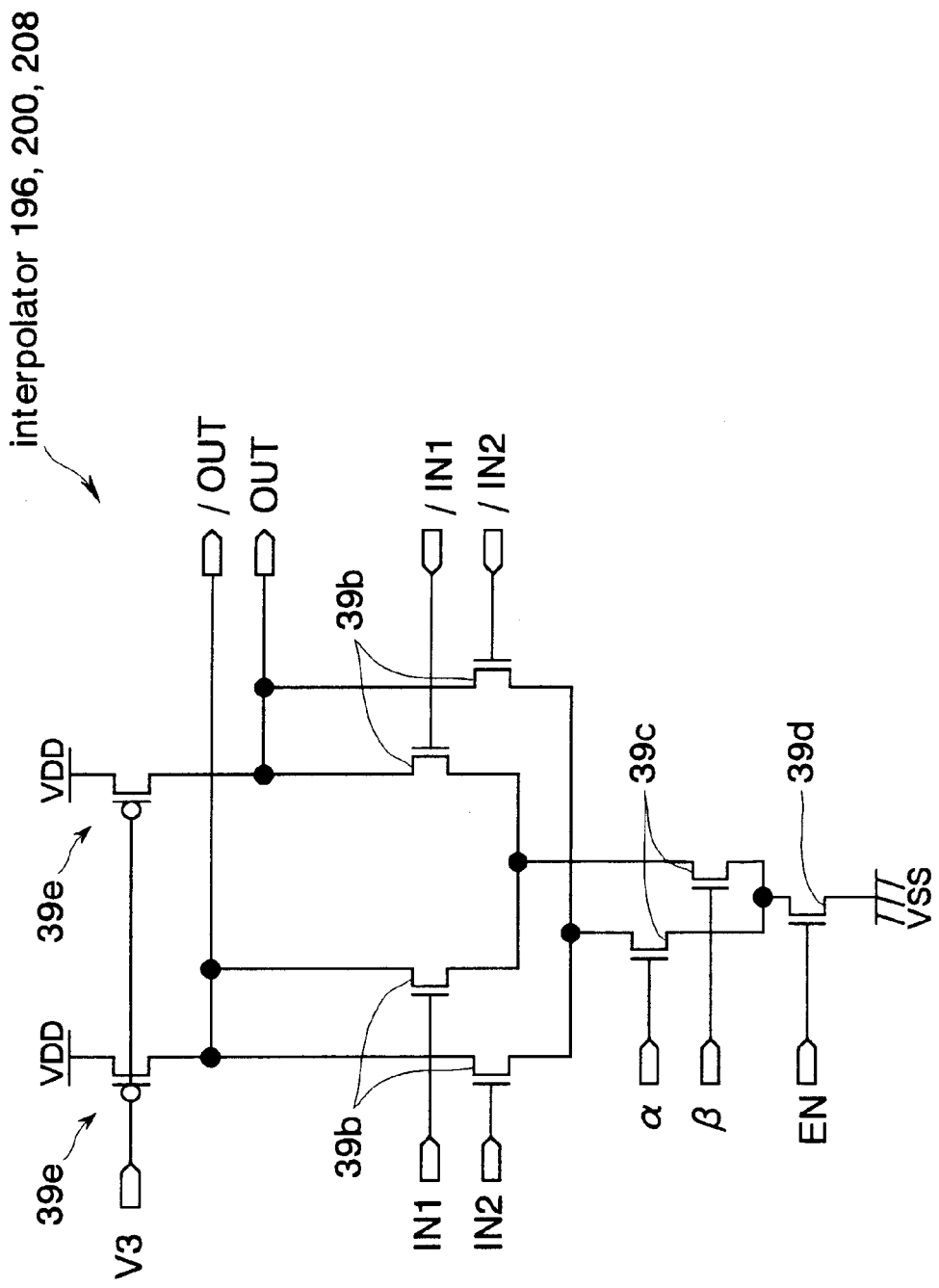
FIG. 56 is a circuit diagram showing an interpolator in FIGS. 54 and 55.

FIG. 56 shows the details of the interpolators 196, 200, and 208.

The interpolators 196, 200, and 208 have pMOSs 39e whose currents are controlled by the control voltage V3, instead of the constant-current sources 39a in the interpolators 39 (FIG. 8) of the first embodiments. They otherwise have the same configuration as that of the interpolators 39.

Figure 57:
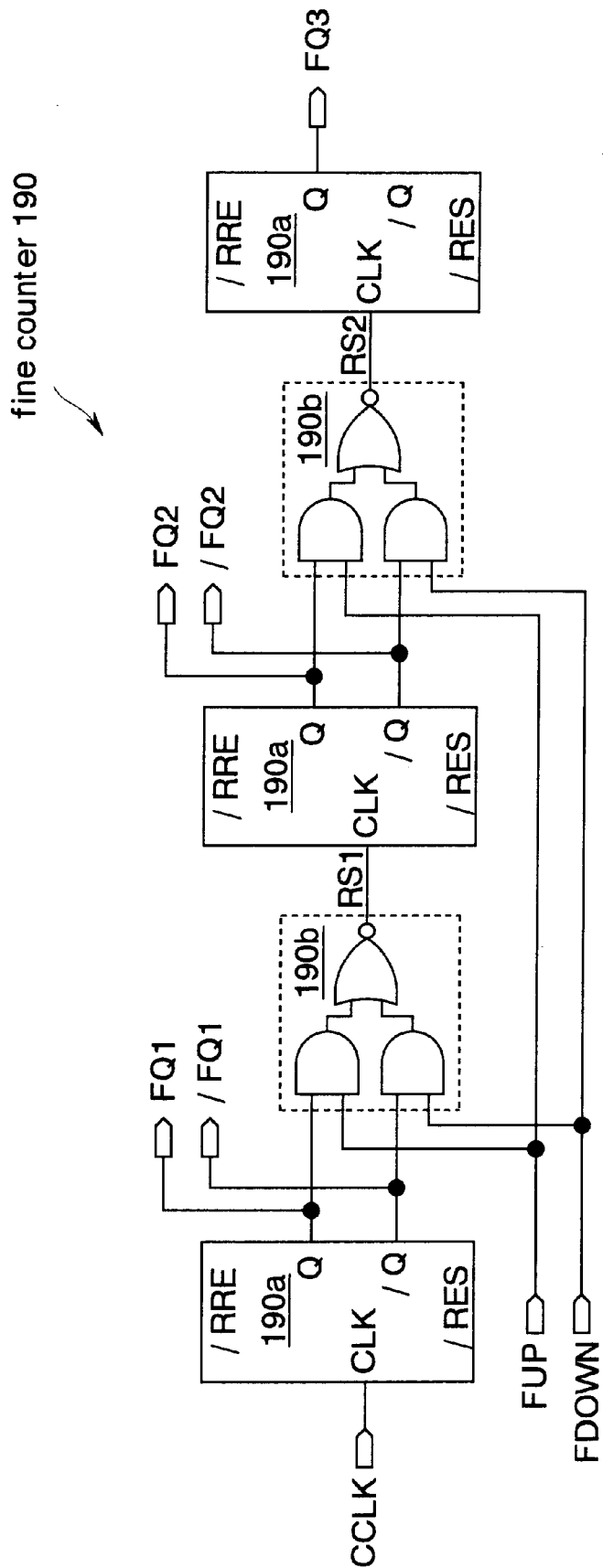
FIG. 57 is a circuit diagram showing the fine counter in FIG. 53.

FIG. 57 shows the details of the fine counter 190 shown in FIG. 53.

The fine counter 190 is constituted by serially connecting three flip-flops 190a each having a set function (/PRE) and a reset function (/RES).

Between adjacent two flip-flops 190a are connected control circuits 190b for controlling the increment and decrement of the counter value. The control circuits 190b transmit the inverted logic of the outputs Q to the clock terminals CLK in the next stages when the count-up signal FUP is at high level, and transmit the inverted logic of the outputs /Q to the clock terminals CLK in the next stages when the countdown signal FDOWN is at high level. The flip-flop 190a in the initial stage receives a counter clock signal CCLK at the clock terminal CLK. The counter clock signal CCLK is a signal obtained by delaying the internal clock signal CLK-K. When the phase comparator 182 shown in FIG. 53 compares the frequency-divided internal clock signal DICLK and reference clock signal REFCLK, the counter clock signal CCLK is generated in accordance with the frequency-divided internal clock signal DICLK.

When the start signal STT is activated, the fine counter 190 receives high level or low level at the set terminals /PRE and the reset terminals /RES of the respective flip-flops 190a, thereby being initialized to a predetermined counter value.

Figure 58:
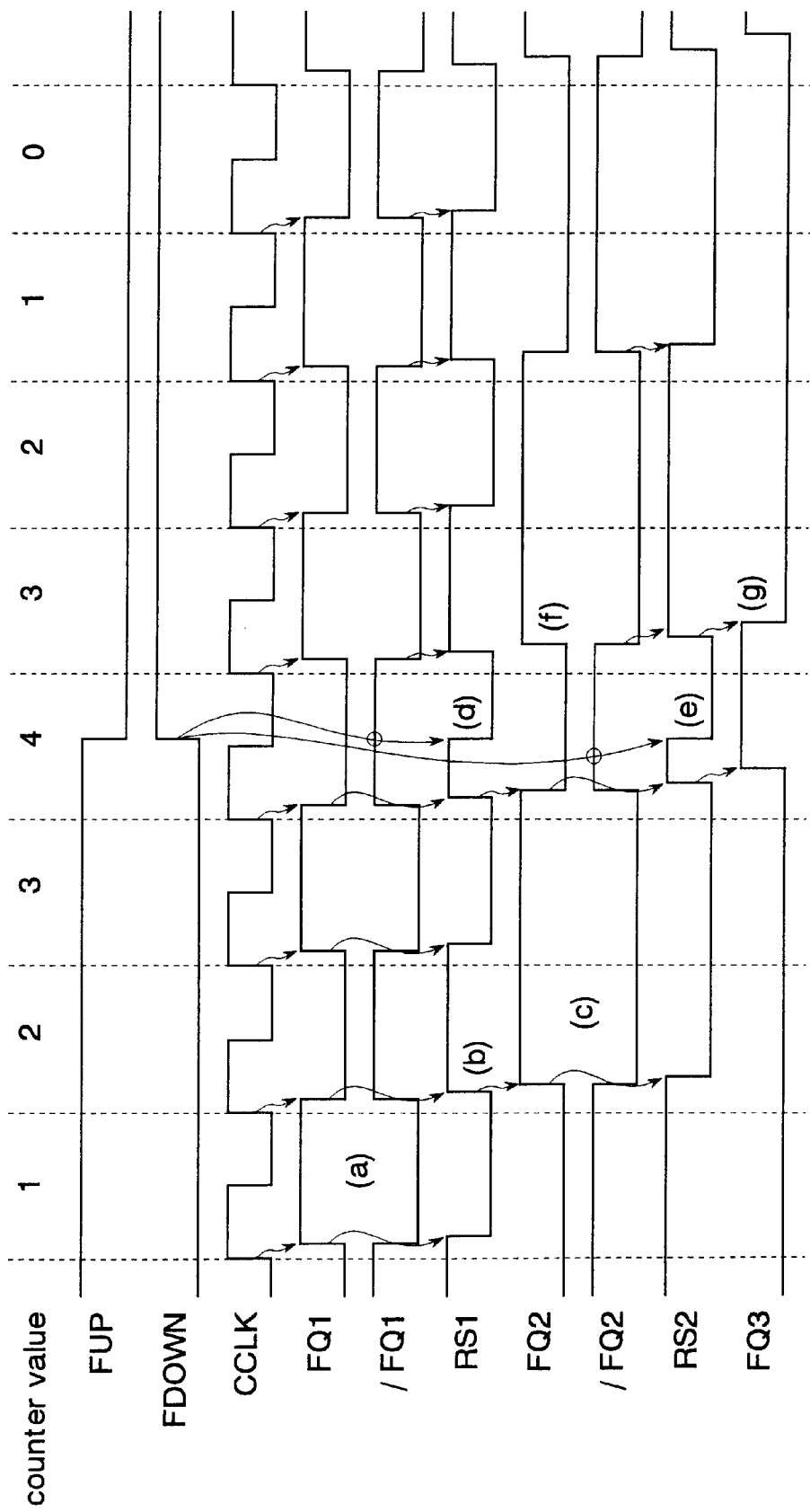
FIG. 58 is a timing chart showing the operation of the fine counter in FIG. 57.

FIG. 58 shows the operation of the fine counter 190.

Initially, the fine counter 190 operates as an incremental counter when the count-up signal UP is at high level. The flip-flop 190a in the initial stage inverts the levels of the counter signals FQ1 and /FQ1 in synchronization with the rising edge of the counter clock signal CCLK (FIG. 58(a)). The control circuit 190b receives the high level of the count-up signal UP, and transmits the inverted signal RS1 of the counter signal FQ1 to the clock terminal CLK of the flip-flop 190a at the next stage (FIG. 58(b)). The flip-flop 190a at the next stage inverts the levels of the counter signals FQ2 and /FQ2 in synchronization with the rising edge of the inverted signal RS1 (FIG. 58(c)). Then, the counter signal FQ3 is generated in the same manner.

Besides, the fine counter 190 operates as a decremental counter when the countdown signal FDOWN is at high level. Here, the respective control circuits 190b transmit the inverted signal RS1 of the counter signal /FQ1 and the inverted signal RS2 of the counter signal /FQ2 to the flip-flops 109a in the next stages (FIG. 58(d) and (e)). Accordingly, for example, the counter signal FQ2 varies in synchronization with the rise of the counter signal FQ1 (FIG. 58(f)), and the counter signal FQ3 varies in synchronization with the rise of the counter signal FQ2 (FIG. 58(g)).

Figure 59:
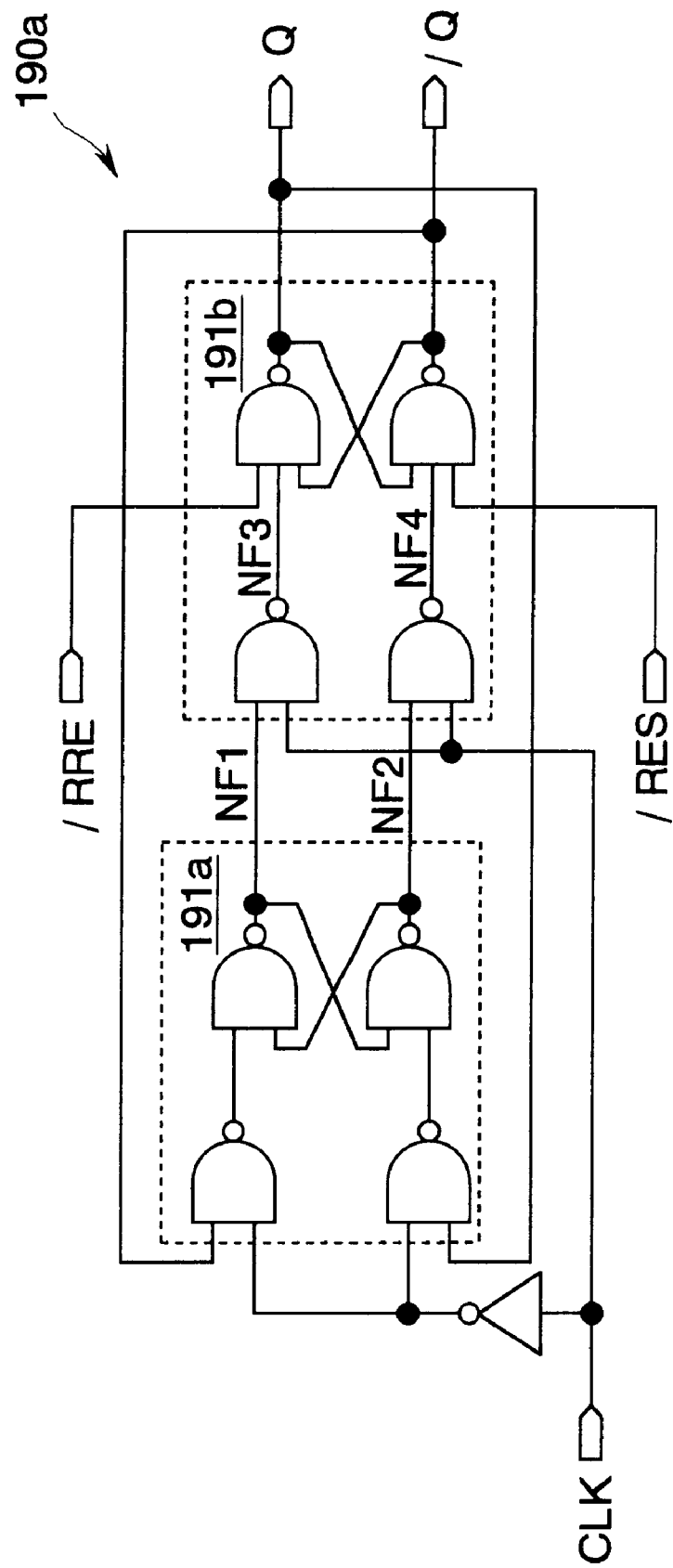
FIG. 59 is a circuit diagram showing a flip-flop in FIG. 57.

FIG. 59 shows the details of the flip-flops 190a shown in FIG. 57.

A flip-flop 190a consists of two flip-flops 191a and 191b connected in series. The flip-flops 191a and 191b are composed of: two NAND gates having their outputs fed back to each other; and two NAND gates for respectively controlling the inputs of the NAND gates.

The inputs of the flip-flop 191a in the previous stage receive the clock signal CLK and the inverted signal thereof. Inputs of the flip-flop 191b in the subsequent stage receive the clock signal CLK. The NAND gates on the output side of the flip-flop 191b in the subsequent stage receive the set signal /PRE and the reset signal /RES.

Figure 60:
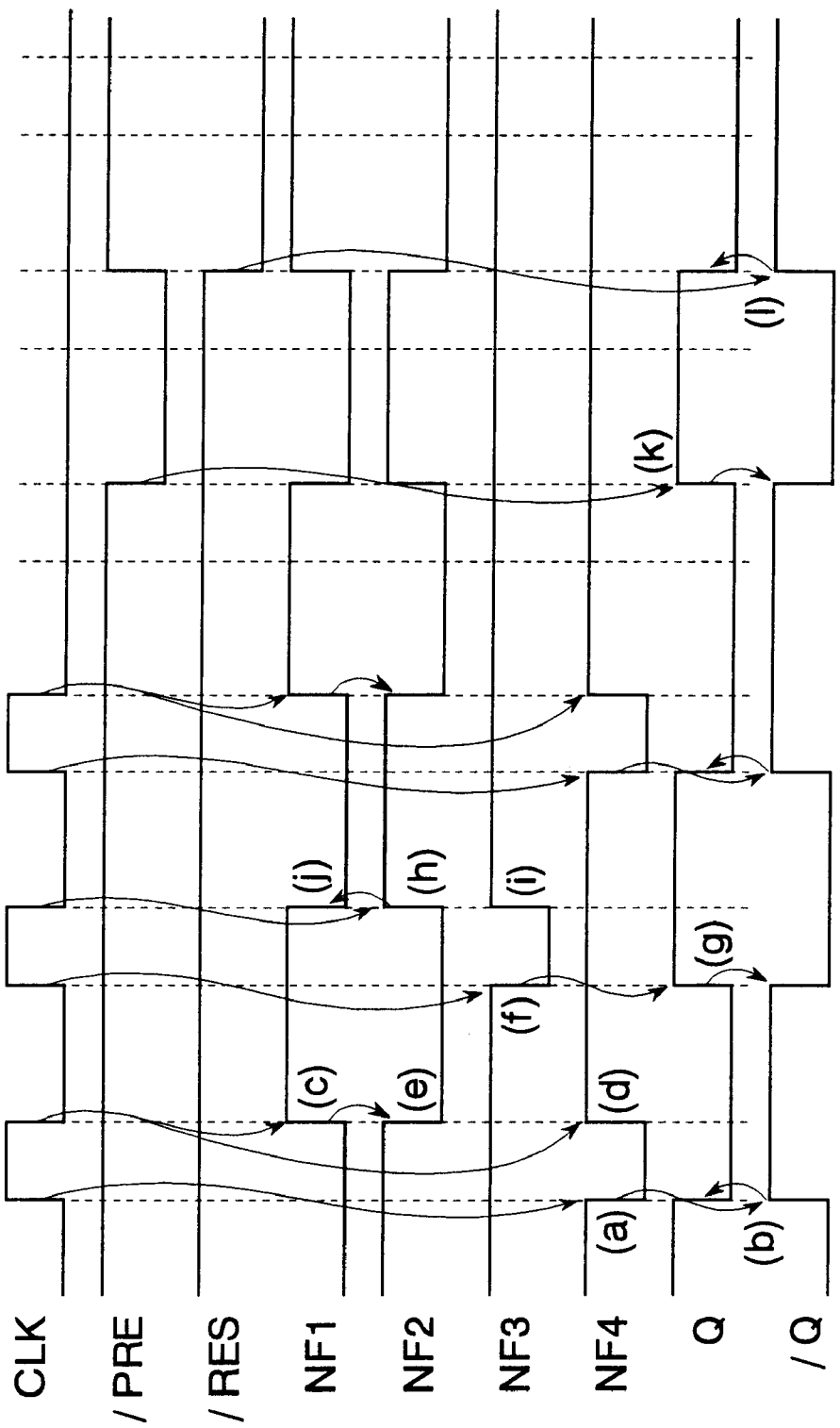
FIG. 60 is a timing chart showing the operation of the flip-flop in FIG. 57.

FIG. 60 shows the operation of the flip-flop 190a.

Initially, the high level of the node NF2 is transmitted to the flip-flop 191b in synchronization with the rise of the clock signal CLK, whereby the node NF4 is turned to low level (FIG. 60(a)). Under the low level of the node NF4, the flip-flop 191b turns the outputs /Q and Q to high level and low level, respectively (FIG. 60(b)).

Then, in synchronization with the fall of the clock signal CLK, the node NF1 is turned to high level, and the node NF4 is turned to high level (FIG. 60(c) and (d)). The node NF2 is turned to low level under the high level of the node NF1 (FIG. 60(e)).

Then, the high level of the node NF1 is transmitted to the flip-flop 191b in synchronization with the rise of the clock signal CLK, whereby the node NF3 is turned to low level (FIG. 60, (f)). Under the low level of the node NF3, the flip-flop 191b turns the outputs Q and /Q to high level and low level, respectively (FIG. 60(g)).

Then, in synchronization with the fall of the clock signal CLK, the node NF2 is turned to high level, and the node NF3 is turned to high level (FIG. 60(h) and (i)). The node NF1 is turned to low level under the high level of the node NF2 (FIG. 60(j)). The above-described operation is repeated in the same manner, so that the outputs Q and /Q are turned to high level and low level alternately in synchronization with the rises of the clock signal CLK.

Moreover, on receiving the low level of the set signal /PRE, the flip-flop 191b turns the outputs Q and /Q to high level and low level, respectively (FIG. 60(k)). On receiving the low level of the reset signal /RES, the flip-flop 191b turns the outputs Q and /Q to low level and high level, respectively (FIG. 60(l)).

Figure 61:
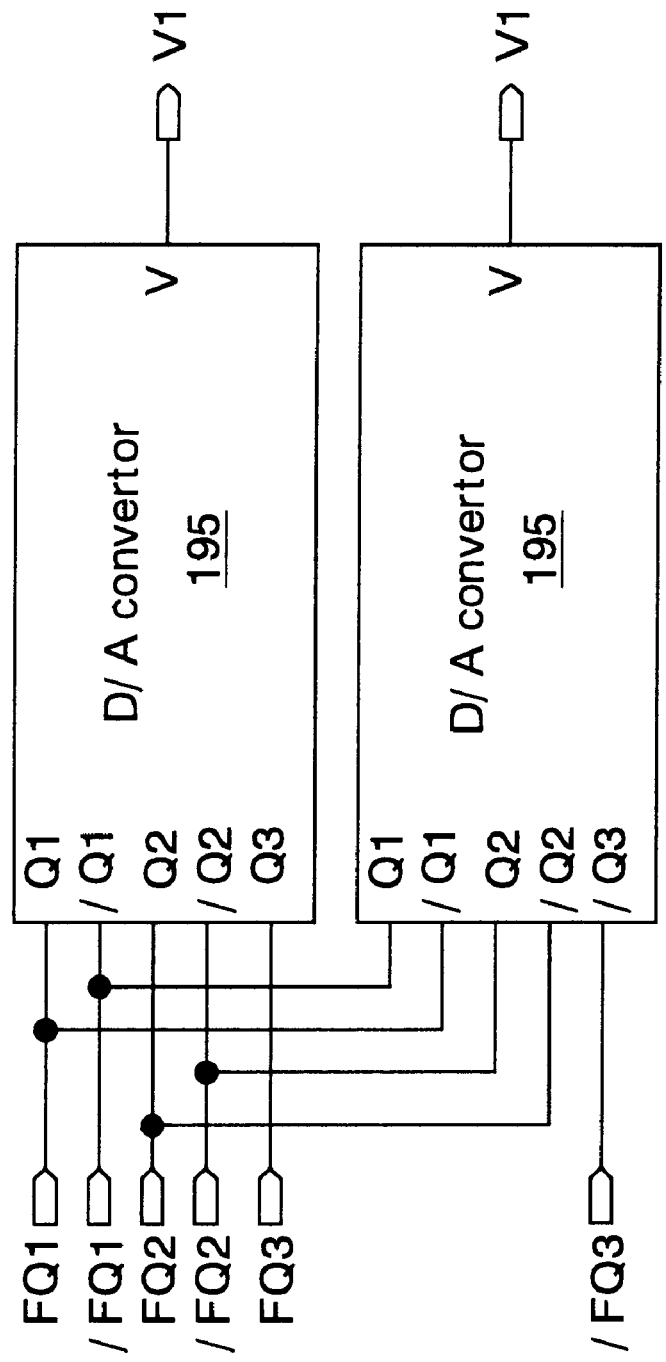
FIG. 61 is a block diagram showing the D/A converter in FIG. 53.

FIG. 61 shows the D/A converter 194 shown in FIG. 53.

The D/A converter 194 consists of two D/A converters 195. The D/A converter 195 for generating the control voltage V1 receives the counter signals FQ1, /FQ1, FQ2, /FQ2, and FQ3 at the input terminals Q1, /Q1, Q2, /Q2, and Q3, respectively. The D/A converter 195 for generating the control voltage V2 receives the counter signals /FQ1, FQ1, /FQ2, FQ2, and /FQ3 at the input terminals Q1, /Q1, Q2, /Q2, and Q3, respectively.

Figure 62:
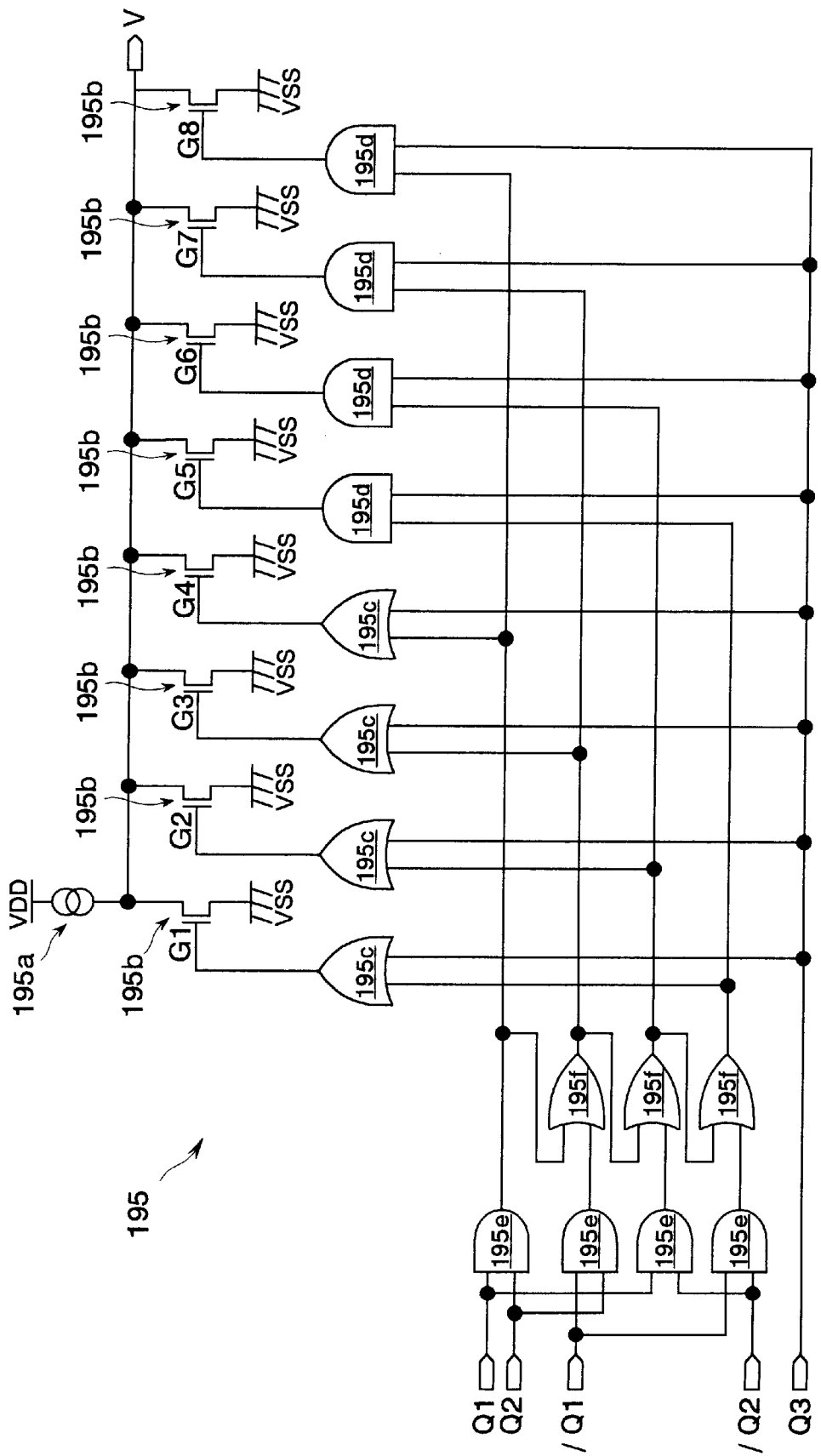
FIG. 62 is a circuit diagram showing a D/A converter in FIG. 61.

FIG. 62 shows the details of the D/A converters 195.

A D/A converter 195 comprises: eight nMOSs 195b whose sources are connected to the ground line VSS and whose drains are connected to a constant-current source 195a; four OR gates 195c whose output nodes are connected to the gates G1–G4 of the nMOSs 195b; four AND gates 195d whose output nodes are connected to the gates G5–G8 of the nMOSs 195b; four AND gates 195e which control the OR gates and the AND gates; and three OR gates 195f.

The AND gates 195e function as decoders for the counter signals Q1, /Q1, Q2, and /Q2. Each of the OR gates 195f outputs an OR signal of a decode signal and the upper decode signal.

Figure 63:
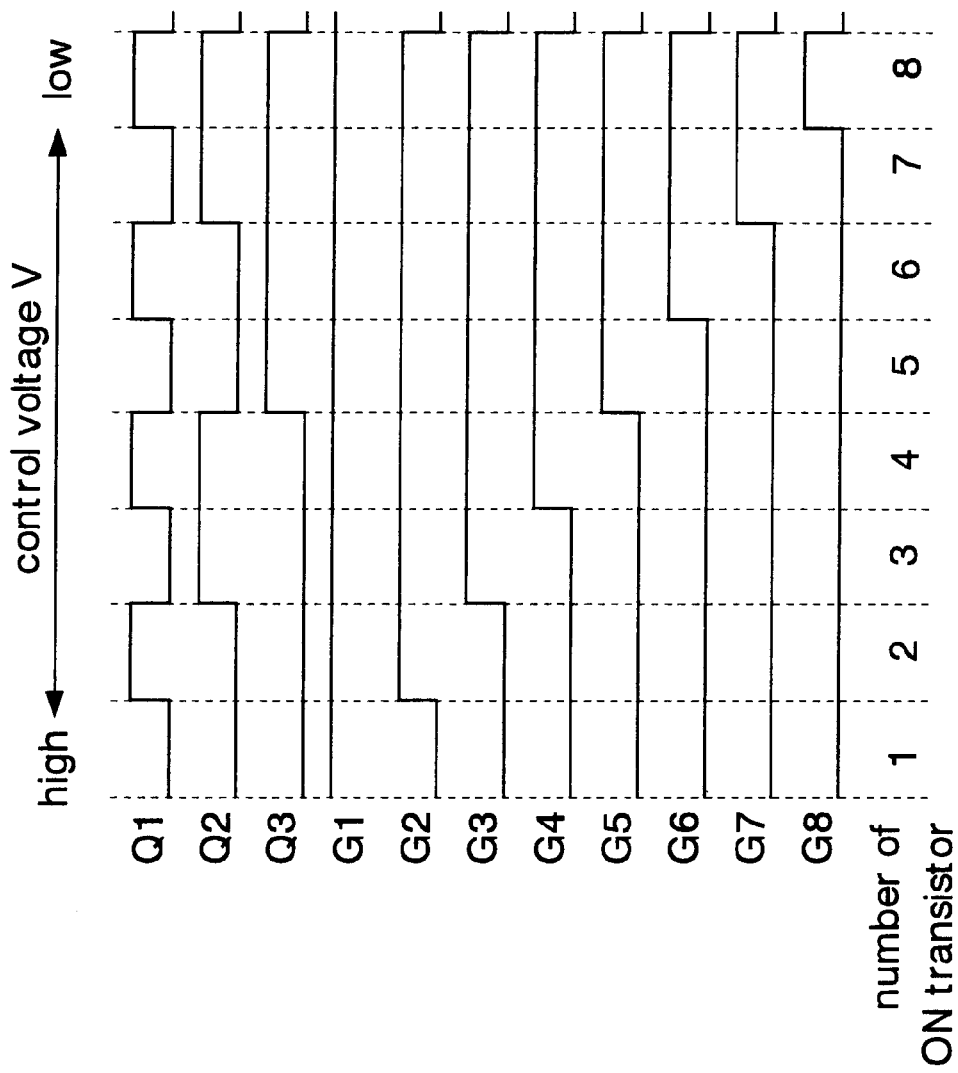
FIG. 63 is a timing chart showing the operation of the D/A converter in FIG. 62.

FIG. 63 shows the operation of the D/A converter 195.

The D/A converter 195 sequentially switches the gates G1–G8 of the nMOSs on as the counter signals Q1, Q2, and Q3 increase. Consequently, the control voltage V decreases in inverse proportion to the counter value.

Figure 64:
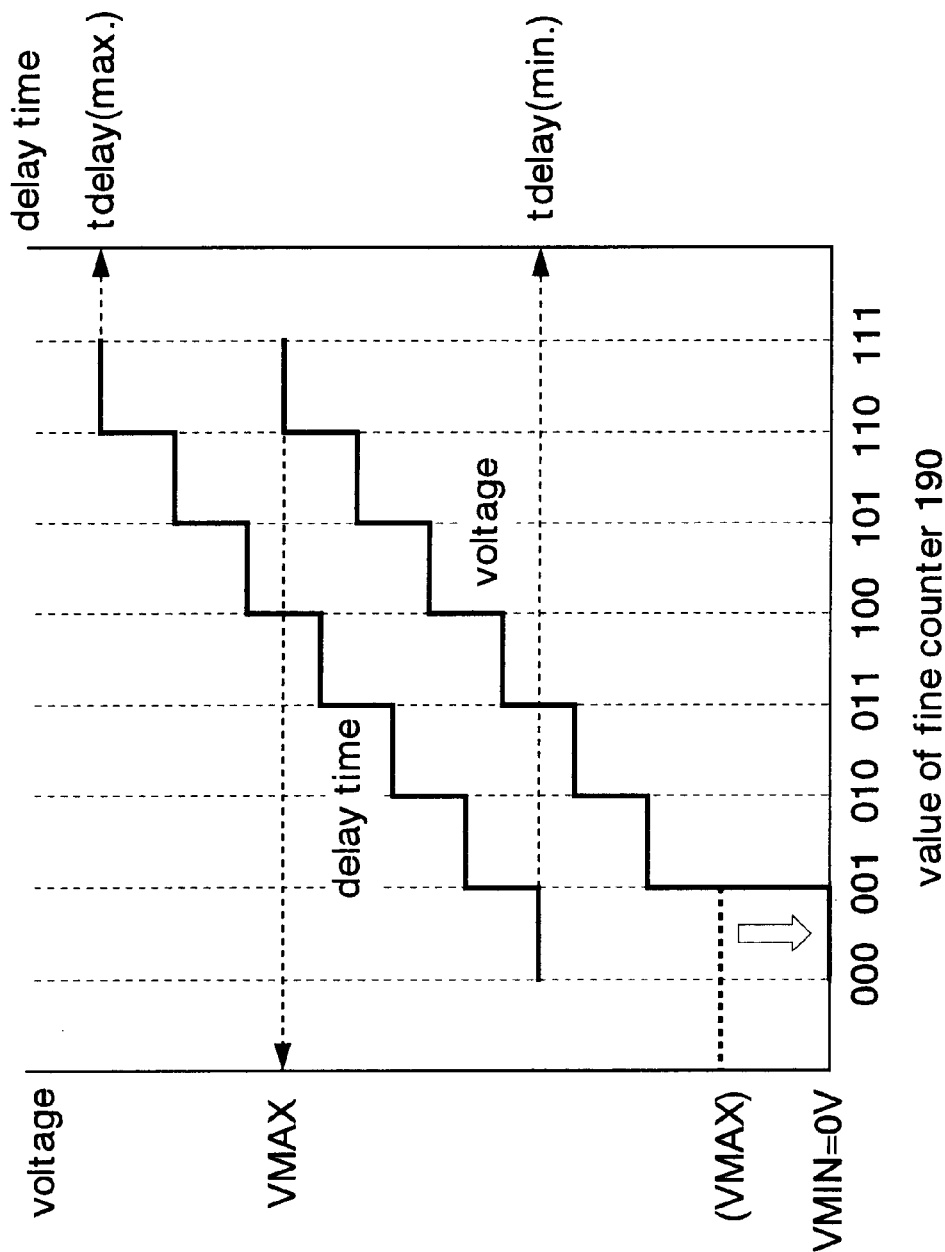
FIG. 64 is an explanatory diagram showing the relationship between the output voltage of the D/A converter in FIG. 62 and the delay time of an interpolator.

FIG. 64 shows the relationship among the counter value received by the D/A converter 195, the output voltage of the same, and the delay time of an interpolator.

In an ordinary D/A converter, the control voltages VMAX and VMIN include a predetermined offset with respect to the power supply VDD and the ground voltage VSS, respectively. The reason for this is to make constant (linear) the variations of the D/A converter's output voltage and the variations of the interpolator delay time with respect to the counter value. In the present invention, however, in the case where the control voltage VMIN has an offset, the interpolator can possibly make phase adjustment even when the counter value is "0." More specifically, control voltages VMIN exceeding the threshold value of the interpolators 196, 200, and 208 preclude proper phase adjustments.

On this account, the D/A converter 195 in the present embodiment forcefully sets the control voltage VMIN to the ground voltage VSS when the counter value is "0."

Figure 65:
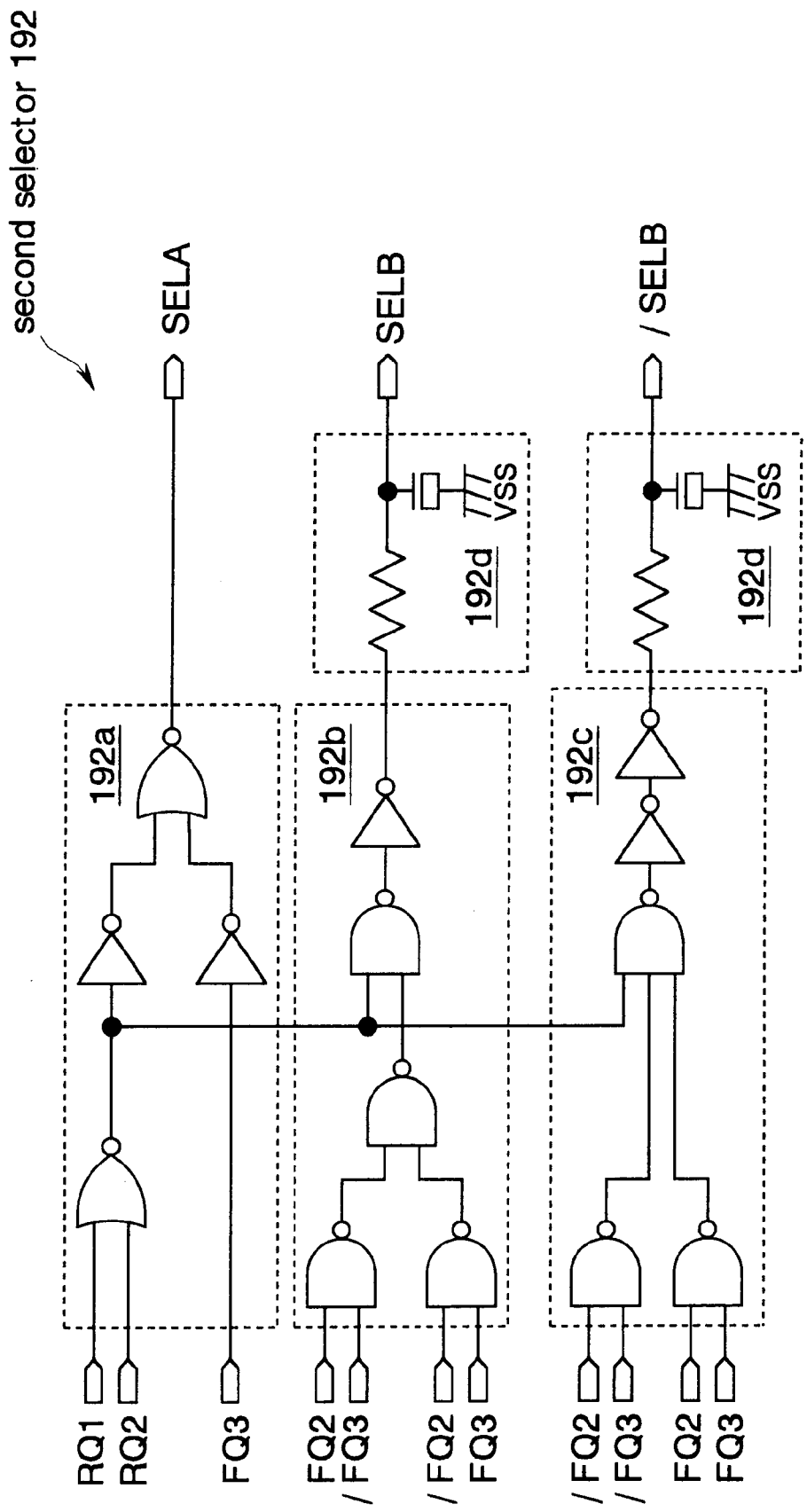
FIG. 65 is a circuit diagram showing the second selector in FIG. 53.

FIG. 65 shows the details of the second selector 192 shown in FIG. 53.

The second selector 192 comprises: a combinational circuit 192a having NOR gates and inverters, for generating the select signal SELA; combinational circuits 192b and 192c having NAND gates and an inverter or inverters, for generating the select signals SELB and /SELB, respectively; and CR time constant circuits 192d for smoothing the waveforms of the select signals SELB and /SELB. Smoothing the waveforms of the select signals SELB and /SELB by the CR time constant circuits 192d allows the composite circuit 204 shown in FIG. 54 to gradually switch the internal clock signals CLKIA and CLKIB.

The combinational circuit 192a is a circuit for turning the select signal SELA to high level when the rough counter 188 shown in FIG. 53 is "0" in counter value (RQ1=L, RQ2=L) and the fine counter 190 is "4, 5, 6, or 7" in counter value.

The combinational circuit 192b is a circuit for turning the select signal SELB to high level when the rough counter 188 is "0" in counter value (RQ1=L, RQ2=L) and the fine counter 190 is "2, 3, 4, or 5" in counter value The combinational circuit 192c is a circuit for turning the select signal /SELB to low level when the rough counter 188 is "0" in counter value(RQ1=L, RQ2=L) and the fine counter 190 is "2, 3, 4, or 5" in counter value.

By the way, as described later, the phase of the internal clock signal CLKI with respect to the internal clock signal CLK-K is shifted in eight possible ways by 11° within the range of 0–90° in accordance with the counter value of the fine counter 190 when the rough counter 188 is "0" in counter value.

Accordingly, the logic of the combinational circuit 192a turns the select signal SELA to high level when the phase of the internal clock signal CLKI is shifted by 45–90° from the phase of the internal clock signal CLK-K. The logic of the combinational circuits 192b and 192c turns the select signals SELB and /SELB to high level and low level, respectively, when the phase of the internal clock signal CLKI is shifted by 22.5–67.5° from the phase of the internal clock signal CLK-K.

Figure 66:
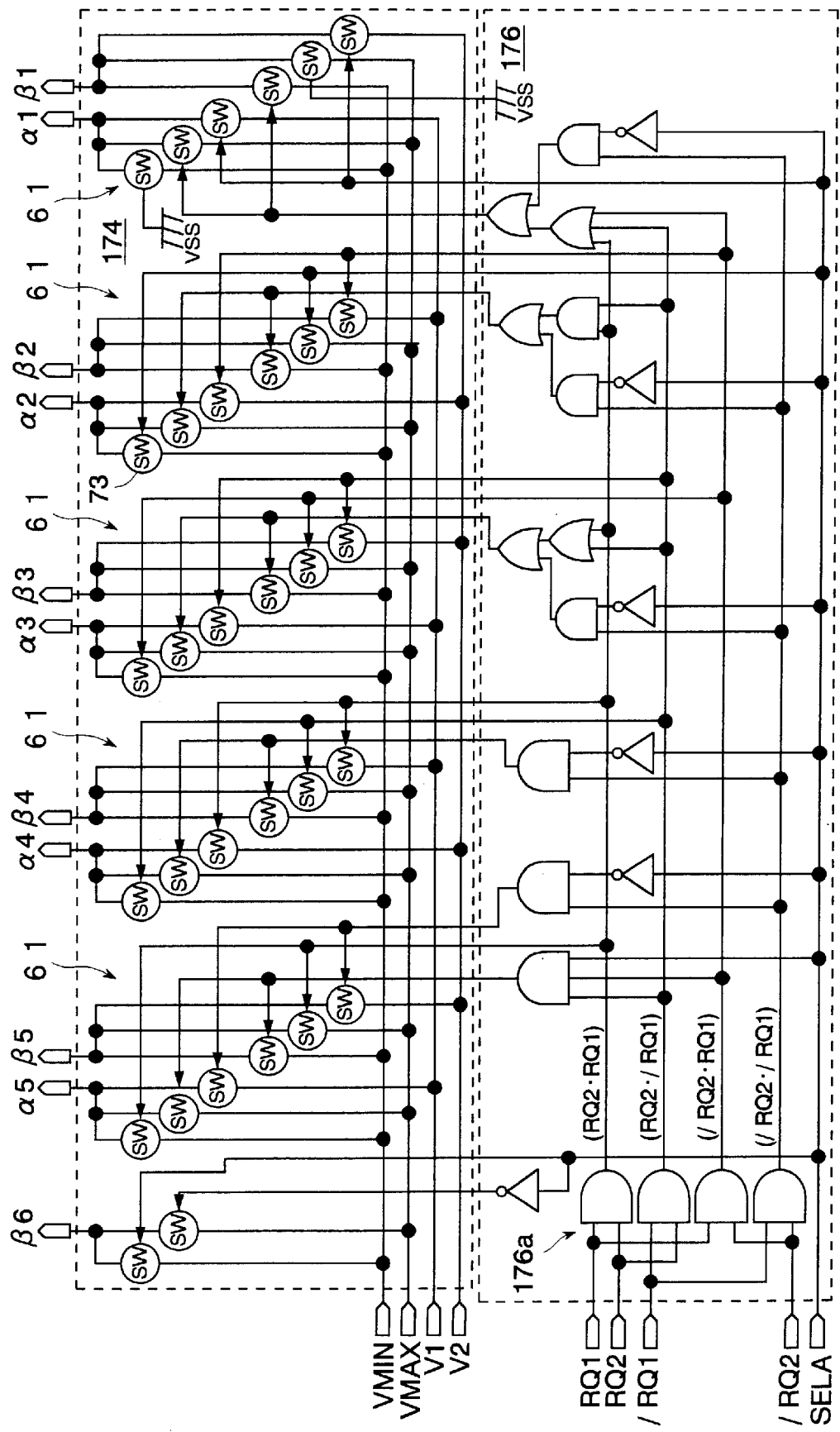
FIG. 66 is a circuit diagram showing the switching circuit and the first selector in FIG. 53.

FIG. 66 shows the details of the switching circuit 174 and the first selector 176 shown in FIG. 53.

The switching circuit 174 is a circuit that makes the same operation as that of switching signal 59 (FIG. 7) in the first embodiment. The switching circuit 174 outputs one of the control voltages VMIN, VMAX, V1, and V2 through the control terminals $\alpha 1$–$\alpha 5$ and $\beta 1$–$\beta 5$, and outputs either of the control voltages VMIN and VMAX through the control terminals $\alpha 6$ and $\beta 6$. The switching circuit 174 has switch parts 61 (identical with those of the first embodiment in FIG. 9) corresponding to the control terminals $\alpha 1$–$\alpha 5$ and $\beta 1$–$\beta 5$.

The first selector 176 receives the counter signals RQ1, /RQ1, RQ2, and /RQ2 from the rough counter 188, and the select signal SELA, and outputs the control signals for controlling the switching circuit 174. The first selector 176 comprises decoders 176a for generating decode signals from the counter signals RQ1, /RQ1, RQ2, and /RQ2, and a combinational circuit having a plurality of AND gates and inverters.

FIG. 67 shows an overview of the operations of the switching circuit 174 and the first selector 176.

When supplying the control voltages V1 and V2 to the control terminals α and β of a predetermined interpolator (196-3, for example) in the delay circuit 198, the switching circuit 174 and the first selector 176 supply the control voltage VMIN and the control voltage VMAX to the control terminals α and β of the adjacent interpolator at the previous stage (196-4, for example), and supply the control voltage VMAX and the control voltage VMIN to the control terminals α and β of all the subsequent interpolators (196-2 and 196-1, for example).

The interpolator 196-1 is supplied with the control voltages V1 and V2 when the counter signals RQ2=L and RQ1=L and the select signal SELA=H. This condition is used in shifting the phase of the internal clock signal CLKI by 45–90° with respect to the phase of the internal clock signal CLK-K.

The interpolator 196-2 is supplied with the control voltages V1 and V2 when the counter signals RQ2=L and RQ1=H. This condition is used in shifting the phase of the internal clock signal CLKI by 90–180° with respect to the phase of the internal clock signal CLK-K.

The interpolator 196-3 is supplied with the control voltages V1 and V2 when the counter signals RQ2=H and RQ1=L. This condition is used in shifting the phase of the internal clock signal CLKI by 180–270° with respect to the phase of the internal clock signal CLK-K.

The interpolator 196-4 is supplied with the control voltages V1 and V2 when the counter signals RQ2=H and RQ1=H. This condition is used in shifting the phase of the internal clock signal CLKI by 270–360° with respect to the phase of the internal clock signal CLK-K.

The interpolator 196-5 is supplied with the control voltages V1 and V2 when the counter signals RQ2=L and RQ1=L and the select signal SELA=L. This condition is used in shifting the phase of the internal clock signal CLKI by the range of 0–45° with respect to the phase of the internal clock signal CLK-K.

Figure 68:
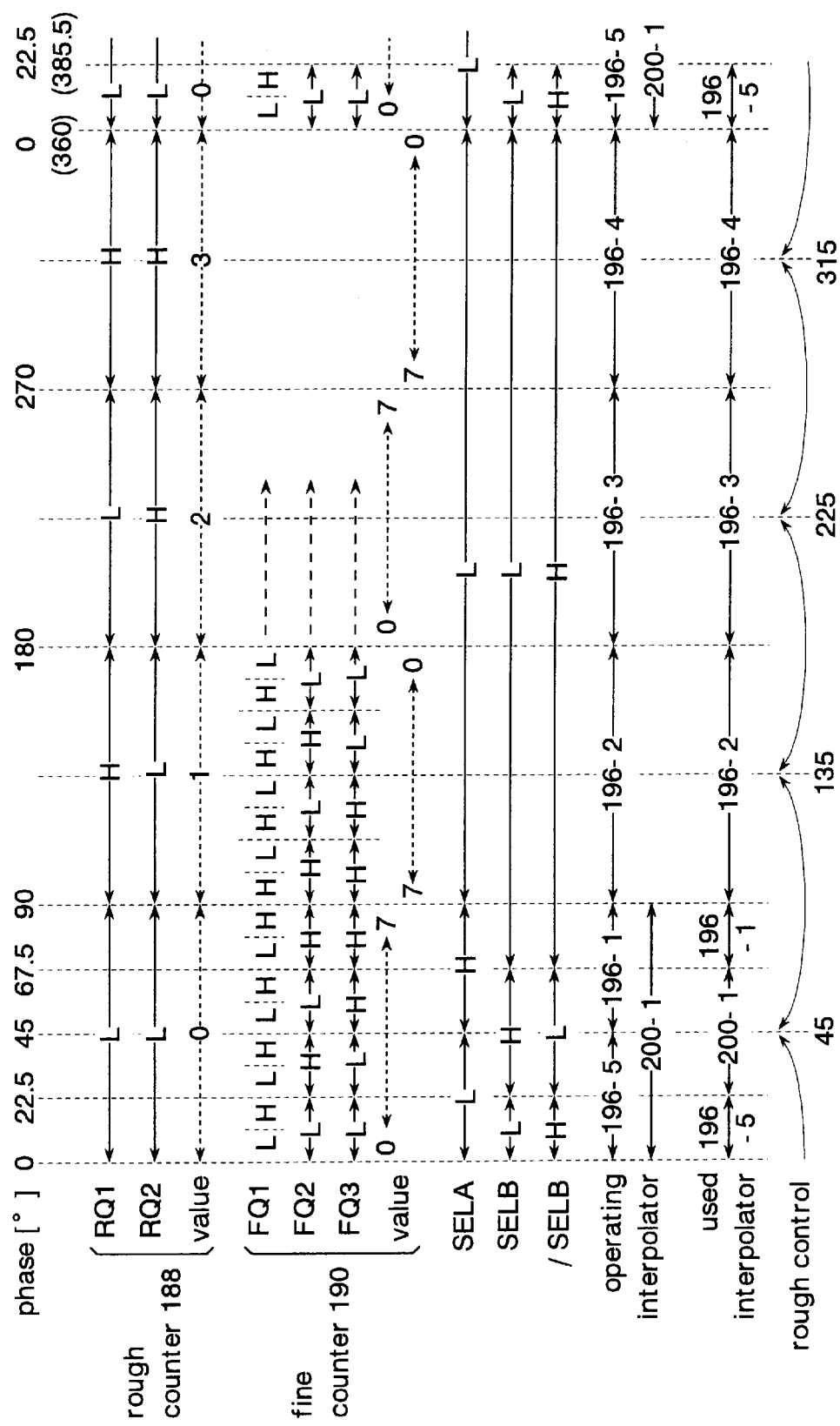
FIG. 68 is an explanatory diagram showing the states of the interpolators in FIG. 54.

FIG. 68 shows the states of the rough counter 188, the fine counter 190, and the interpolators 196 and 200 operating in accordance with the select signals SELA, SELB, and /SELB.

The phase of the internal clock signal CLKI with respect to that of the internal clock signal CLK-K is varied by 90° depending on the value of the rough counter 188. The phase of the internal clock signal CLKI is also varied by approximately 11° within each range of 90°, depending on the value of the fine counter 190.

As described above, the select signal SELA is set to high level in the 45–90° range, and set to low level in all other ranges. As a result, in the delay circuit 198, the interpolator 196-5 operates in the 0–45° range and the interpolator 196-1 operates in the 45–90° range as shown in FIG. 67. Likewise, the interpolator 196-2 operates in the 90–180° range, the interpolator 196-3 operates in the 180–270° range, and the interpolator 196-4 operates in the 270–360° range.

Meanwhile, in the delay circuit 202, the interpolator 200-1 operates at least in the range of 0–90°. As discussed in FIG. 65, the select signal SELB (/SELB) is turned to high level (low level) when the phase of the internal clock signal CLKI is shifted in the range of 22.5–67.5° with respect to the phase of the internal clock signal CLK-K. In this case, the composite circuit 204 outputs the internal clock signal CLKIB as the internal clock signal CLKI.

Accordingly, the interpolator 196-5 is used in the 0–22.5° range, the interpolator 200-1 is used in the 22.5–67.5° range, and the interpolator 196-1 is used in the 67.5–90° range.

Figure 69:
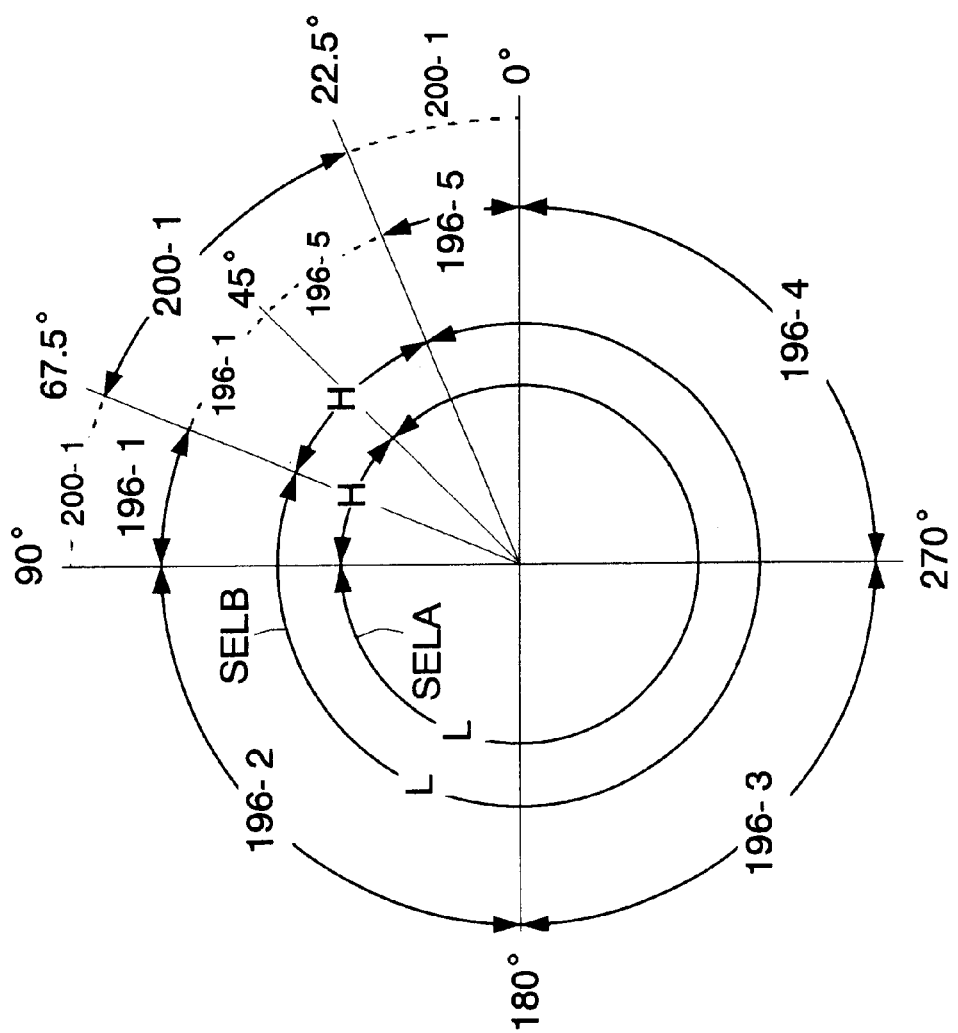
FIG. 69 is another explanatory diagram showing the states of the interpolators in FIG. 54.

FIG. 69 shows the states of the select signals SELA and SELB, and the interpolator to be operated at the respective phases. The broken-lined arcs indicate those interpolators outputting the internal clock signal CLKIA (or CLKIB) to the composite circuit 204 shown in FIG. 54, the signal not being output from the composite circuit 204 though.

In the semiconductor integrated circuit described above, the phase adjustment to the internal clock signal CLKI is performed as shown below.

Figure 70:
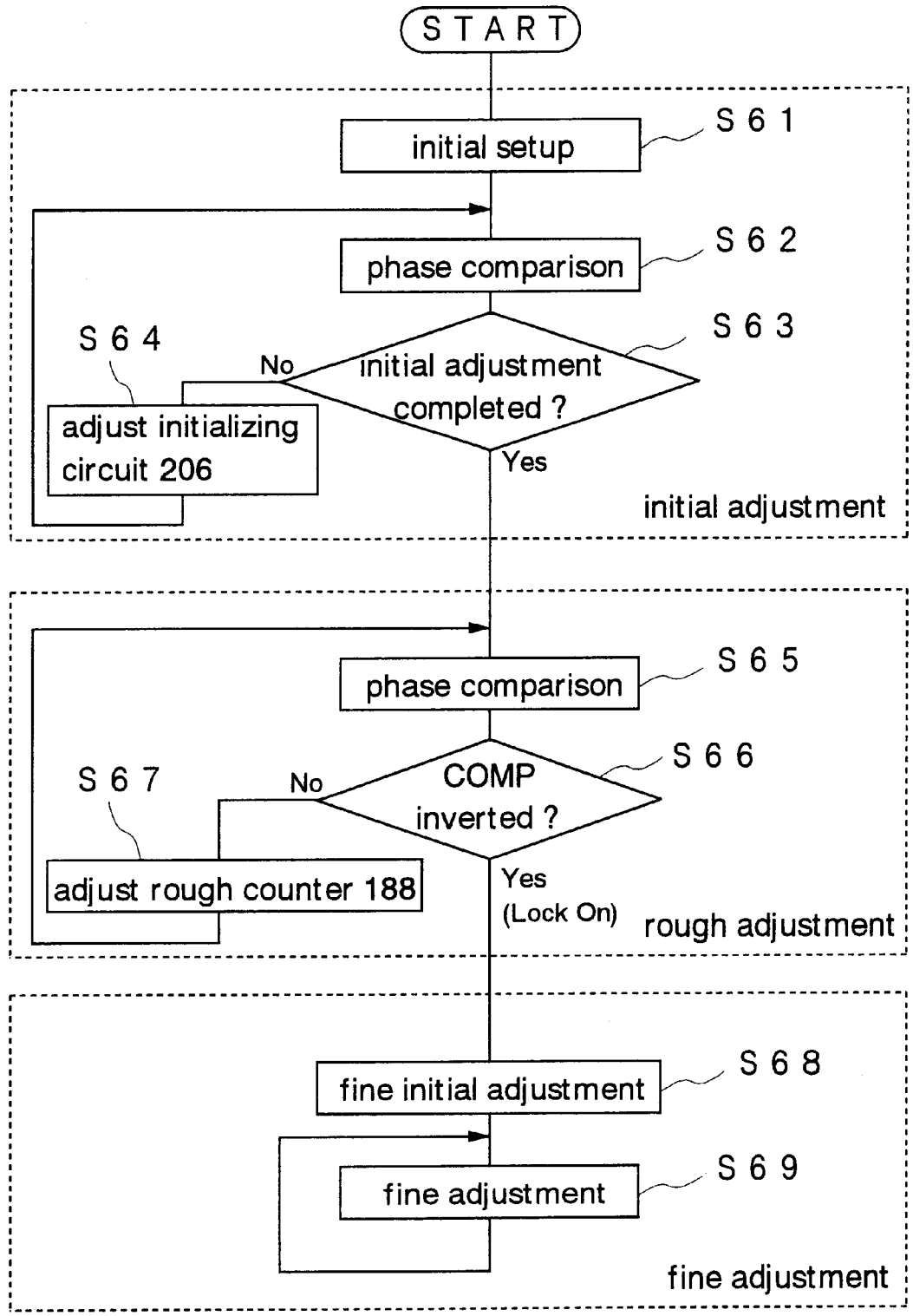
FIG. 70 is a flowchart showing the control for the phase adjustment in the fourth embodiment.

FIG. 70 is a flowchart showing the control for the phase adjustment. The phase adjustment is performed in the stages of an initial adjustment, a rough adjustment, and a fine adjustment.

(a) Initial Adjustment

The initial adjustment is chiefly performed by the initializing circuit 206 shown in FIG. 55. In the initial adjustment, as described below, the delay time of each of the interpolators 196, 200, and 208 is set to a value of a fourth (90°) the cycle of the internal clock signal CLKI.

For a start, at step S61, each circuit is initialized as in the step S1 of the first embodiment.

Then, at step S62, the phase comparator 216 in the initializing circuit 206 compares the phases of the internal clock signals CLKI and CLKI2 frequency-divided in the frequency dividers 212 and 214, and outputs the comparison result.

At step S63, the initializing circuit 206, if the phases of the signals coincide with each other (fall within a predetermined value) shifts the procedure to step S65. In step S65 or later, the initializing circuit 206 makes no phase comparison by using the phase comparator 216. Therefore, the control voltage V3 will be kept at a constant value. If the phases of the signals do not coincide with each other, then the procedure shifts to step S64.

At step S64, the counter 220 shown in FIG. 55 increments or decrements its counter value based on the comparison result. The D/A converter 222 outputs the control voltage V3 corresponding to the counter value. In response to the control voltage V3, each of the interpolators 196, 200, and 208 varies in the amount of current supply, and varies in the maximum delay time. Then, the phase of the internal clock signal CLKI2 shown in FIG. 55 varies with respect to the phase of the internal clock signal CLKI. After this, the procedure returns to step S62. Then, the internal clock signals CLKI and CLKI2 are compared in phase.

At step S63, if the phases of the internal clock signals CLKI and CLKI2 coincide with each other, the individual interpolators 196, 200, 208 have the maximum delay time, a fourth (90°) of the cycle of the internal clock signal CLKI. Consequently, the four interpolators connected in series can be used in the 0–90°, 90–180°, 180–270° and 270–360° phase adjustments to accomplish the phase adjustment to the internal clock signal CLKI.

Figure 71:
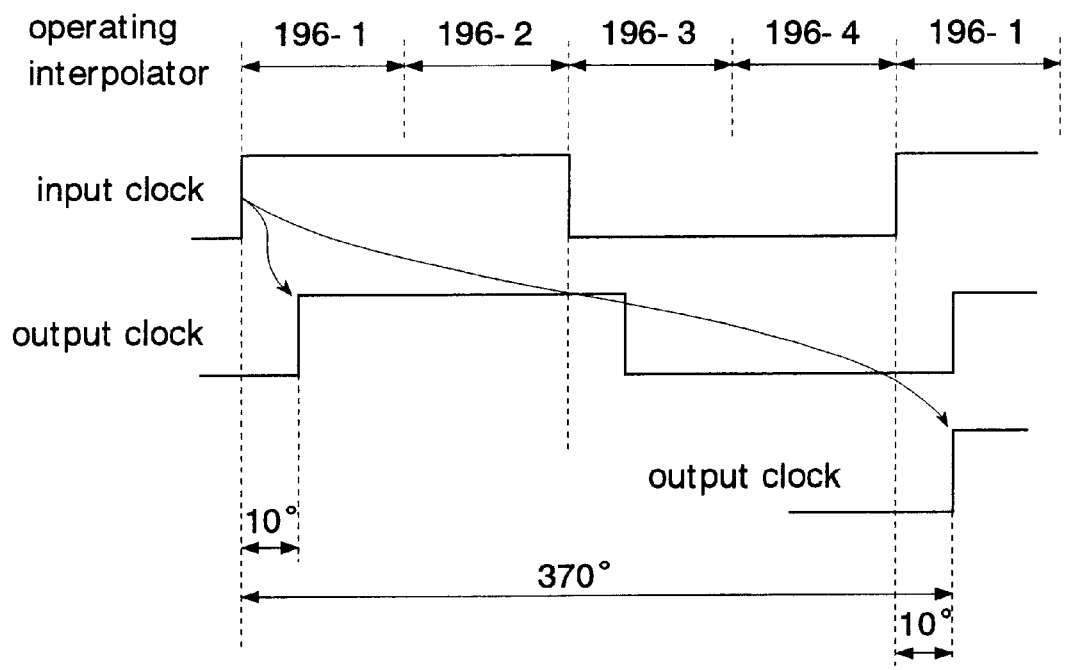
FIG. 71 is an explanatory diagram showing an example of the phase adjustment in the fourth embodiment.

FIG. 71 shows an example of the phase adjustment after the initial adjustment.

For example, an output clock delayed in phase by 370° behind an input clock has as much phase difference with respect to the input clock as an output clock delayed in phase by 10° has. Therefore, after the initial adjustment described above, the phase adjustment can be made by using the four interpolators (delay circuits) at the minimum.

However, if the phase adjustments were performed, for example, by the four interpolators 196-4, . . . , and 196-1 alone, there would occur the following problem. That is, when the interpolator 196-4 has delayed a phase by 350° with respect to the input clock and then delays the phase to 360°, the interpolator 194-4 should be switched to the interpolator 196-1. Here, as shown in FIG. 67, those control terminals α and β having been supplied with the control voltage VMAX, of the interpolators 196-3 and 196-2 should be supplied with the control voltage VMIN, and those control terminals α and β having been supplied with the control voltage VMIN should be supplied with the control voltage VMAX. As a result, the internal clock signal CLKI has jitter.

On this account, the delay circuit 198 shown in FIG. 54 has the five stages of interpolators 196 for phase adjustment, and is further provided with the delay circuit 202 having the interpolator 200-1 for overlapping the interpolators 196-1 and 196-2 in operation.

(b) Rough Adjustment

In the rough adjustment, the delay circuits 198 and 202 are used to vary the phase of the internal clock signal CLKI in steps of 90°.

Initially, at step S65, the phase comparator 182 shown in FIG. 53 compares the phases of the reference clock signal REFCLK and the internal clock signal DICLK, and outputs the comparison result.

Next, at step S66, the rough control unit 184 activates a rough lock on signal RLON and shifts the procedure to step S68 if the comparison result signal COMP output from the phase comparator 182 is inverted. When the phases of the signals do not coincide with each other, then the procedure shifts to step S67.

At step S67, the rough control unit 184 outputs the count-up signal RUP or the countdown signal RDOWN based on the comparison result signal COMP, thereby changing the counter value of the rough counter 188. The first selector 176, the second selector 192, and the switching circuit 174 control the delay circuits 198 and 202 based on the counter value.

Incidentally, in the rough adjustment, the fine counter 190 shown in FIG. 53 keeps its counter value at the central value. Therefore, as discussed in FIGS. 39(*a*) and 39(*b*) of the first embodiment, the internal clock signal CLKI has the same phase variation (the bottom of FIG. 68) at the times of switching the interpolators 196 and 200. In the rough adjustment, the phase of the internal clock signal CLKI is shifted by 45°, 135°, 225°, or 315° with respect to the internal clock signal CLK-K. Therefore, the interpolators 200-1, 196-2, 196-3, and 196-4 are used.

Moreover, supplying low level to the enable terminals EN of those unused interpolators (for example, "Don't care" in FIG. 67) reduces the power consumption.

Then, the procedure returns to step S65.

(c) Fine Adjustment

In the fine adjustment, the delay circuits 198 and 202 are used to finely adjust the phase of the internal clock signal CLKI.

Figure 40:
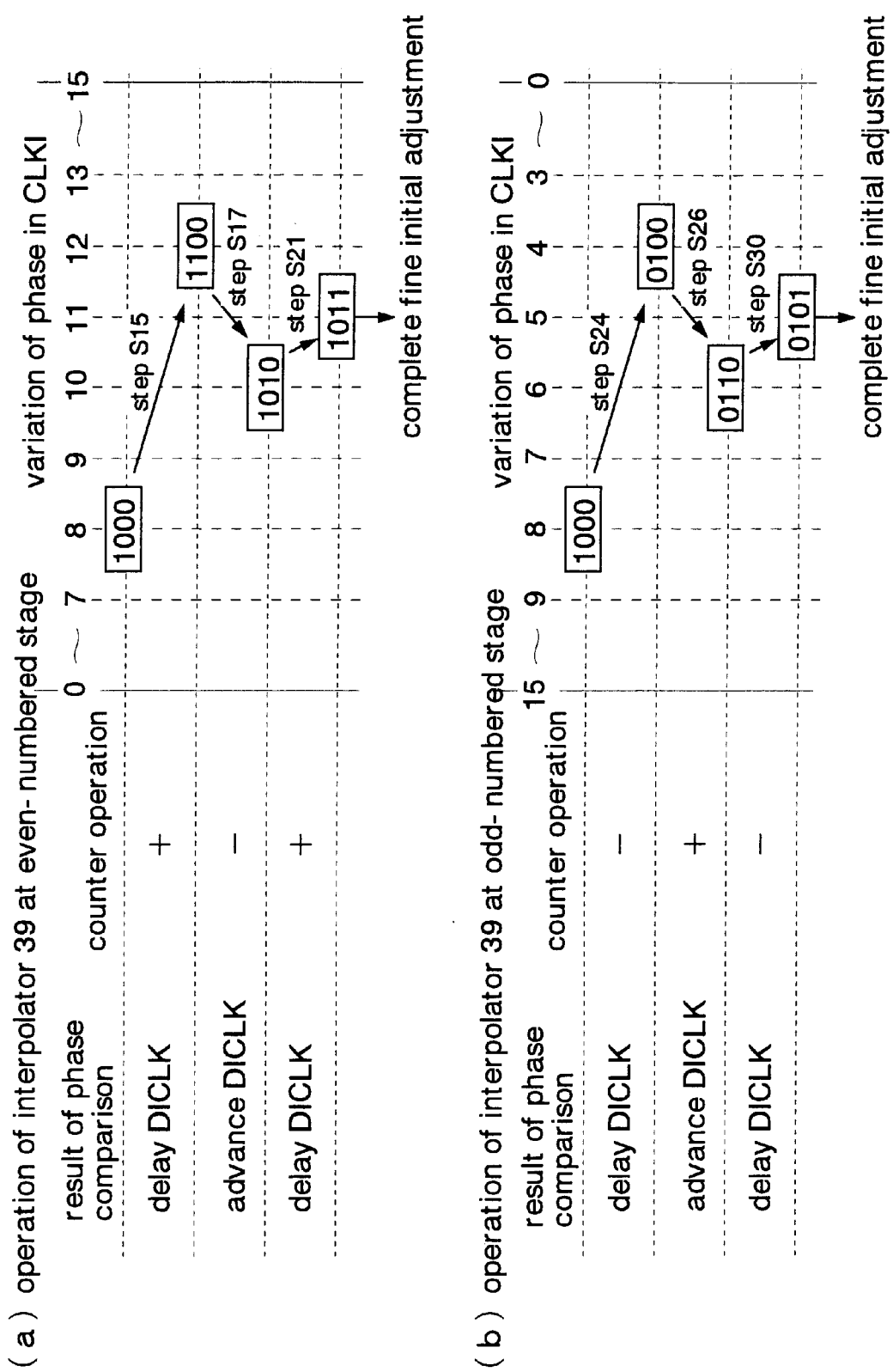
FIG. 40 is an explanatory diagram showing an overview of the fine initial adjustment in the first embodiment.

For a start, at step S68, the same fine initial adjustment as that of the first embodiment (FIGS. 40(*a*) and 40(*b*)) is performed. Therefore, at step S68, the phase of the internal clock signal CLKI is varied by a value, which is an integral multiple of approximately 11°.

Then, at step S69, the fine adjustment is performed repeatedly. At step S69, the phase of the internal clock signal CLKI is varied by approximately 11°.

At steps S68 and S69, the fine control unit 186 shown in FIG. 53 outputs the count-up signal FUP or the countdown signal FDOWN based on the comparison result signal COMP, thereby changing the counter value of the fine counter 190. The D/A converter 194 controls the delay circuits 198 and 202 based on the counter value. Here, as shown in FIG. 67, the first selector 176 supplies the control terminals α and β of adjacent interpolators 196 with the control voltages V1 and V2 of inverse orders to each other. Therefore, as shown in FIG. 68, the counter value of the fine counter 190 need not be varied from the maximum to the minimum or from the minimum to the maximum on the switching of the interpolators 196 and 200. As in the first embodiment, this prevents the occurrence of jitter in the internal clock signal CLKI due to count value variations on switching of the interpolators.

Now, description will be given of the control to shift the phase of the internal clock signal CLKI by 0–90° with respect to the phase of the internal clock signal CLK-K.

In the delay circuit 198, the interpolator 196-5 operates in the 0–45° range and the interpolator 196-1 operates in the 45–90° range, as discussed in FIG. 68. Moreover, in the delay circuit 202, the interpolator 200-1 operates in the 0–90° range. That is, the interpolators 196-1, 196-5 and the interpolator 200-1 overlap each other in operation. When the composite circuit 204 shown in FIG. 54 is supplied with the select signal SELB of low level, the internal clock signal CLKIA output from the delay circuit 198 is output as the internal clock signal CLKI. When the composite circuit 204 is supplied with the select signal SELB of high level, the internal clock signal CLKIB output from the delay circuit 202 is output as the internal clock signal CLKI. In the 0–90° range, the internal clock signals CLKIA and CLKIB have the same phase because of the initial adjustment. Therefore, the phase is adjusted and the internal clock signals CLKIA and CLKIB are output from the composite circuit 204 without causing jitter to the internal clock signal CLKI.

Besides, since the interpolators 196-1, 196-5 and the interpolator 200-1 overlap each other in operation, the interpolators 196-1 and 196-5 can be switched on 45° at which the interpolator 200-1 is in use. Therefore, this switching has no effect on the internal clock signal CLKI.

The semiconductor integrated circuit of this embodiment can also offer the same effect as that obtained from the first embodiment described above. Besides, in this embodiment, the rough control unit 148 and the fine control unit 186 make phase adjustment by using the interpolator 200-1 of the delay circuit 202 while making phase adjustment by using the preceding interpolator 196-5 and the interpolator 196-1 on the initial stage of the delay circuit 198. Therefore, the rough control unit 184 and the fine control unit 186 can switch the interpolator 196-1 and the interpolator 196-5 while making phase adjustment by using the interpolator 200-1. Accordingly, it is possible to prevent the internal clock signal CLKI from being affected by switching the interpolator 196-5 and the interpolator 196-1. As a result, the occurrence of jitter in the internal clock signal CLKI can be prevented.

The delay circuit 202 is provided with one interpolator 200 identical with the interpolators 196 in the delay circuit 198. Therefore, the interpolators 196 can be switched in enough time while the interpolator 200 adjusting the phase of the internal clock signal CLKI. In addition, the composite circuit 204 can control the composition of the internal clock signals CLKIA and CLKIB in enough time.

In the initial adjustment by the initializing circuit 206, the maximum delay time of each of the interpolators 196, 200, and 208 is adjusted to a value of a fourth (90°) of the cycle of the internal clock signals CLK-K and CLKI. Besides, the delay circuit 198 is provided with six stages of interpolators 196. On this account, the delay circuit 198 can delay the internal clock signal CLK-K for more than one cycle. Therefore, sequentially switching the interpolators 196 of the delay circuit 198 ensures the phase coincidence between the internal clock signals CLK-K and CLKI. Accordingly, precise phase adjustment can be made with the fewer interpolators 196.

The initializing circuit 206 can be operated to set the interpolators 196 and 200 at the optimal maximum delay time in accordance with the operating voltage and the operating temperature.

The phases of the input and output of the delay circuit 210 formed in the initializing circuit 206 are compared to indirectly determine the control voltage V3 to be supplied to the interpolators 196 and 200. The initializing circuit 206 thereby makes it possible for the interpolators 196 and 200 to be composed only of those circuits required for phase adjustment. The absence of unnecessary circuits leads to enhancing the precision of the phase adjustment.

The interpolators 196 and 200 for making phase adjustment and the interpolators 208 for determining the maximum delay time in the initial adjustment consist of the same circuit. Therefore, the control voltage V3 to be supplied to the interpolators 196 and 200 can be determined with precision.

The total delay time of four of the interpolators 208 in the delay circuit 210 formed in the initializing circuit 206 is made equal to the cycle of the internal clock signal CLKI. The number of interpolators 196 for making a phase adjustment is set six, which is more than the number of interpolators 208. On this account, the interpolators 196 can adjust the phase of the internal clock signal CLKI for one cycle or more. In other words, this can ensure the phase coincidence between the internal clock signals CLK-K and CLKI.

The rough adjustment and the fine adjustment are performed after the control voltage V3 to be supplied to the interpolators 196 and 200 is determined in the initial adjustment. This precludes the variation of the control voltage V3 in the rough adjustment and the fine adjustment. Therefore, the rough adjustment and the fine adjustment can be performed with stability and precision.

The first embodiment described above has dealt with the case where the interpolators 39 of differential amplification type are formed to generate the internal clock signal having a phase according to the weights of the counter signals CNT3-CNT0. The present invention is not limited to such an embodiment. Hereinafter, description will be given of other configuration examples of the interpolators. Note that the following configuration examples can also be used for the interpolators 196, 200, and 208 of the fourth embodiment when the current sources are controlled by the control voltage V3.

Besides, the individual interpolators 196, 200, and 208 in the delay circuit 172 and the initializing circuit 206 of the fourth embodiment can use dedicated power supplies so that the interpolators 196, 200, and 208 operate with stability against fluctuations in the power supply voltage supplied from the exterior.

In addition, supplying a stepped-down power supply voltage to the interpolators 196, 200, and 208, or supplying stepped-down, dedicated power supply voltages to the interpolators 196, 200, and 208 allows further stable operations of the interpolators 196, 200, and 208.

Moreover, the clock signal to be supplied to the initializing circuit 206 of the fourth embodiment is not limited to the internal clock signal CLKI output from the composite circuit 204, and has only to be an internal clock signal having the same cycle as that of the internal clock signal CLK-K. Furthermore, instead of the internal clock signal CLK-K, the internal clock signal CLKI2 output from the initializing circuit 206 may be used as the input clock signal to the delay control circuit 172.

Figure 72:
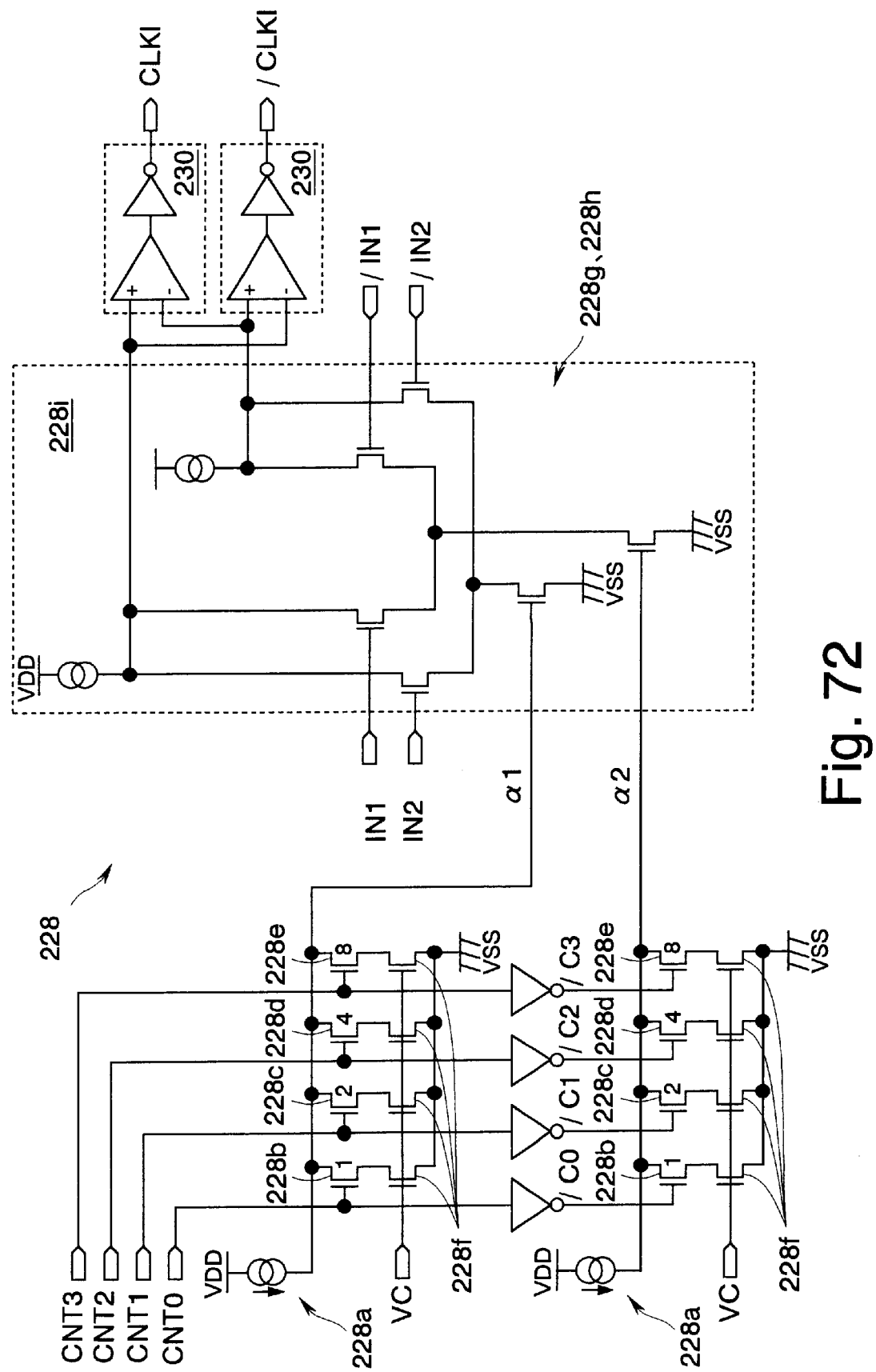
FIG. 72 is a circuit diagram showing another example of the interpolator.

An interpolator 228 shown in FIG. 72 comprises pairs of: constant-current sources 228a; four nMOSs 228b, 228c, 228d, and 228e having different gate widths to draw the currents supplied from the constant-current sources 228a; and four nMOSs 228f connected in series to the source sides of the respective transistors. The interpolator 228 also comprises a differential amplification unit 228i consisting of two differential amplifiers 228g and 228h. The numerals appended to the nMOSs 228b, 228c, 228d, and 228e indicate the ratios of the gate widths. The gates of the nMOSs 228e, 228d, 228c, and 228b are supplied with the counter signals CNT3–CNT0, respectively. The gates of the nMOSs 228f are supplied with constant-voltage signals VC. The nodes α1 and α2 connected with the constant-current sources 228a are connected to the gates of the nMOSs connected with the ground line VSS, of the differential amplifiers 228g and 228h, respectively.

The outputs of the differential amplification unit 228i are connected to buffers 230a and 230b consisting of differential amplifiers. Through the outputs of the buffers 230a and 230b are output the internal clock signals CLKI and /CLKI.

In the interpolator 228, the nodes α1 and α2 vary in voltage in accordance with the weights of the counter signals CNT3–CNT0, and the differential amplifiers 228g and 228h vary in amplification capability, whereby the internal clock signal CLKI (or /CLKI) having a phase between those of the internal clock signals supplied to the input terminals IN1 and IN2 (or /IN1 and /IN2) is generated.

Figure 73:
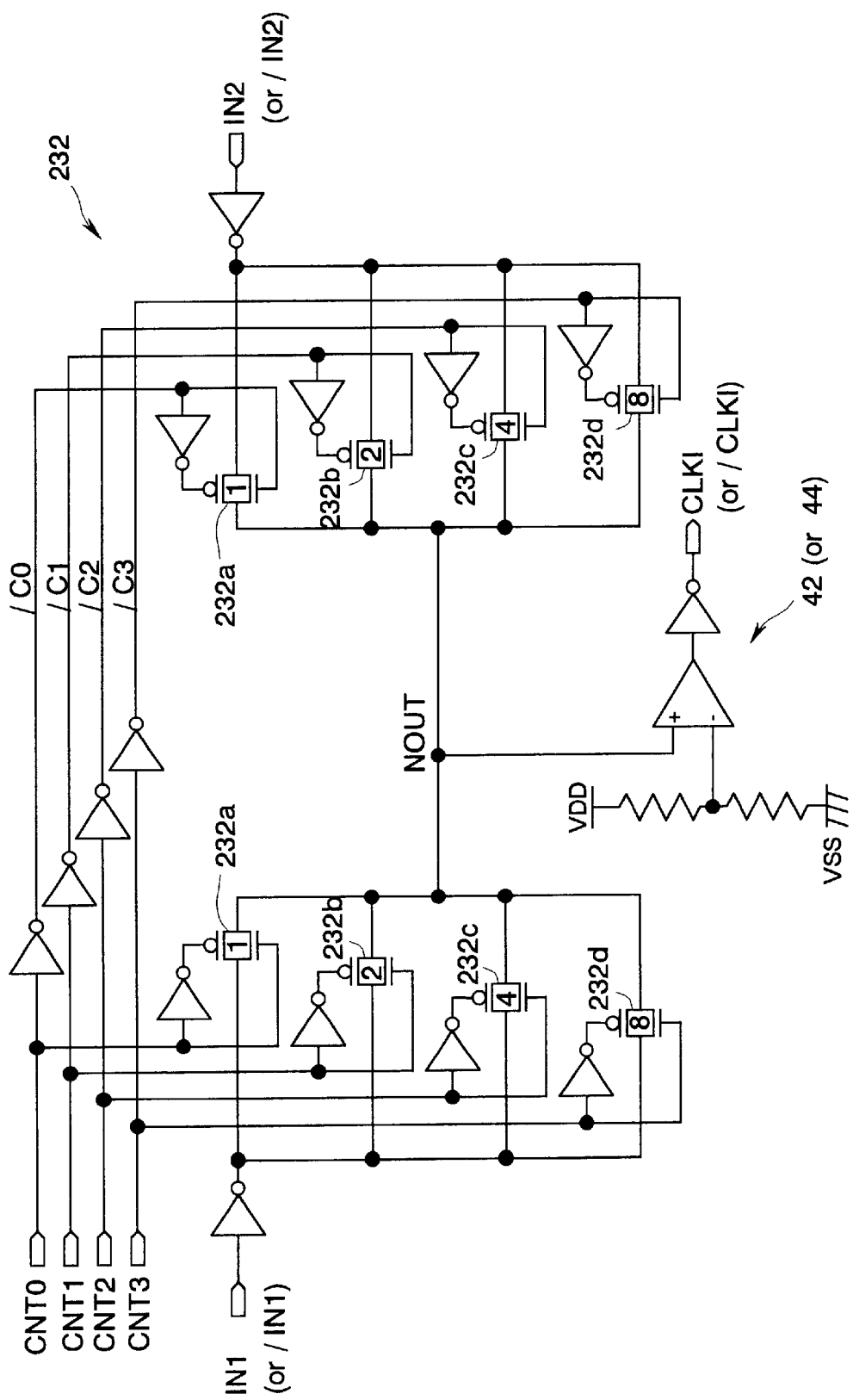
FIG. 73 is a circuit diagram showing another example of the interpolator and the buffer.

An interpolator 232 shown in FIG. 73 comprises a pair of four CMOS transmission gates 232a, 232b, 232c, and 232d different in gate width from one another, having the outputs connected to one another. The numerals appended to the CMOS transmission gates 232a, 232b, 232c, and 232d indicate the ratios of the gate widths. Those CMOS transmission gates 232a, 232b, 232c, and 232d supplied with the internal clock signal through the input terminal IN1 (or /IN1) are controlled by the counter signals CNT3–CNT0. Those CMOS transmission gates 232a, 232b, 232c, and 232d supplied with the internal clock signal through the input terminal IN2 (or /IN2) are controlled by the inverted logic of the counter signals CNT3–CNT0 through the inverters. The internal clock signal output through the output node NOUT of the interpolator 232 is supplied to a buffer 42 (or 44).

In the interpolator 232, the CMOS transmission gates 232a, 232b, 232c, and 232d function as variable resistors according to the weights of the counter signals CNT3–CNT0, so that an internal clock signal CLKI (or /CLKI) having a phase between those of the two internal clock signals is generated.

Figure 74:
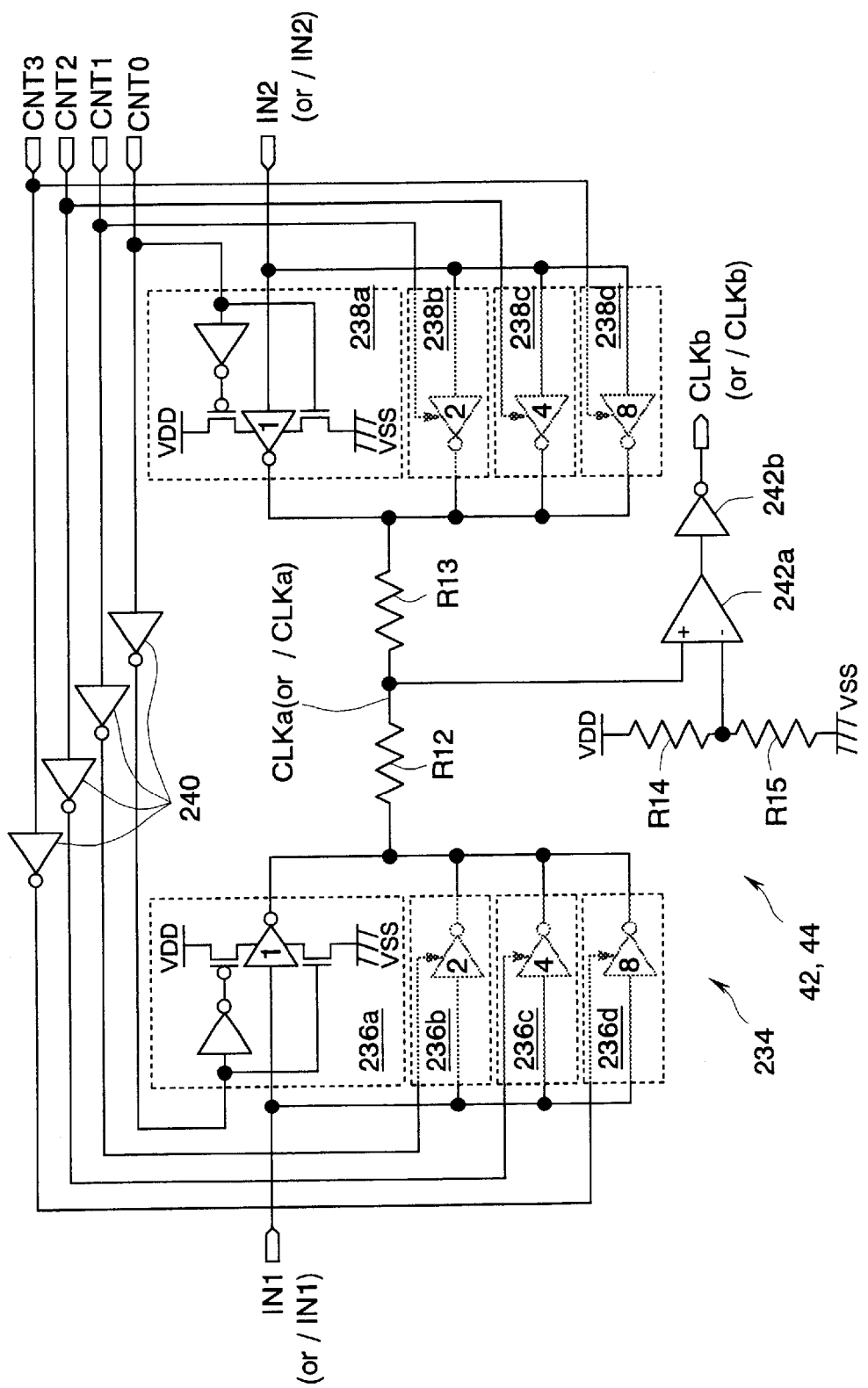
FIG. 74 is a circuit diagram showing another example of the interpolator and the buffer.

An interpolator 234 shown in FIG. 74 comprises: switching circuits 236a, 236b, 236c, and 236d for receiving an internal clock signal through the input terminal IN1 (or /IN1); switching circuits 238a, 238b, 238c, and 238d for receiving an internal clock signal through the input terminal IN2 (or /IN2); four inverters 240; and resistors R12 and R13. Each of the switching circuits is composed of a clocked inverter and an inverter connected to the pMOSs of the clocked inverter. The control terminals of the switching circuits 236a–236d are supplied with the counter signals CNT0–CNT3 through the inverters 240, respectively. The control terminals of the switching circuits 238a–238d are supplied with the counter signals CNT0–CNT3, respectively. The numerals appended to the respective switching circuits indicate the ratios of the gate widths. That is, the on-resistances of the switching circuits 236a–236d are respectively set to be a half value of that of the preceding circuit in sequence. Similarly, the on-resistances of the switching circuits 238a–238d are respectively set to be a half value of that of the preceding circuit. In other words, the four switching circuits 236a–236d (or 238a–238d) constitute a variable resistor that varies in accordance with the weights of the counter signals CNT3–CNT0. As the two supplied internal clock signals vary, the currents according to the weights of the counter signal CNT3–CNT0 flow through the resistors R12 and R13. Then, on the node between the resistors R12 and R13 is generated an internal clock signal CLKa (or /CLKa) having a phase between those of the two internal clock signals.

The buffers 42 and 44 comprise: resistors R14 and R15 connected in series, both ends thereof being connected to the power supply line VDD and the ground line VDD; a differential amplifier 242a for receiving the voltage between the resistors R14 and R15 and the internal clock signal CLKa (or /CLKa); and an inverter 242b for shaping the output waveform from the differential amplifier 242a and outputting the resultant as an internal clock signal CLKb (or /CLKb).

The first embodiment described above has dealt with the case where the binary counter 136 is constituted in four bits. The present invention is not limited to such an embodiment. For example, the binary counter 136 may be constituted in six bits or eight bits in accordance with the phase adjustment precision of the interpolators 38 and 40.

The first embodiment described above has dealt with the case where the interpolators 39 are switched by the shift register 63. The present invention is not limited to such an embodiment. For example, a counter for incrementing and decrementing in response to the control signals A, B, C, and D, and a circuit for decoding the output of this counter may be provided so that the interpolators are switched by a decoded signal therefrom.

The first embodiment described above has dealt with the case where the shift direction latch 122 provided in the rough control circuit 51 controls the switching direction of the interpolators 39. The present invention is not limited to such an embodiment. For example, the switching direction of the interpolators 39 may be controlled by comparing the information of the shift register 63.

The first embodiment described above has dealt with the case where up to two interpolators preceding the interpolators 39 operating as the delay stages are activated. However, the present invention is not limited to such an embodiment. For example, up to three previous interpolators may be activated. This allows the stable operation of the interpolator 39, which is to be the phase adjustment circuit by being switched to the preceding interpolator in the rough initial adjustment. Moreover, in the rough/fine adjustment, the second previous interpolator 39 may be activated when the counter value (CNT3–CNT0) approaches the maximum or the minimum.

The embodiments describe above have dealt with the cases where the present invention is applied to a DDR-SDRAM supplied with complementary clock signals CLK and /CLK. However, the present invention is not limited to such embodiments. For example, the present invention may be applied to an SDRAM supplied with a clock signal CLK alone.

The embodiments described above have dealt with the cases where the present invention is applied to a DDR-SDRAM. However, the present invention is not limited to such embodiments. For example, the present invention may be applied to semiconductor memories such as DRAMs and SRAMs. The present invention may also be applied to a system LSI having a DRAM memory core.

The third embodiment described above has dealt with the case where the first frequency divider 156 is provided with the switches 156a, 156b, and 156c formed of CMOS transmission gates, and the switches 156a, 156b, and 156c are selected by setting the mode register at predetermined values. However, the present invention is not limited to such an embodiment. For example, the switches in the first divider 156 may be composed of a fuse made of polysilicon or the like so that the switches are selected by fuse blows. In this case, the output timing of the reference clock signal REFCLK can be set in the fabrication process of the semiconductor integrated circuit. In general, semiconductor integrated circuits are shipped with different produce codes for each operating frequency. Besides, semiconductor integrated circuits vary in frequency characteristics to some extent depending on the chip locations on the wafer and manufacturing lots. Therefore, blowing the fuse according to the operating frequencies of the products in the fabrication process to set the output timing of the reference clock signal REFCLK makes it possible to optimally set the output timing of the reference clock signal REFCLK in accordance with the individual semiconductor integrated circuit and to reduce the power consumption.

Moreover, on the chip may be formed the outlets of pads or the like for controlling the switches. In this case, these pads can be used as testing terminals to make product evaluations before the shipment. On the product shipment, the pads can be connected to the power supply line VDD and the ground line VSS by bonding wires or the like, so as to offer the same effect as that obtained in the case where the switches are made of the fuse. Furthermore, on the product shipment, the pads may be connected to external terminals so that the output timing of the reference clock signal can be set on board in accordance with the clock frequency of the system mounting the semiconductor integrated circuit.

In the first embodiment described above, as shown in FIG. 12, the dummy circuits have used the dummy output buffer 86 and the dummy input buffer 88. However, the dummy input buffer 88 can be used alone to make an adjustment with respect to the timing of the clock signal CLK. Otherwise, the exclusive use of the dummy input buffer 88, when combined with the addition of the delay time corresponding to a latch circuit to the reference clock signal REFCLK, can generate an internal clock signal delaying from the clock signal CLK by the amount corresponding to the latch circuit.

The third embodiment described above has dealt with the case where the first frequency divider 156 is provided with the switches 156a, 156b, and 156c. However, the present invention is not limited to such an embodiment. For example, the second frequency divider 84 may also be provided with switches.

The fourth embodiment described above has dealt with the case where the fine counter 190 is constituted in three bits. The present invention is not limited to such an embodiment. For example, the fine counter 190 may be constituted in four bits or eight bits in accordance with the phase adjustment precision of the interpolators 196 and 200.

The fourth embodiment described above has dealt with the case where the phase comparator 182 directly compares the internal clock signal DICLK and the reference clock signal REFCLK. However, the present invention is not limited to such an embodiment. For example, the internal clock signal DICLK and the reference clock signal REFCLK having their frequencies divided by some frequency dividers may be subjected to the comparison. This allows a reduction in power consumption. Moreover, frequency dividers may be used after the switching from the rough adjustment to the fine adjustment so that the phase comparisons are reduced in frequency. This allows a reduction in power consumption.

Here, as in the third embodiment, the frequency dividers may be provided with switches, and the switches may be selected by setting the mode register to predetermined values. The switches can be selected not only by the mode register, but also by the control through external terminals, the wire bonding or the like of external terminals, and the like.

The fourth embodiment described above has dealt with the case where the initial adjustment is followed by the rough adjustment and the fine adjustment. However, the present invention is not limited to such an embodiment. For example, the initial adjustment, the rough adjustment, and the fine adjustment may be performed at the same time.

Moreover, the embodiments described above have dealt with the cases where the interpolators 39, 196, 200, and 208 are supplied with the power supply voltage VDD. However, the present invention is not limited to such embodiments. For example, a voltage lower than the power supply voltage VDD may be supplied thereto. This makes the respective interpolators less susceptible to noise. The power supply line for the interpolators 39, 196, 200, and 208 can be separated from the power supply line for the other circuits to enhance the insusceptibility to noise. Connecting an independent power supply line (stepped-down power supply line or the like) to each interpolator further enhances the insusceptibility to noise.

The DLL circuit may be suspended in a self refresh mode and other modes while the phase comparisons are increased in frequency after the DLL circuit enters an operating mode. Moreover, the DLL circuit may start with the rough adjustment after the self refreshment.

Besides, there may be provided a phase comparator for outputting lock out information when the phases of the internal clock signal CLKI and the clock signal CLK are shifted from each other beyond a predetermined amount, so that the phase comparisons are increased in frequency upon the output of the lock out information.

The invention is not limited to the above embodiments and various modifications may be made without departing from the spirit and the scope of the invention. Any improvement may be made in part or all of the components.

What is claimed is:

1. A delay circuit comprising a plurality of interpolators connected in cascade, the interpolators each receiving a clock signal from the preceding interpolator and a reference clock signal, wherein:
    one of said interpolators is operated as a phase adjustment circuit for generating in accordance with ratio information, an adjustment clock signal whose transition edge is between a transition edge of said reference clock signal and that of said clock signal; and
    a predetermined number of said interpolators subsequent to said phase adjustment circuit is/are operated as delay stage(s) for delaying said adjustment clock signal to produce a delayed clock signal delayed clock signal delayed from said reference clock signal by a predetermined time.

2. The delay circuit according to claim 1, wherein a predetermined number of interpolators prior to said phase adjustment circuit stop(s) operating.

3. The delay circuit according to claim 2, wherein a delay time of said delayed clock signal is adjusted in two steps; selecting one of said interpolators that operates as said phase adjustment circuit and phase controlling said adjustment clock signal in said phase adjustment circuit.

4. A semiconductor integrated circuit comprising a delay circuit, wherein:
    said delay circuit comprises a plurality of interpolators connected in cascade, the interpolators each receiving a clock signal from the preceding interpolator and a reference clock signal;
    one of said interpolators is operated as a phase adjustment circuit for generating, in accordance with ratio information, an adjustment clock signal whose transition edge is between a transition edge of said reference clock and that of said clock signal; and
    a predetermined number of said interpolators subsequent to said phase adjustment circuit is/are operated as delay stage(s) for delaying said adjustment clock signal to produce a delayed clock signal delayed from said reference clock by a predetermined time.

5. The semiconductor integrated circuit according to claim 4, further comprising:
    a phase comparator for comparing a phase of said reference clock signal with that of said delayed clock signal; and
    a control circuit for supplying said ratio information to said phase adjustment circuit based on a comparison result from said phase comparator and for making the phase of said delayed clock signal coincide with that of said reference clock signal.

6. The semiconductor integrated circuit according to claim 5, wherein said ratio information is generated by a shift register.

7. The semiconductor integrated circuit according to claim 5, wherein said ratio information is generated by a counter.

8. The semiconductor integrated circuit according to claim 5, wherein:
    said control circuit switches, at the beginning of a phase comparison, said interpolators to said phase adjustment circuit or said delay stage in accordance with said comparison result so that said delayed clock signal is roughly adjusted in phase; and
    supplies said ratio information to said phase adjustment circuit in accordance with said comparison result after a time corresponding to phase difference between said reference clock signal and said delayed clock signal becomes equal to or shorter than a delay time of said delay stage so that said delayed clock signal is finely adjusted in phase.

9. The semiconductor integrated circuit according to claim 8, wherein said control circuit judges said comparison result to be equal to or shorter than said delay time of said delay stage when said phase of said reference clock signal and said phase of said delayed clock signal are reversed.

10. The semiconductor integrated circuit according to claim 5, wherein said interpolators are respectively connected to independent power supply lines.

11. The semiconductor integrated circuit according to claim 5, further comprising a start signal generator for activating a start signal in synchronization with said reference clock signal at the beginning of a phase comparison.

12. The semiconductor integrated circuit according to claim 11, wherein said start signal generator activates said start signal in synchronization with the falling edge of said reference clock signal.

13. The semiconductor integrated circuit according to claim 5, further comprising frequency dividers for respectively dividing frequencies of said reference clock signal and said delayed clock signal to produce a divided reference clock signal and a divided delayed clock signal, and wherein
said phase comparator receives said divided reference clock signal and said divided delayed clock signal.

14. The semiconductor integrated circuit according to claim 13, further comprising a start signal generator for activating a start signal in synchronization with said reference clock signal at the beginning of a phase comparison, and wherein
said frequency dividers start operating in response to the activation of said start signal and then start outputting said divided reference clock signal and said divided delayed clock signal after a predetermined number of clocks.

15. The semiconductor integrated circuit according to claim 14, wherein said predetermined number of clocks can be set in accordance with a frequency of said reference clock signal.

16. The semiconductor integrated circuit according to claim 14, further comprising a mode register for setting said predetermined number of clocks.

17. The semiconductor integrated circuit according to claim 14, further comprising a fuse for setting said predetermined number of clocks.

18. The semiconductor integrated circuit according to claim 14, further comprising a control terminal for setting said predetermined number of clocks.

19. The semiconductor integrated circuit comprising a main delay circuit having a delay circuit, a sub delay circuit, a selecting circuit, a phase comparator, and a control circuit, and wherein:
said delay circuit in said main delay circuit comprises a plurality of interpolators connected in cascade, the interpolators each receiving a clock signal from the preceding interpolator and a reference clock signal;
one of said interpolators is operated as a phase adjustment circuit for generating, in accordance with ratio information, an adjustment clock signal whose transition edge is between a transition edge of said reference clock signal and that of said clock signal; and
a predetermined number of said interpolators subsequent to said phase adjustment circuit is/are operated as delay stage(s) for delaying said adjustment clock signal to produce a delayed clock signal delayed from said reference clock signal by a predetermined time;
said sub delay circuit includes a second interpolator for generating, in accordance with said ratio information, a second delayed clock signal whose transition edge is between the transition edge of said reference clock signal and that of said clock signal;
said selecting circuit outputs said delayed clock signal output from said main delay circuit or said second delayed clock signal output from said sub delay circuit as an internal clock signal and selects said second delayed clock signal from said sub delay circuit when a predetermined interpolator at the preceding stage or the subsequent stage of said main delay circuit operates as said phase adjustment circuit;
said phase comparator compares the phase of said reference clock signal with the phase of said internal clock signal; and
said control circuit supplies said ratio information to said phase adjustment circuit in said main delay circuit and said second interpolator in said sub delay circuit based on a comparison result from said phase comparator and makes the phase of said internal clock signal coincide with the phase of said reference clock signal.

20. The semiconductor integrated circuit according to claim 19, wherein said sub delay circuit sets a delay time equal to or longer than a delay time which one of said interpolators in said main delay circuit can set.

21. The semiconductor integrated circuit according to claim 19, wherein said main delay circuit sets a delay time equal to or longer than one cycle of said reference clock signal.

22. The semiconductor integrated circuit according to claim 19, wherein said interpolators are respectively connected to independent power supply lines.

23. The semiconductor integrated circuit according to claim 19, further comprising frequency dividers for respectively dividing frequencies of said reference clock signal and said internal clock signal to produce a delayed reference clock signal and a delayed internal clock signal, and wherein
said phase comparator receives said divided reference clock signal and said divided internal clock signal.

24. The semiconductor integrated circuit according to claim 23, further comprising a start signal generator for activating a start signal in synchronization with said reference clock signal at the beginning of a phase comparison, and wherein
said frequency dividers start operating in response to the activation of said start signal and then start outputting said divided reference clock signal and said divided internal clock signal after a predetermined number of clocks.

25. The semiconductor integrated circuit according to claim 24, wherein said predetermined number of clocks can be set in accordance with the frequency of said reference clock signal.

26. The semiconductor integrated circuit according to claim 24, further comprising a mode register for setting said predetermined number of clocks.

27. The semiconductor integrated circuit according to claim 24, further comprising a fuse for setting said predetermined number of clocks.

28. The semiconductor integrated circuit according to claim 24, further comprising a control terminal for setting said predetermined number of clocks.

29. The semiconductor integrated circuit according to claim 19, further comprising:
an adjustment delay circuit including a plurality of third interpolators connected in cascade; and
an adjustment circuit for adjusting said third interpolators in said adjustment delay circuit so that a maximum delay time of said interpolators in said main delay circuit and said second interpolators in said sub delay circuit is adjusted to a value which is one fraction of an integer of a cycle of said reference clock signal.

30. The semiconductor integrated circuit according to claim 29, wherein:
said adjustment circuit comprises a second phase comparator for comparing the phase of said reference clock signal supplied to said adjustment delay circuit with the phase of an output clock signal output from said adjustment delay circuit; and
said adjustment circuit adjusts a maximum delay time of said third interpolators in said adjustment delay circuit to a value which is one fraction or a multiple of an integer of the cycle of said reference clock signal, based on a comparison result from the second phase comparator.

31. The semiconductor integrated circuit according to claim 29, wherein said third interpolators in said adjustment delay circuit, said interpolators in said main delay circuit, and said second interpolators in said sub delay circuit are identical with one another.

32. The semiconductor integrated circuit according to claim 31, wherein the number of said interpolators in said main delay circuit is more than the number of said interpolators in said adjustment delay circuit.

33. The semiconductor integrated circuit according to claim 29, wherein a delay time which said main delay circuit can set is equal to or longer than a delay time which said adjustment delay circuit can set.

34. The semiconductor integrated circuit according to claim 29, wherein control for said coinciding by said control circuit is performed after said adjustment circuit adjusting said maximum delay time.

35. The semiconductor integrated circuit according to claim 34, wherein:

said control circuit switches, at the beginning of a phase comparison, any one of said interpolators in said main delay circuit or said second interpolator in said sub delay circuit to said phase adjustment circuit in accordance with said comparison result so that said internal clock signal is roughly adjusted in phase; and supplies said ratio information to said phase adjustment circuit in accordance with said comparison result after a time corresponding to phase difference between said reference clock signal and said internal clock signal becomes equal to or shorter than said maximum delay time of said interpolators so that said internal clock signal is finely adjusted in phase.

36. The semiconductor integrated circuit according to claim 35, wherein said control circuit judges said phase difference to be equal to or shorter than said maximum delay time when said phase of said reference clock signal and said phase of said delayed clock signal are reversed.

37. The semiconductor integrated circuit according to claim 35, wherein said rough adjustment is performed with said ratio information set at a central value.

* * * * *